United States Patent
Koike et al.

(10) Patent No.: US 12,557,283 B2
(45) Date of Patent: Feb. 17, 2026

(54) SEMICONDUCTOR MEMORY DEVICE

(71) Applicant: KIOXIA CORPORATION, Tokyo (JP)

(72) Inventors: Masahiro Koike, Yokohama (JP);
Daisuke Hagishima, Meguro (JP)

(73) Assignee: KIOXIA CORPORATION, Tokyo (JP)

( * ) Notice: Subject to any disclaimer, the term of this patent is extended or adjusted under 35 U.S.C. 154(b) by 642 days.

(21) Appl. No.: 17/930,236

(22) Filed: Sep. 7, 2022

(65) Prior Publication Data

US 2023/0309304 A1  Sep. 28, 2023

(30) Foreign Application Priority Data

Mar. 23, 2022  (JP) .................... 2022-047652

(51) Int. Cl.
*H10B 43/27*  (2023.01)
*H10B 41/27*  (2023.01)

(52) U.S. Cl.
CPC ............ *H10B 43/27* (2023.02); *H10B 41/27* (2023.02)

(58) Field of Classification Search
None
See application file for complete search history.

(56) References Cited

U.S. PATENT DOCUMENTS

| | | | |
|---|---|---|---|
| 8,072,024 B2 * | 12/2011 | Ishikawa | ............... H10B 43/27 438/386 |
| 9,553,146 B2 | 1/2017 | Zhang et al. | |
| 9,780,116 B2 | 10/2017 | Masuda et al. | |
| 10,068,917 B2 | 9/2018 | Kanamori et al. | |
| 10,658,376 B2 | 5/2020 | Sawabe et al. | |
| 10,903,221 B2 | 1/2021 | Kim | |

(Continued)

FOREIGN PATENT DOCUMENTS

| | | |
|---|---|---|
| CN | 107046037 A | 8/2017 |
| JP | 2009-277770 A | 11/2009 |

(Continued)

OTHER PUBLICATIONS

U.S. Appl. No. 17/472,470, filed Sep. 10, 2021, 112 pages (publication date not available, submitting filing date of application).

*Primary Examiner* — Sarah K Salerno
(74) *Attorney, Agent, or Firm* — Oblon, McClelland, Maier & Neustadt, L.L.P.

(57) ABSTRACT

A semiconductor memory device includes conductive layers, a semiconductor layer opposed to the conductive layers, and a gate insulating film disposed therebetween. When positions corresponding to surfaces on one and the other sides of the first conductive layer and an intermediate position thereof are respectively assumed to be a first position to a third position, when positions corresponding to surfaces on one and the other sides of the second conductive layer and an intermediate position thereof are respectively assumed to be a fourth position to a sixth position, and when lengths of the semiconductor layer at the first position to the sixth position are respectively assumed to be a first length to a sixth length, the first length to the third length are smaller than the fourth length to the sixth length, and the third length is smaller than the first length and the second length.

6 Claims, 43 Drawing Sheets

(56) References Cited

U.S. PATENT DOCUMENTS

| | | |
|---|---|---|
| 2017/0104003 A1 | 4/2017 | Masuda et al. |
| 2021/0296337 A1* | 9/2021 | Hagishima ............. H10B 41/27 |
| 2022/0301869 A1 | 9/2022 | Koike et al. |

FOREIGN PATENT DOCUMENTS

| | | |
|---|---|---|
| JP | 6901972 B2 | 7/2021 |
| JP | 2022-146815 A | 10/2022 |

* cited by examiner

SEMICONDUCTOR MEMORY DEVICE

CROSS-REFERENCE TO RELATED APPLICATIONS

This application is based upon and claims the benefit of Japanese Patent Application No. 2022-047652, filed on Mar. 23, 2022, the entire contents of which are incorporated herein by reference.

FIELD

Background

Embodiments described herein relate generally to a semiconductor memory device.

Description of the Related Art

There has been known a semiconductor memory device that includes a plurality of conductive layers arranged in a first direction, a semiconductor layer extending in the first direction and opposed to the plurality of conductive layers, and a gate insulating film disposed between the plurality of conductive layers and the semiconductor layer.

The gate insulating film includes a memory portion configured to store data, and the memory portion is, for example, an insulating electric charge storage layer of silicon nitride ($Si_3N_4$) or the like, and a conductive electric charge storage layer or the like, such as a floating gate.

DETAILED DESCRIPTION

Figure 1:
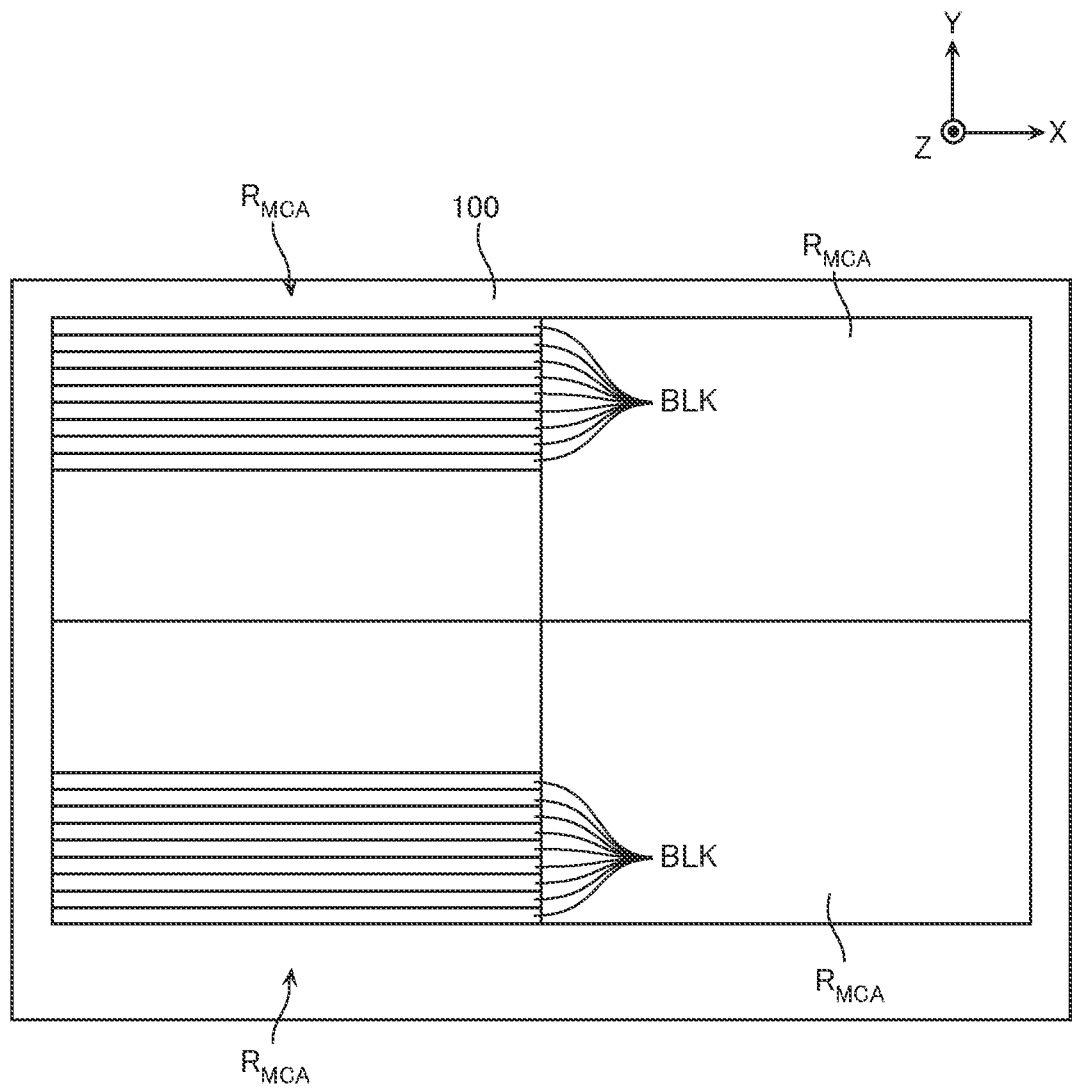
FIG. 1 is a schematic plan view illustrating a configuration of a part of a semiconductor memory device according to a first embodiment.

A semiconductor memory device according to one embodiment comprises: a plurality of conductive layers arranged in a first direction; a semiconductor layer extending in the first direction and opposed to the plurality of conductive layers; and a gate insulating film disposed between the plurality of conductive layers and the semiconductor layer. The plurality of conductive layers include a first conductive layer and a second conductive layer. When a position in the first direction corresponding to a surface on one side in the first direction of the first conductive layer is assumed to be a first position, when a position in the first direction corresponding to a surface on the other side in the first direction of the first conductive layer is assumed to be a second position, when an intermediate position of the first position and the second position in the first direction is assumed to be a third position, when a position in the first direction corresponding to a surface on one side in the first direction of the second conductive layer is assumed to be a fourth position, when a position in the first direction corresponding to a surface on the other side in the first direction of the second conductive layer is assumed to be a fifth position, when an intermediate position of the fourth position and the fifth position in the first direction is assumed to be a sixth position, and when lengths in a second direction intersecting with the first direction of the semiconductor layer at the first position to the sixth position are respectively assumed to be a first length to a sixth length, the first length to the third length are smaller than the fourth length to the sixth length, and the third length is smaller than the first length and the second length.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

A "content rate" in this specification means a rate of the number of atoms constituting a member, in some cases.

First Embodiment

[Configuration]

FIG. 1 is a schematic plan view illustrating a configuration of a part of a semiconductor memory device according to the first embodiment. As illustrated in FIG. 1, the semiconductor memory device according to the embodiment comprises a semiconductor substrate 100. The semiconductor substrate 100 is, for example, a semiconductor substrate made of P-type silicon (Si) containing P-type impurities such as boron (B). In the illustrated example, the semiconductor substrate 100 includes four memory cell array regions $R_{MCA}$ arranged in an X-direction and a Y-direction. The memory cell array region $R_{MCA}$ includes a plurality of memory blocks BLK arranged in the Y-direction.

Figure 2:
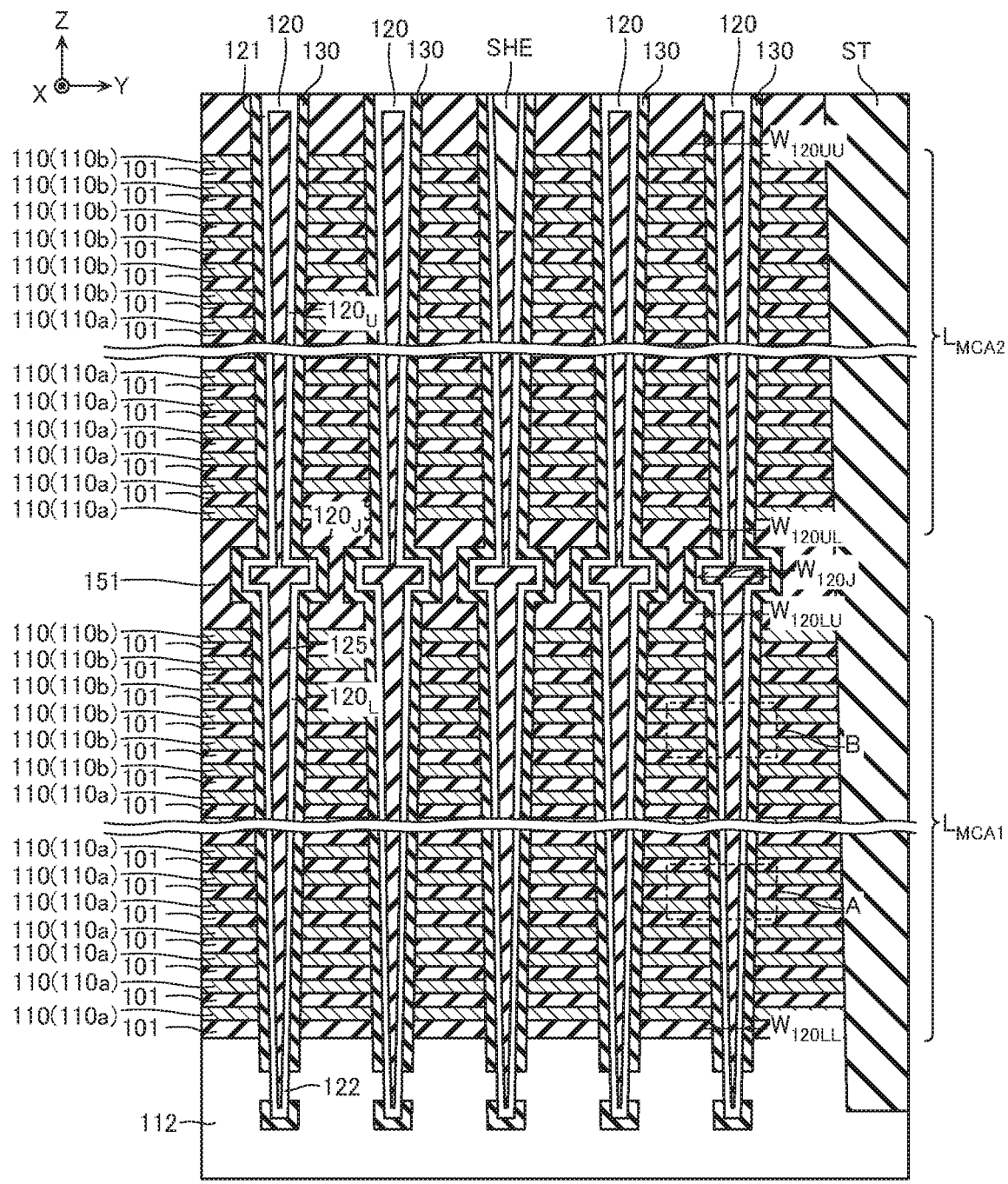
FIG. 2 is a schematic cross-sectional view illustrating a configuration of a part of the semiconductor memory device.

FIG. 2 is a schematic cross-sectional view illustrating a configuration of a part of the semiconductor memory device according to the embodiment. The semiconductor memory device according to the embodiment includes a memory cell array layer $L_{MCA1}$, a memory cell array layer $L_{MCA2}$ disposed above the memory cell array layer $L_{MCA1}$, and a conductive layer 112 disposed below the memory cell array layer $L_{MCA1}$.

The memory block BLK includes a plurality of conductive layers 110 arranged in a Z-direction, a plurality of semiconductor layers 120 extending in the Z-direction, a respective plurality of gate insulating films 130 disposed between the plurality of conductive layers 110 and the plurality of semiconductor layers 120. Between two memory blocks BLK arranged in the Y-direction, an inter-block insulating layer ST of silicon oxide ($SiO_2$) or the like is disposed.

The conductive layer 110 is an approximately plate-shaped conductive layer extending in the X-direction. Each of a part of the conductive layers 110 functions as, for example, gate electrodes of memory cells (memory transistors) and a word line. Each of another part of the conductive layers 110 functions as, for example, gate electrodes of select transistors and a select gate line. Between the plurality of conductive layers 110 arranged in the Z-direction, interlayer insulating layers 101 of silicon oxide ($SiO_2$) or the like are disposed. Between an uppermost conductive layer 110 in the memory cell array layer $L_{MCA1}$ and a lowermost conductive layer 110 in the memory cell array layer $L_{MCA2}$, an insulating layer 151 of silicon oxide ($SiO_2$) or the like is disposed.

The conductive layers 110 basically extend in the X-direction and the Y-direction corresponding to one memory block BLK. However, the one or plurality of conductive layers 110 disposed in the uppermost layer are separated in the Y-direction via an insulating layer SHE.

In FIG. 2, a part of the conductive layers 110 are indicated as conductive layers 110a. Further, another part of the conductive layers 110 are indicated as conductive layers 110b. The memory cell array layers $L_{MCA1}/L_{MCA2}$ each include a plurality of the conductive layers 110a and a plurality of the conductive layers 110b. In the memory cell array layers $L_{MCA1}/L_{MCA2}$, the plurality of conductive layers 110b are disposed above the plurality of conductive layers 110a.

The semiconductor layer 120 functions as channel regions of the plurality of memory cells and the select transistors. The semiconductor layer 120 contains, for example, polycrystalline silicon (Si) or the like. The semiconductor layer 120 has an approximately cylindrical shape and has a center portion including an insulating layer 125 of silicon oxide or the like.

The semiconductor layer 120 includes a semiconductor region $120_L$ included in the memory cell array layer $L_{MCA1}$ and a semiconductor region $120_U$ included in the memory cell array layer $L_{MCA2}$. The semiconductor layer 120 includes a semiconductor region $120_J$ connected to an upper end of the semiconductor region $120_L$ and a lower end of the semiconductor region $120_U$, an impurity region 122 connected to a lower end of the semiconductor region $120_L$, and an impurity region 121 connected to an upper end of the semiconductor region $120_U$.

The semiconductor region $120_L$ has an approximately cylindrical shape extending in the Z-direction. The semiconductor region $120_L$ has an outer peripheral surface that is surrounded by the plurality of conductive layers 110 included in the memory cell array layer $L_{MCA1}$ and is opposed to these plurality of conductive layers 110. In the semiconductor region 120L, the lower the portion is positioned, the smaller the diameter of the portion becomes, and the higher the portion is positioned, the larger the diameter of the portion becomes. Accordingly, a width $W_{120LL}$ in a radial direction at a lower end portion (for example, a portion positioned below the plurality of conductive layers 110 included in the memory cell array layer $L_{MCA1}$) of the semiconductor region $120_L$ is smaller than a width $W_{120LU}$ in the radial direction at an upper end portion (for example, a portion positioned above the plurality of conductive layers 110 included in the memory cell array layer $L_{MCA1}$) of the semiconductor region 120L.

The semiconductor region $120_U$ has an approximately cylindrical shape extending in the Z-direction. The semiconductor region $120_U$ has an outer peripheral surface that is surrounded by the plurality of conductive layers 110 included in the memory cell array layer $L_{MCA2}$ and is opposed to these plurality of conductive layers 110. In the semiconductor region $120_U$, the lower the portion is positioned, the smaller the diameter of the portion becomes, and the higher the portion is positioned, the larger the diameter of the portion becomes. Accordingly, a width $W_{120UL}$ in the radial direction at a lower end portion (for example, a portion positioned below the plurality of conductive layers 110 included in the memory cell array layer $L_{MCA2}$) of the semiconductor region $120_U$ is smaller than a width $W_{120UU}$ in the radial direction at an upper end portion (for example, a portion positioned above the plurality of conductive layers 110 included in the memory cell array layer $L_{MCA2}$) of the semiconductor region $120_U$ and the above-described width $W_{120LU}$.

The semiconductor region $120_J$ is disposed above the plurality of conductive layers 110 included in the memory cell array layer $L_{MCA1}$ and below the plurality of conductive above.

The impurity region 122 is connected to the above-described conductive layer 112. The impurity region 122 and the conductive layer 112 contain, for example, N-type impurities such as phosphorus (P) or P-type impurities such as boron (B).

The impurity region 121 contains, for example, N-type impurities such as phosphorus (P). The impurity region 121 is connected to a bit line (not illustrated) via a via-contact electrode (not illustrated).

The gate insulating film 130 has an approximately cylindrical shape covering an outer peripheral surface of the semiconductor layer 120. The gate insulating film 130 extends in the Z-direction along the outer peripheral surface of the semiconductor layer 120 except a contact portion between the semiconductor layer 120 and the conductive layer 112.

Figure 3:
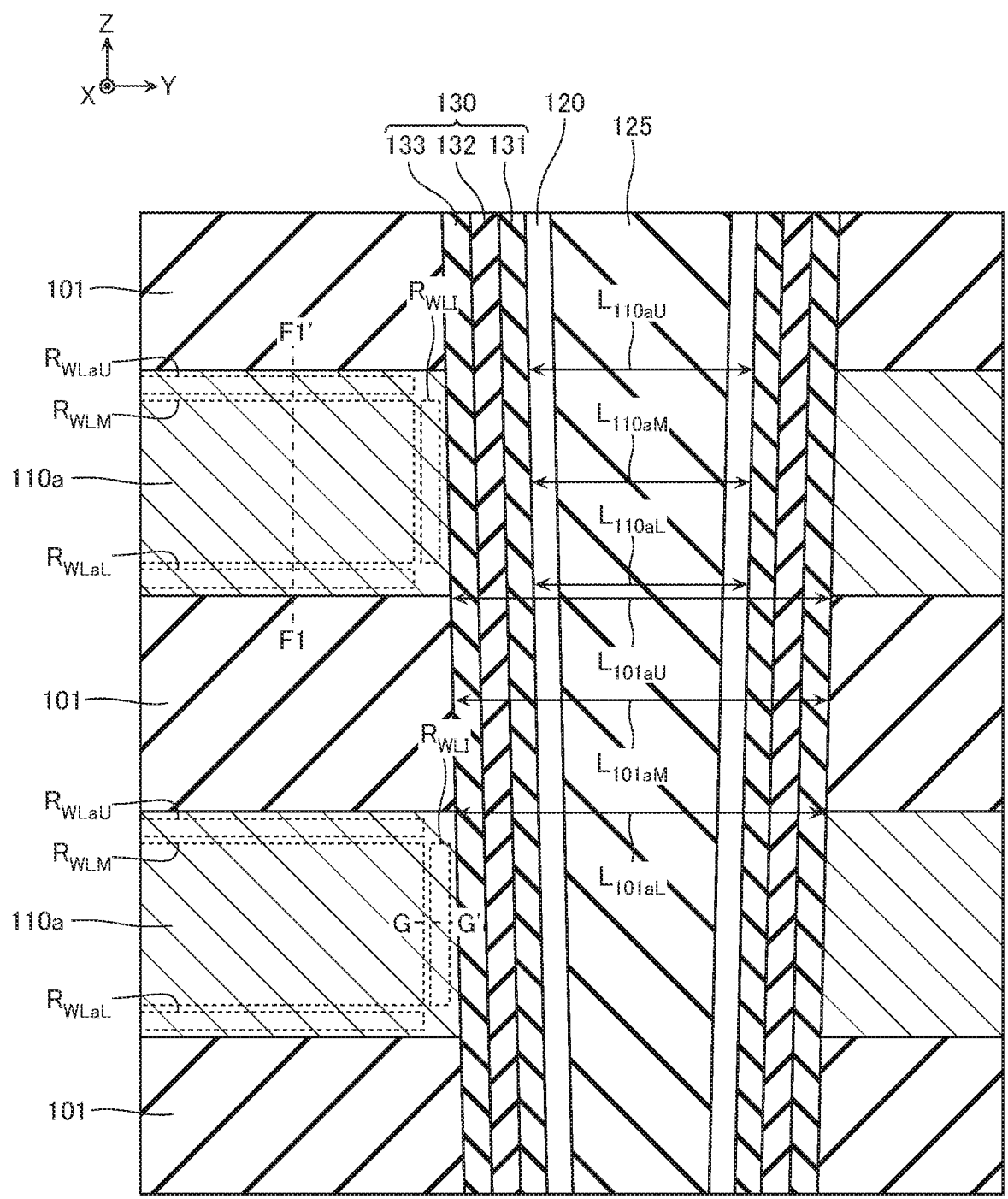
FIG. 3 is a schematic cross-sectional view illustrating an enlarged part indicated by A in FIG. 2.
Figure 4:
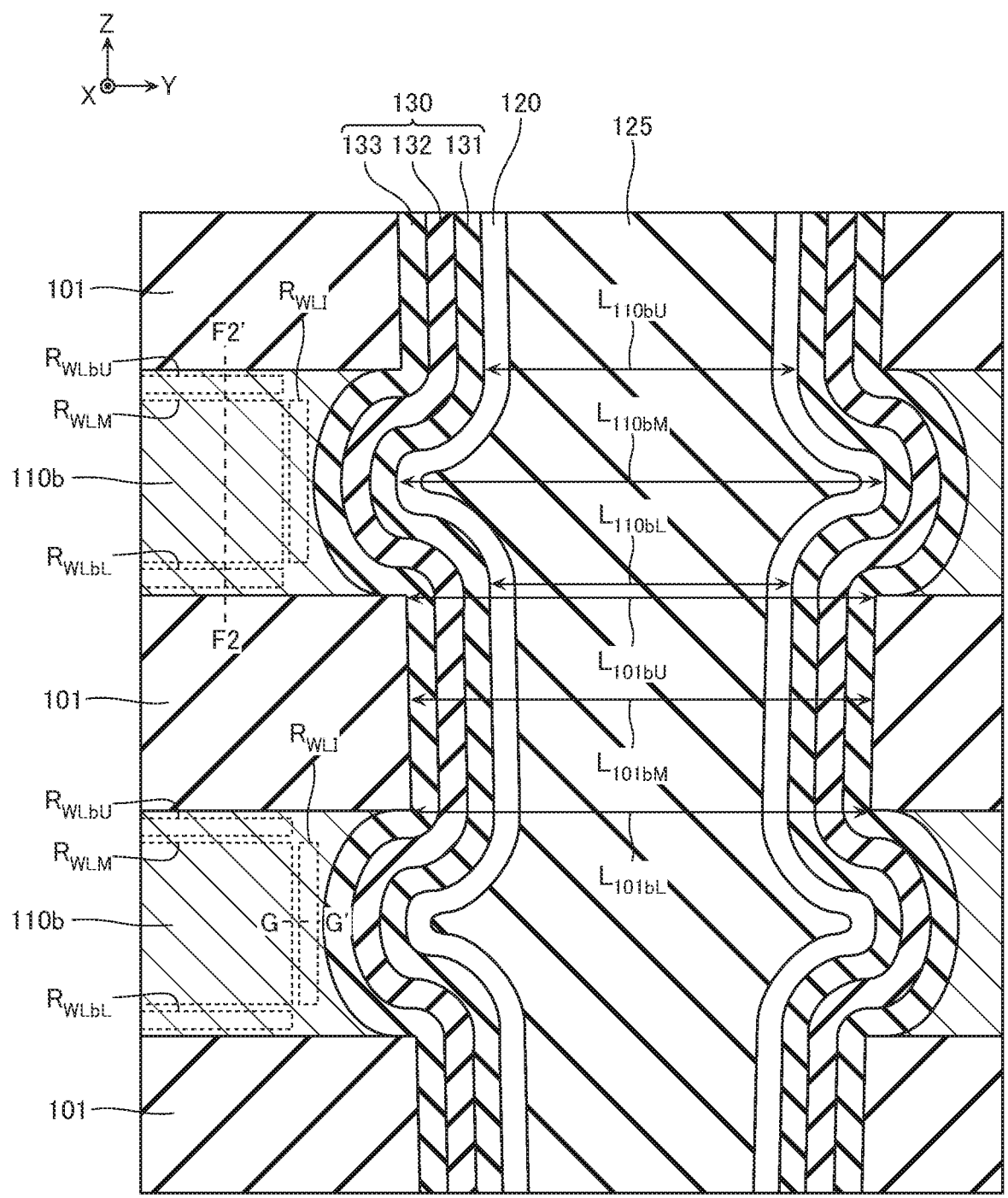
FIG. 4 is a schematic cross-sectional view illustrating an enlarged part indicated by B in FIG. 2.

FIG. 3 is a schematic cross-sectional view illustrating an enlarged part indicated by A in FIG. 2. FIG. 4 is a schematic cross-sectional view illustrating an enlarged part indicated by B in FIG. 2. While FIG. 3 and FIG. 4 illustrate YZ cross-sectional surfaces, when a cross-sectional surface other than the YZ cross-sectional surface along a center axis of the semiconductor layer 120 (for example, an XZ cross-sectional surface) is observed, structures similar to those of FIG. 3 and FIG. 4 are also observed.

As illustrated in FIG. 3 and FIG. 4, the gate insulating film 130 includes a tunnel insulating film 131, an electric charge storage film 132, and a block insulating film 133 stacked between the semiconductor layer 120 and the conductive layers 110. The tunnel insulating film 131 and the block insulating film 133 contains, for example, silicon oxide ($SiO_2$) or the like. The electric charge storage film 132 includes, for example, a film configured to accumulate electric charges of silicon nitride (SiN) or the like.

FIG. 3 and FIG. 4 indicate examples where the gate insulating film 130 includes the electric charge storage film 132 of silicon nitride or the like. However, the gate insulating film 130 may include, for example, a floating gate of polycrystalline silicon or the like containing the N-type impurities or the P-type impurities.

Here, in a YZ cross-sectional surface indicated in FIG. 3, the plurality of conductive layers 110a and a plurality of the interlayer insulating layers 101 stacked in alternation in the Z-direction have surfaces on a semiconductor layer 120 side formed into an approximately straight line. The block insulating film 133, the electric charge storage film 132, the tunnel insulating film 131, and the semiconductor layer 120 are formed into an approximately straight line along these surfaces.

In FIG. 3, a length in the Y-direction of the semiconductor layer 120 at a height position of an upper surface of the conductive layer 110a is illustrated as a length $L_{110aU}$. A length in the Y-direction of the semiconductor layer 120 at a height position of a lower surface of the conductive layer 110a is illustrated as a length $L_{110aL}$. A length in the Y-direction of the semiconductor layer 120 at an intermediate position of these height positions is illustrated as a length $L_{110aM}$. The length $L_{110aU}$ may be larger than the length $L_{110aM}$. The length $L_{110aM}$ may be larger than the length $L_{110aL}$. The lengths $L_{110aU}$, $L_{110aL}$, $L_{110aM}$ may be approximately the same.

In FIG. 3, a length in the Y-direction of the gate insulating film 130 at a height position of an upper surface of the interlayer insulating layer 101 is illustrated as a length $L_{101aU}$. A length in the Y-direction of the gate insulating film 130 at a height position of a lower surface of the interlayer insulating layer 101 is illustrated as a length $L_{101aL}$. A length in the Y-direction of the gate insulating film 130 at an intermediate position of these height positions is illustrated as a length $L_{101aM}$. The length $L_{101aU}$ may be larger than the length $L_{101aM}$. The length $L_{101aM}$ may be larger than the length $L_{101aL}$. The lengths $L_{101aU}$, $L_{101aL}$, $L_{101aM}$ may be approximately the same.

In a YZ cross-sectional surface indicated in FIG. 4, the plurality of interlayer insulating layers 101 stacked in the Z-direction have surfaces on the semiconductor layer 120 side formed into an approximately straight line. The block insulating film 133, the electric charge storage film 132, the tunnel insulating film 131, and the semiconductor layer 120 are formed into an approximately straight line along these surfaces.

In FIG. 4, a length in the Y-direction of the gate insulating film 130 at the height position of the upper surface of the interlayer insulating layer 101 is illustrated as a length $L_{101bU}$. A length in the Y-direction of the gate insulating film 130 at the height position of the lower surface of the interlayer insulating layer 101 is illustrated as a length $L_{101bL}$. A length in the Y-direction of the gate insulating film 130 at an intermediate position of these height positions is illustrated as a length $L_{101bM}$. The length $L_{101bU}$ may be larger than the length $L_{101bM}$. The length $L_{101bM}$ may be larger than the length $L_{101bL}$. The lengths $L_{101bU}$, $L_{101bL}$, $L_{101bM}$ may be approximately the same.

On the other hand, the plurality of conductive layers 110b stacked in the Z-direction have surfaces on the semiconductor layer 120 side each formed into an approximately recessed shape. That is, these surfaces are formed along curved lines that are each protruding in a direction away from the center axis of the semiconductor layer 120. The block insulating film 133, the electric charge storage film 132, the tunnel insulating film 131, and the semiconductor layer 120 are formed along these surfaces.

In FIG. 4, a length in the Y-direction of the semiconductor layer 120 at a height position of an upper surface of the conductive layer 110b is illustrated as a length $L_{110bU}$. A length in the Y-direction of the semiconductor layer 120 at a height position of a lower surface of the conductive layer 110b is illustrated as a length $L_{110bL}$. A length in the Y-direction of the semiconductor layer 120 at an intermediate position of these height positions is illustrated as a length $L_{110bM}$. The length $L_{110bM}$ is larger than the lengths $L_{110bU}$, $L_{110bL}$. A difference between the length $L_{110bM}$ and the length $L_{110bU}$, and a difference between the length $L_{110bM}$ and the length $L_{110bL}$ are larger than a difference between the length $L_{101bM}$ and the length $L_{101bU}$, and a difference between the length $L_{101bM}$ and the length $L_{101bL}$. The difference between the length $L_{110bM}$ and the length $L_{110bU}$, and the difference between the length $L_{110bM}$ and the length $L_{110bL}$ are larger than a difference between the length $L_{110aM}$ and the length $L_{110aU}$, a difference between the length $L_{110aM}$ and the length $L_{110aL}$, a difference between the length $L_{101aM}$ and the length $L_{101aU}$, and a difference between the length $L_{101aM}$ and the length $L_{101aL}$, which have been described with reference to FIG. 3.

Figure 5:
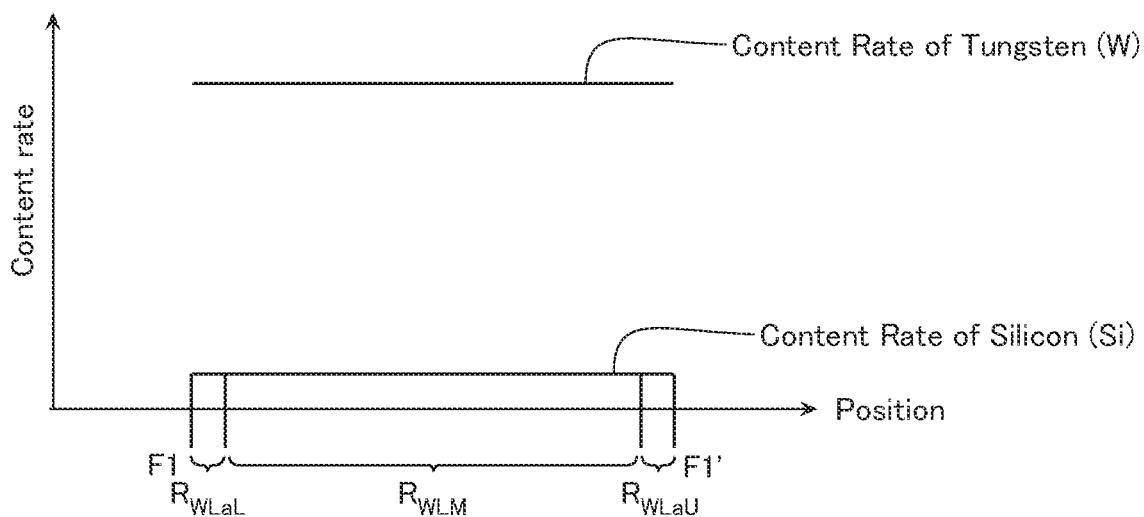
FIG. 5 is a schematic graph for describing a material of a conductive layer 110.
Figure 6:
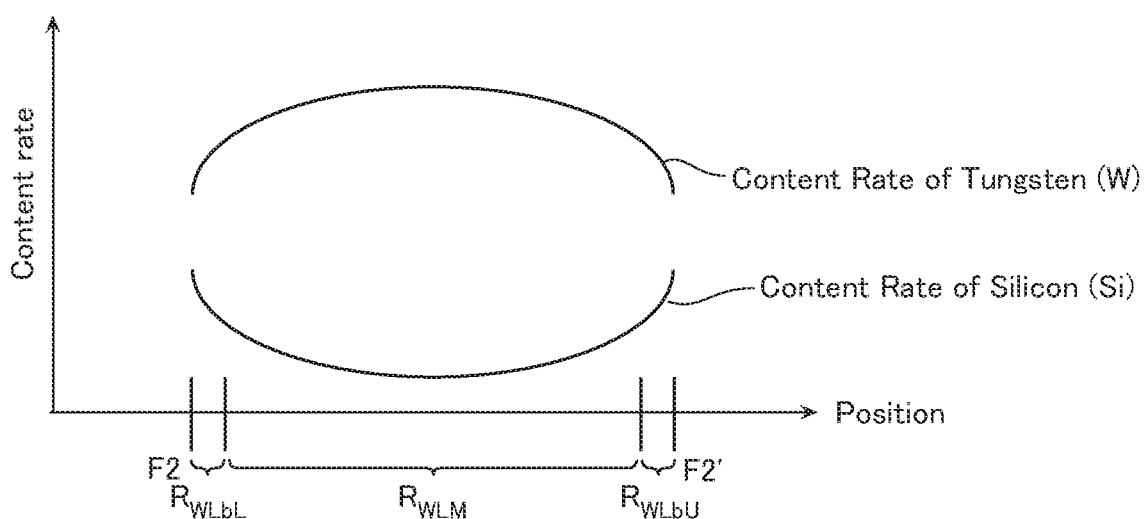
FIG. 6 is a schematic graph for describing the material of the conductive layer 110.
Figure 7:
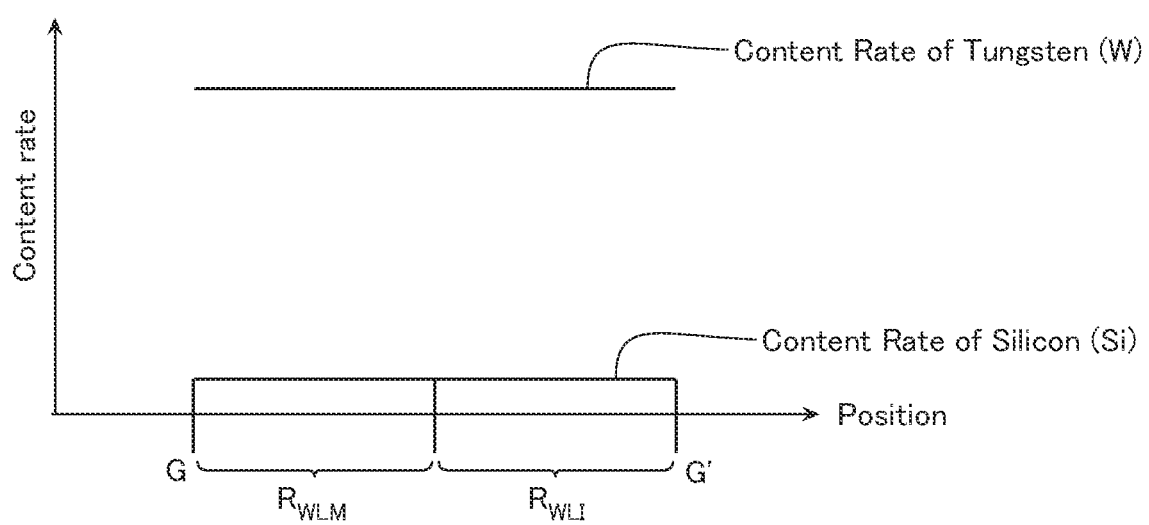
FIG. 7 is a schematic graph for describing the material of the conductive layer 110.

FIG. 5 to FIG. 7 are schematic graphs for describing the material of the conductive layer 110. FIG. 5 indicates content rates of components contained in the portion along a line F1-F1' of the structure indicated in FIG. 3. FIG. 6 indicates the content rates of components contained in the portion along a line F2-F2' of the structure indicated in FIG. 4. FIG. 7 indicates the content rates of components contained in the portions along lines G-G' of the structures indicated in FIG. 3 and FIG. 4.

As illustrated in FIG. 5, the conductive layer 110a contains metal such as tungsten (W) or molybdenum (Mo). The conductive layer 110a may contain silicon (Si) or need not contain silicon (Si).

As illustrated in FIG. 6, the conductive layer 110b contains metal such as tungsten (W) or molybdenum (Mo) and silicon (Si). As illustrated in FIG. 6, in the conductive layer 110b, at the proximity of a center position in the Z-direction, the content rate of metal such as tungsten (W) becomes maximum, and the content rate of silicon (Si) becomes minimum. The content rate of metal such as tungsten (W) in the conductive layer 110b becomes smaller toward the upper surface or the lower surface of the conductive layer 110b. The content rate of silicon (Si) becomes larger toward the upper surface or the lower surface of the conductive layer 110b.

In FIG. 3, a region near a center in a YZ cross-sectional surface of the conductive layer 110a is indicated as a region $R_{WLM}$. A region near the gate insulating film 130 of the conductive layer 110a is indicated as a region $R_{WLI}$. A region near the lower surface of the conductive layer 110a is indicated as a region $R_{WLaL}$. A region near the upper surface of the conductive layer 110a is indicated as a region $R_{WLaU}$.

In FIG. 4, a region near a center in a YZ cross-sectional surface of the conductive layer 110b is indicated as a region $R_{WLM}$. A region near the gate insulating film 130 of the conductive layer 110b is indicated as a region $R_{WLI}$. A region near the lower surface of the conductive layer 110b is indicated as a region $R_{WLbL}$. A region near the upper surface of the conductive layer 110b is indicated as a region $R_{WLbU}$.

As illustrated in FIG. 5 to FIG. 7, in the first embodiment, the content rates of silicon (Si) in the regions $R_{WLbL}$, $R_{WLbU}$ are higher than the content rates of silicon (Si) in the regions $R_{WLM}$, $R_{WLI}$, $R_{WLaL}$, $R_{WLaU}$.

A boundary between the region $R_{WLbL}$ and the region $R_{WLM}$ may be specified by, for example, the following method. That is, components of the conductive layer 110b are analyzed along the line F2-F2' in FIG. 4. Next, a maximum value of the content rate of silicon (Si) in the region $R_{WLbL}$ is obtained. A minimum value of the content rate of silicon (Si) in the region $R_{WLM}$ is obtained. An average value of the obtained maximum value and minimum value is obtained. A point on the line F2-F2' in FIG. 4 at which the obtained average value of the content rate of silicon (Si) can be obtained is specified as the boundary between the region $R_{WLbL}$ and the region $R_{WLM}$.

A boundary between the region $R_{WLbU}$ and the region $R_{WLM}$ may also be specified by the similar method.

In this case, the boundary between the region $R_{WLM}$ and the regions $R_{WLI}$, the boundary between the region $R_{WLM}$ and $R_{WLaL}$, and the boundary between the region $R_{WLM}$ and $R_{WLaU}$ may be specified by the following method. That is, either or both of the boundary between the region $R_{WLbL}$ and the region $R_{WLM}$ and the boundary between the region $R_{WLbU}$ and the region $R_{WLM}$ is specified by the above-described method. Next, the length in the Z-direction of either or both of the region $R_{WLbL}$ and the region $R_{WLbU}$ is specified. Next, a position in the Z-direction apart from the lower surface of the conductive layer 110a by this length is specified as the boundary between the region $R_{WLM}$ and the region $R_{WLaL}$. A position in the Z-direction apart from the upper surface of the conductive layer 110a by this length is specified as the boundary between the region $R_{WLM}$ and the region $P_{WLaU}$. Positions apart from the surfaces on a gate insulating film 130 side of the conductive layers 110a, 110b by this distance are each specified as the boundary between the region $R_{WLM}$ and the region $R_{WLI}$.

[Manufacturing Method]

Figure 12:
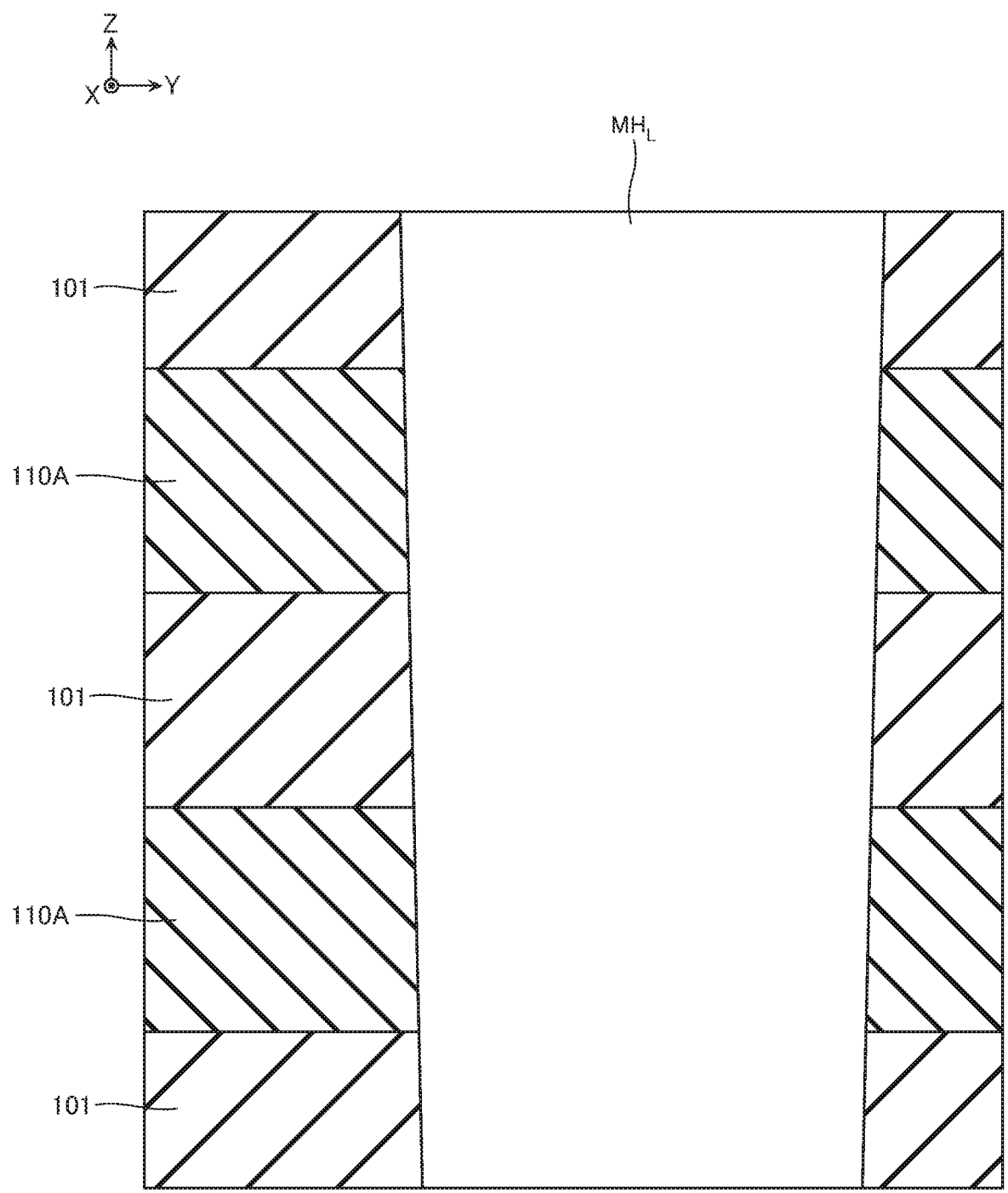
FIG. 12 is a schematic cross-sectional view illustrating the manufacturing method.
Figure 13:
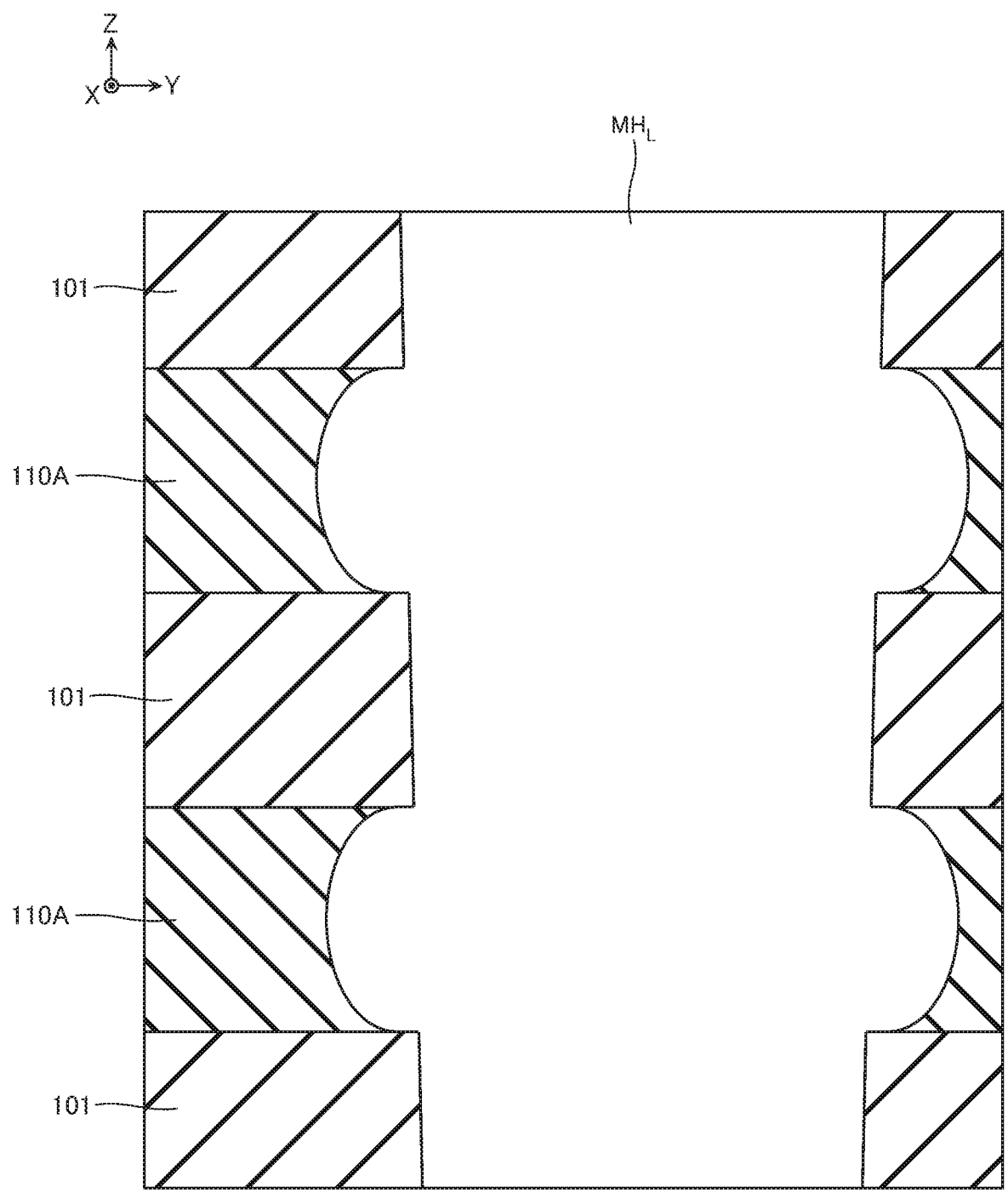
FIG. 13 is a schematic cross-sectional view illustrating the manufacturing method.

Next, with reference to FIG. 8 to FIG. 27, the manufacturing method of the semiconductor memory device according to the embodiment is described. FIG. 8 and FIG. 10 to FIG. 27 are schematic cross-sectional views illustrating the manufacturing method of the semiconductor memory device according to the embodiment. FIG. 9 is a schematic graph for describing the manufacturing method of the semiconductor memory device according to the embodiment. FIG. 8, FIG. 10, FIG. 11, FIG. 14 to FIG. 20, and FIG. 22 to FIG. 27 illustrate the cross-sectional surfaces corresponding to FIG. 2. FIG. 12, FIG. 13, and FIG. 21 illustrate the cross-sectional surfaces corresponding to FIG. 4.

Figure 8:
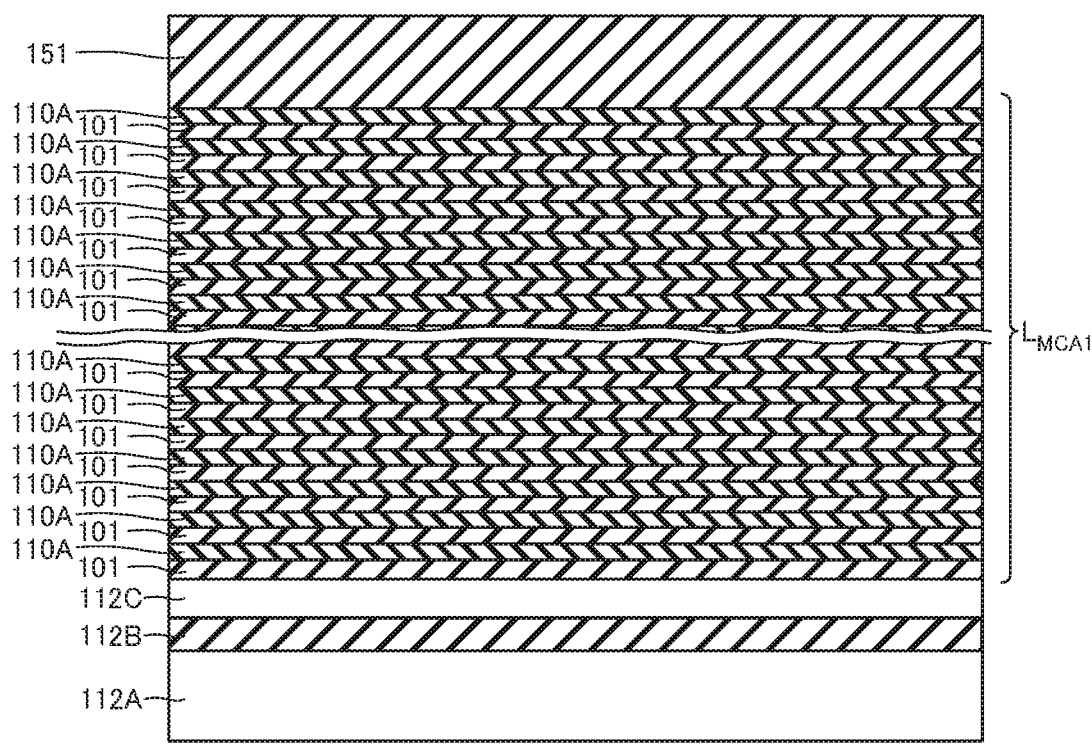
FIG. 8 is a schematic cross-sectional view illustrating a manufacturing method of the semiconductor memory device according to the first embodiment.
Figure 9:
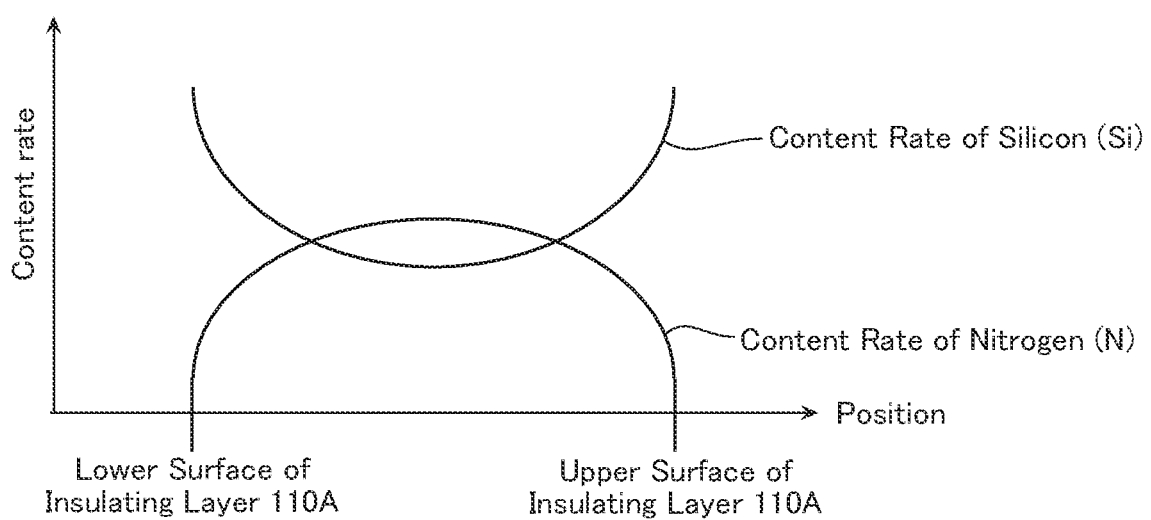
FIG. 9 is a schematic graph for describing the manufacturing method.

In manufacturing the semiconductor memory device according to the embodiment, for example, as illustrated in FIG. 8, a semiconductor layer 112A of silicon or the like, a sacrifice layer 112B of silicon nitride or the like, and a semiconductor layer 112C of silicon or the like are formed. For example, formation of an interlayer insulating layer 101 and formation of an insulating layer 110A of silicon nitride or the like are repeatedly executed. This process is performed, for example, by a method such as Chemical Vapor Deposition (CVD).

In this process, in forming the insulating layers 110A corresponding to the conductive layers 110b, a ratio of silicon (Si) to nitrogen (N) is adjusted. For example, as illustrated in FIG. 9, at a center position in the Z-direction of the insulating layer 110A, the ratio of silicon to nitrogen is adjusted such that the content rate of silicon (Si) is minimum, and the content rate of nitrogen (N) is maximum. On an upper surface and a lower surface of the insulating layer 110A, the ratio is adjusted such that the content rate of silicon (Si) is maximum, and the content rate of nitrogen (N) is minimum.

Figure 10:
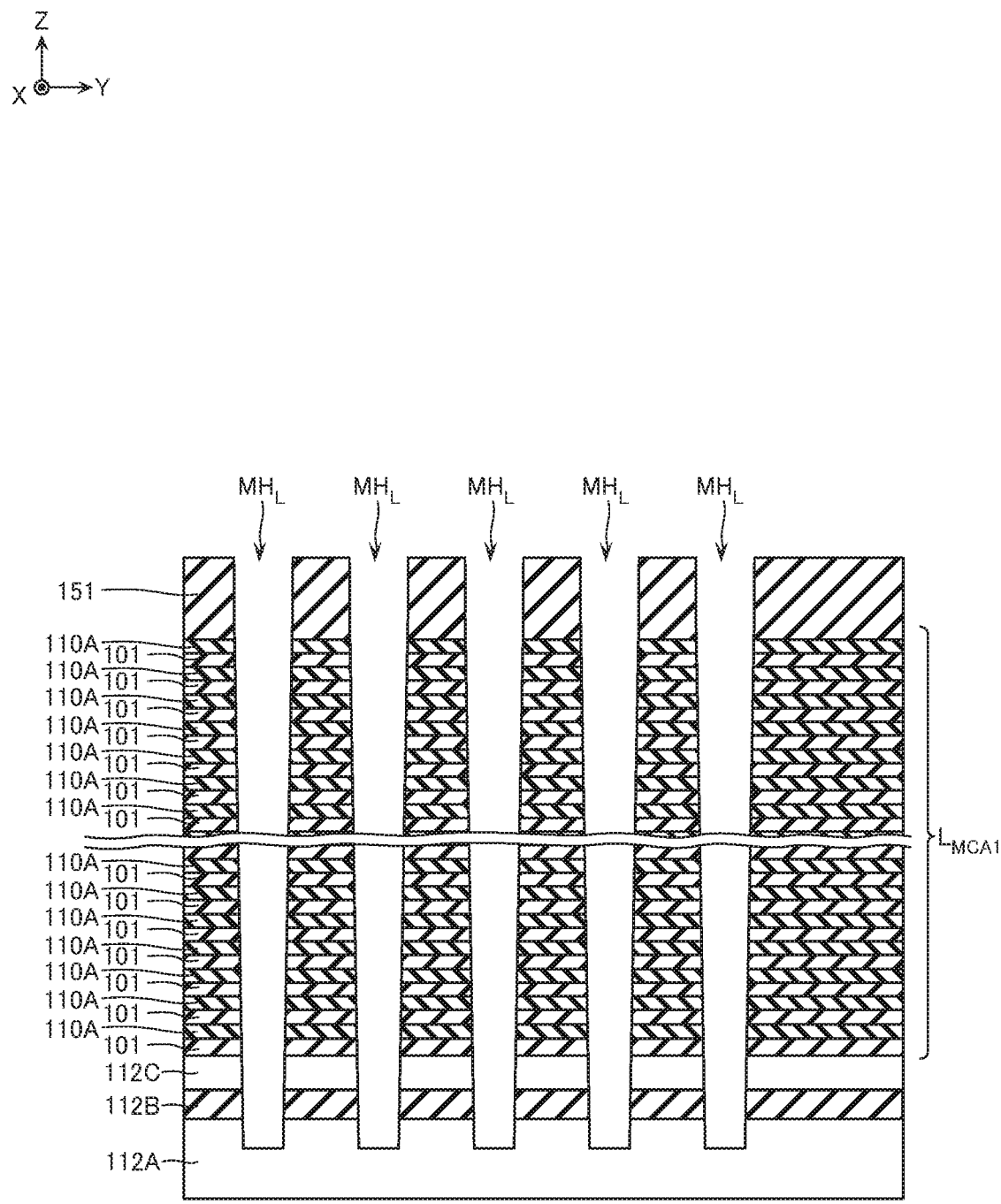
FIG. 10 is a schematic cross-sectional view illustrating the manufacturing method.

Next, for example, as illustrated in FIG. 10, a plurality of memory holes $MH_L$ are formed at positions corresponding to the plurality of semiconductor layers 120. The memory hole $MH_L$ is a through hole that extends in the Z-direction, passes through the interlayer insulating layers 101, the insulating layers 110A, the semiconductor layer 112C and the sacrifice layer 112B, and exposes an upper surface of the semiconductor layer 112A. This process is performed, for example, by a method such as RIE.

Figure 11:
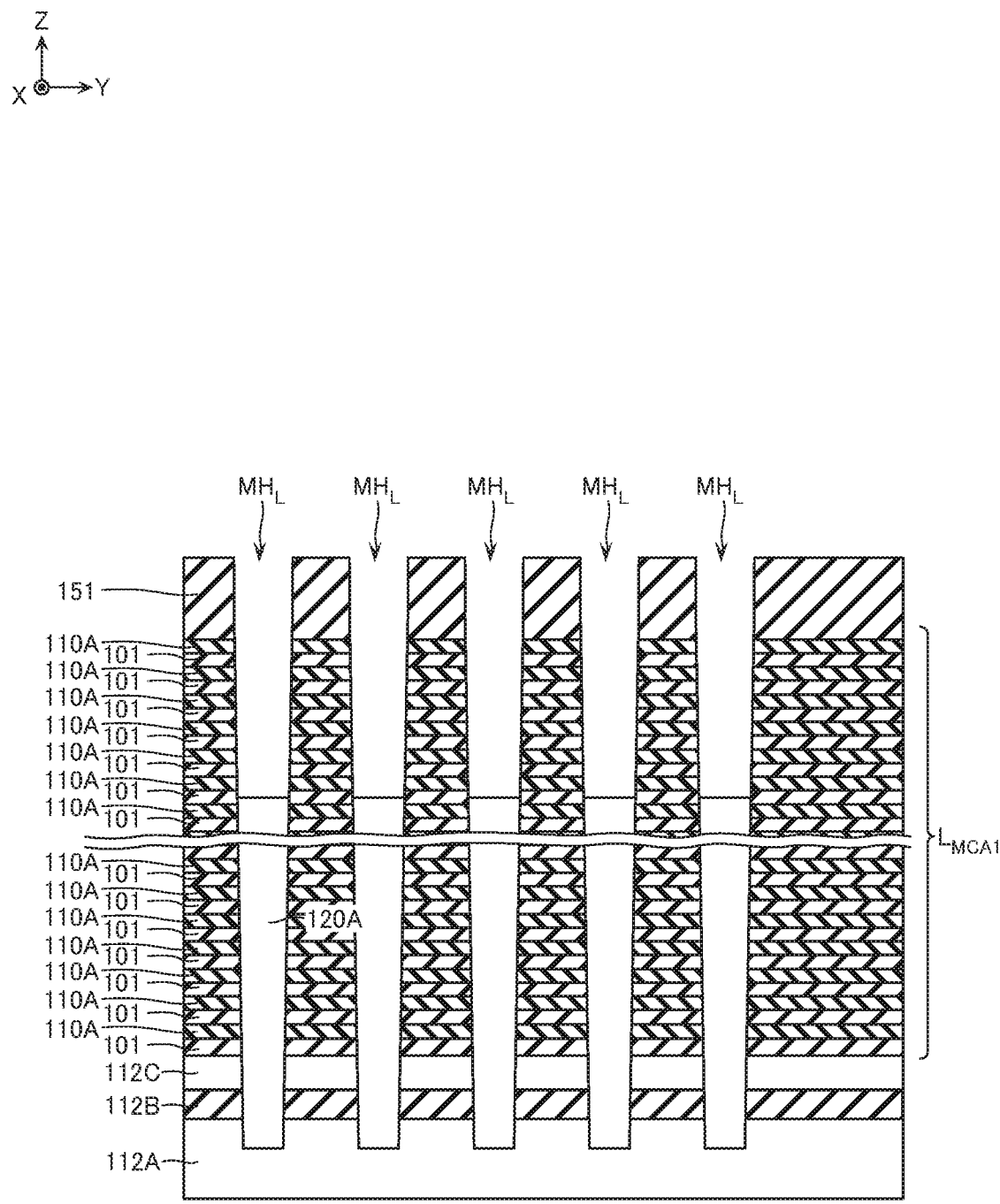
FIG. 11 is a schematic cross-sectional view illustrating the manufacturing method.

Next, for example, as illustrated in FIG. 11, a sacrifice film 120A is formed inside the memory hole $MH_L$. In this process, for example, the memory hole $MH_L$ is embedded with the sacrifice film 120A. A part of the sacrifice film 120A is removed, and the insulating layers 110A corresponding to the conductive layers 110b are exposed in the memory hole $MH_L$.

Next, for example, as illustrated in FIG. 12 and FIG. 13, a part of the insulating layer 110A is removed and a curved surface is formed on a surface exposed to the memory hole $MH_L$ of the insulating layer 110A. This process is performed, for example, by a method such as wet etching. This process is performed in conditions where the portion having increased ratio of nitrogen (N) of silicon nitride is easier to be removed while the portion having increased ratio of silicon (Si) is less likely to be removed. As a result, the surface having an approximately recessed shape described with reference to FIG. 4 is formed on a surface on a memory hole $MH_L$ side of the insulating layer 110A.

Figure 14:
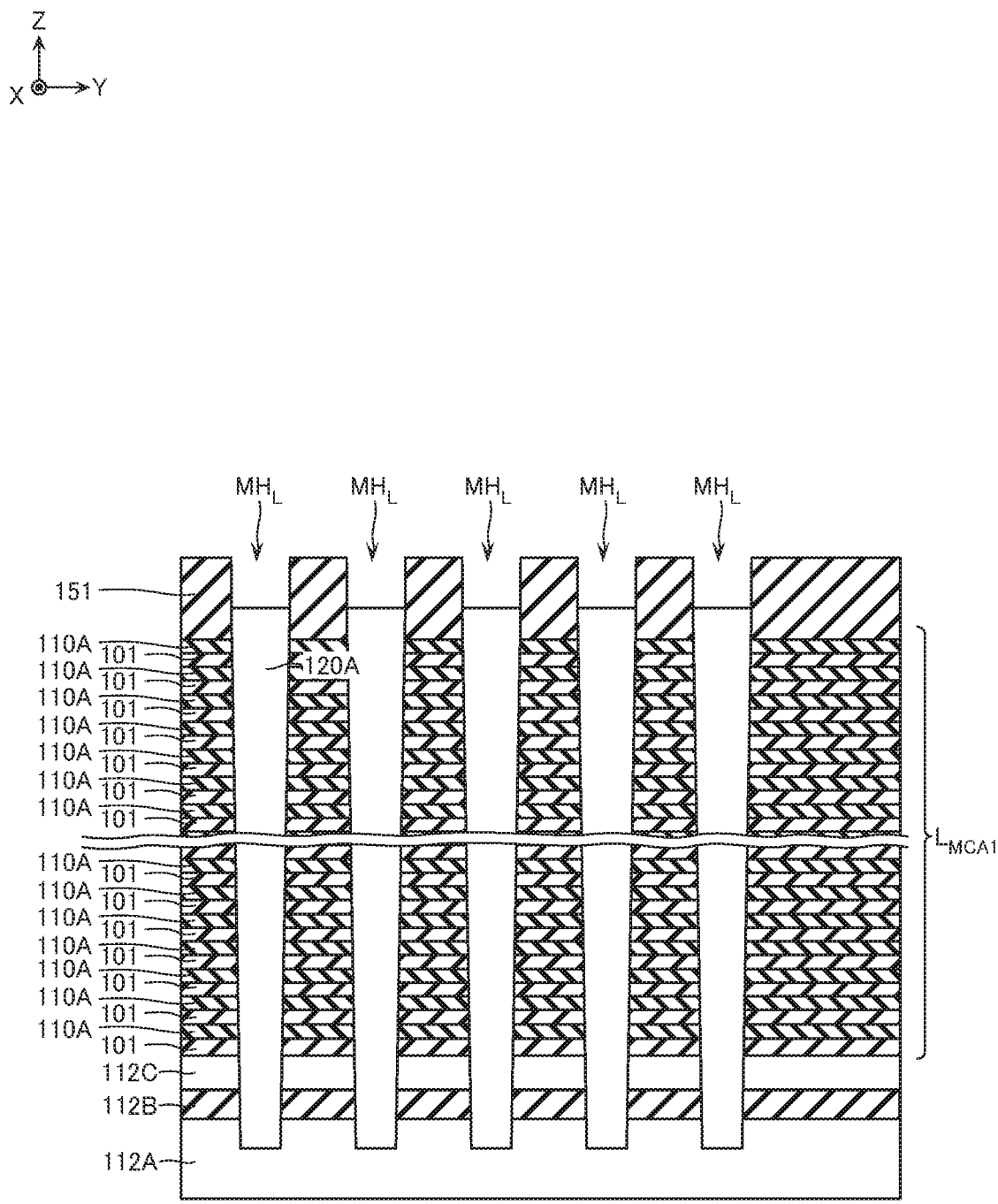
FIG. 14 is a schematic cross-sectional view illustrating the manufacturing method.

Next, for example, as illustrated in FIG. 14, the sacrifice film 120A is further formed inside the memory hole $MH_L$.

In this process, for example, the memory hole $MH_L$ is embedded with the sacrifice film 120A. A part of the sacrifice film 120A is removed, and a part of the insulating layer 151 is exposed on an inner peripheral surface of the memory hole $MH_L$.

Figure 15:
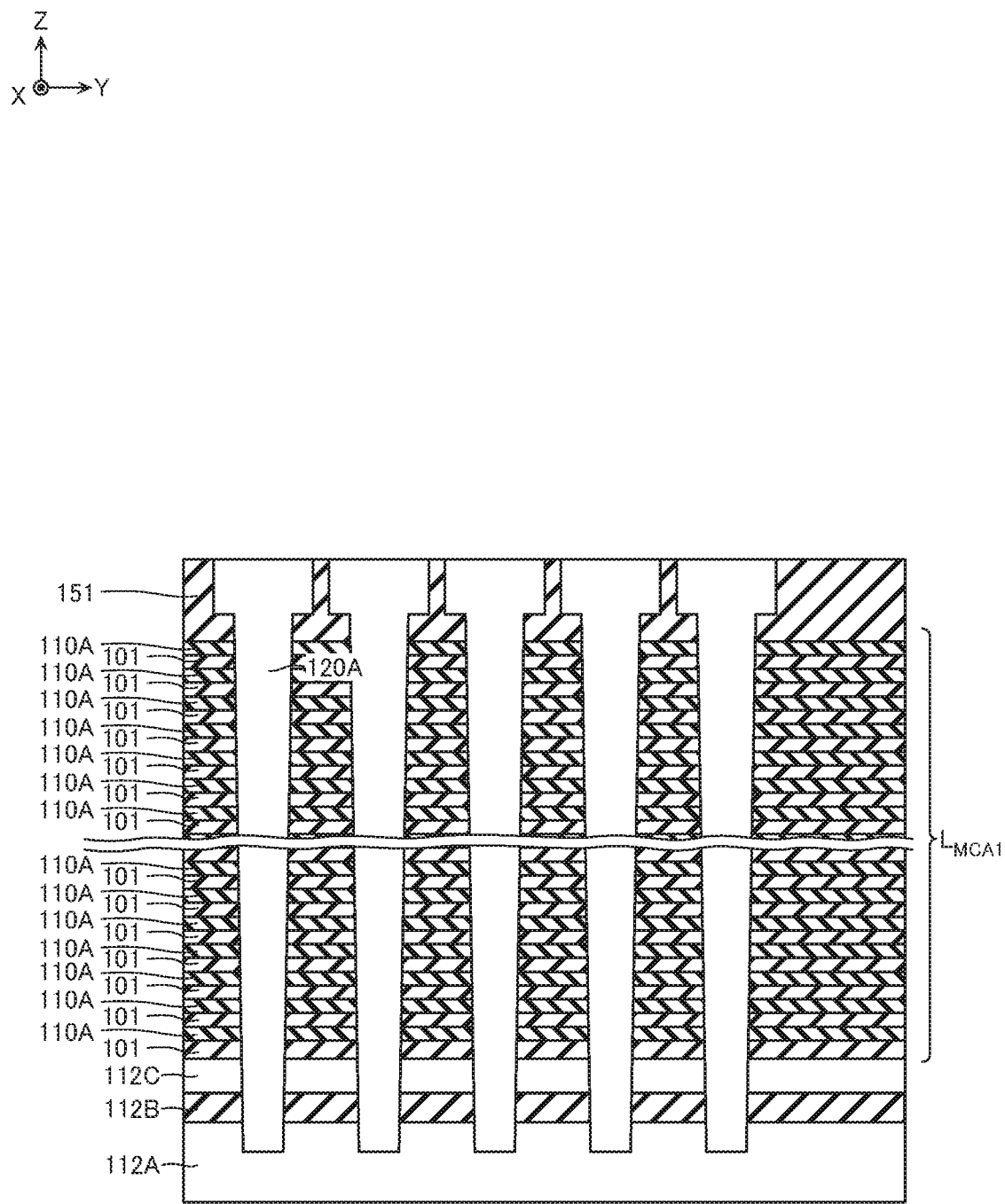
FIG. 15 is a schematic cross-sectional view illustrating the manufacturing method.

Next, for example, as illustrated in FIG. 15, a part of the insulating layer 151 is removed and a radius at an upper end of the memory hole $MH_L$ is enlarged. This process is performed, for example, by a method such as wet etching. The sacrifice film 120A is further formed near the upper end of the memory hole $MH_L$.

Figure 16:
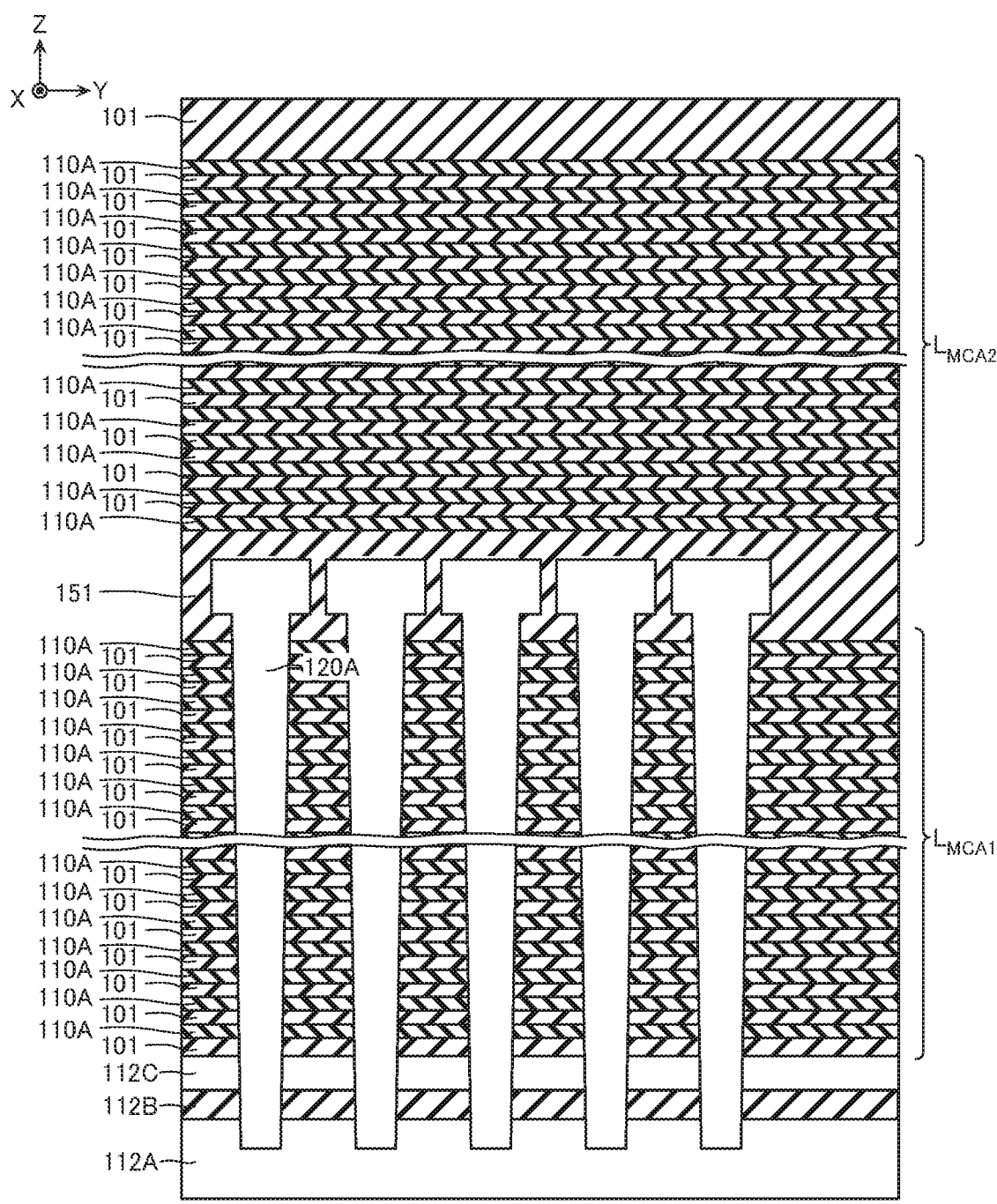
FIG. 16 is a schematic cross-sectional view illustrating the manufacturing method.

Next, for example, as illustrated in FIG. 16, with respect to the upper surface of the structure described with reference to FIG. 15, the formation of the interlayer insulating layer 101 and the formation of the insulating layer 110A are repeatedly executed. This process is performed, for example, by a method such as CVD. In this process, similarly to the processes described with reference to FIG. 8 and FIG. 9, in forming the insulating layers 110A corresponding to the conductive layers 110b, the ratio of silicon (Si) to nitrogen (N) is adjusted.

Figure 17:
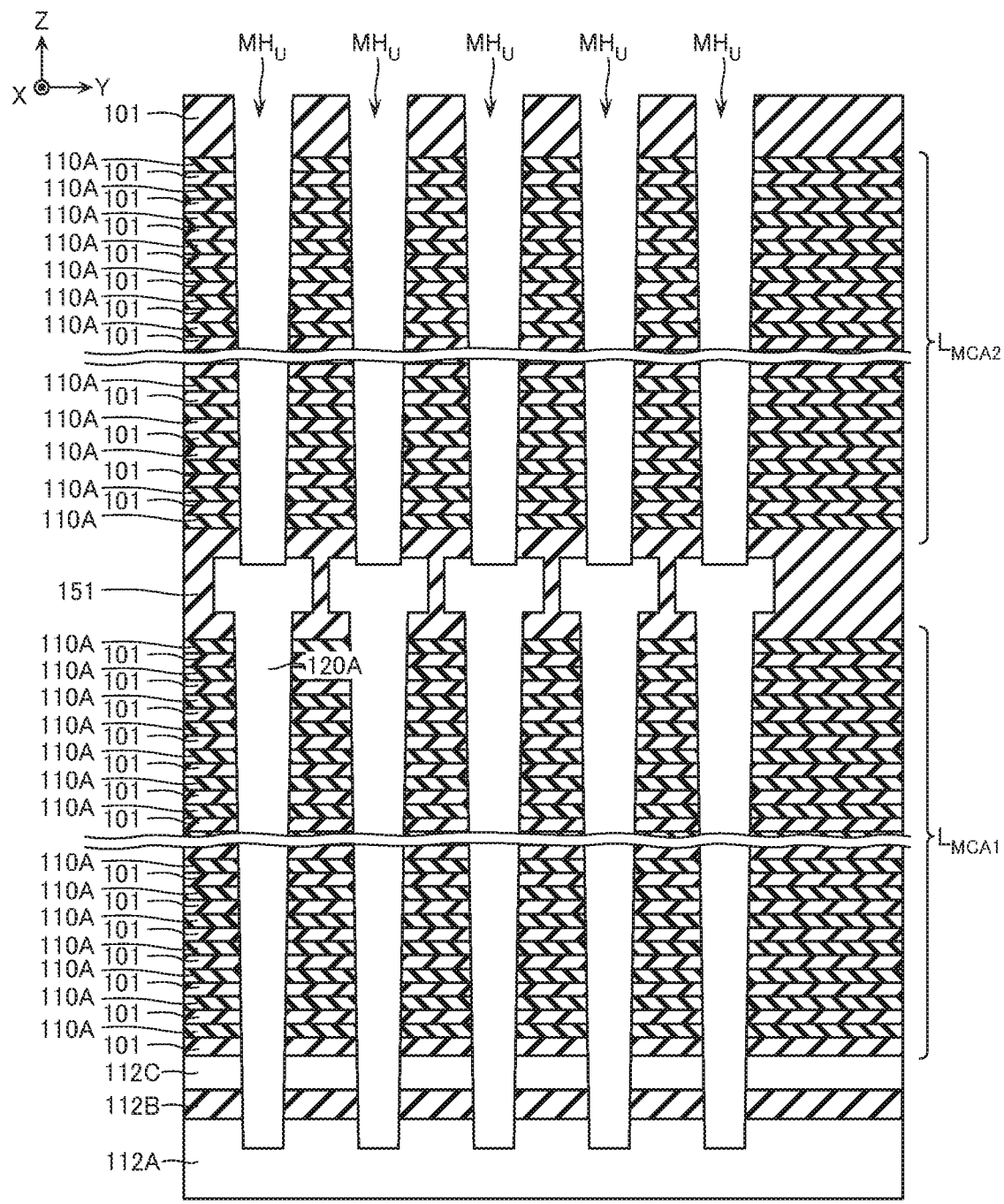
FIG. 17 is a schematic cross-sectional view illustrating the manufacturing method.

Next, for example, as illustrated in FIG. 17, a plurality of memory holes $MH_U$ are formed at positions corresponding to the plurality of semiconductor layers 120. The memory hole $MH_U$ is a through hole that extends in the Z-direction, passes through the interlayer insulating layers 101 and the insulating layers 110A and exposes an upper surface of the sacrifice film 120A. This process is performed, for example, by a method such as RIE.

Figure 18:
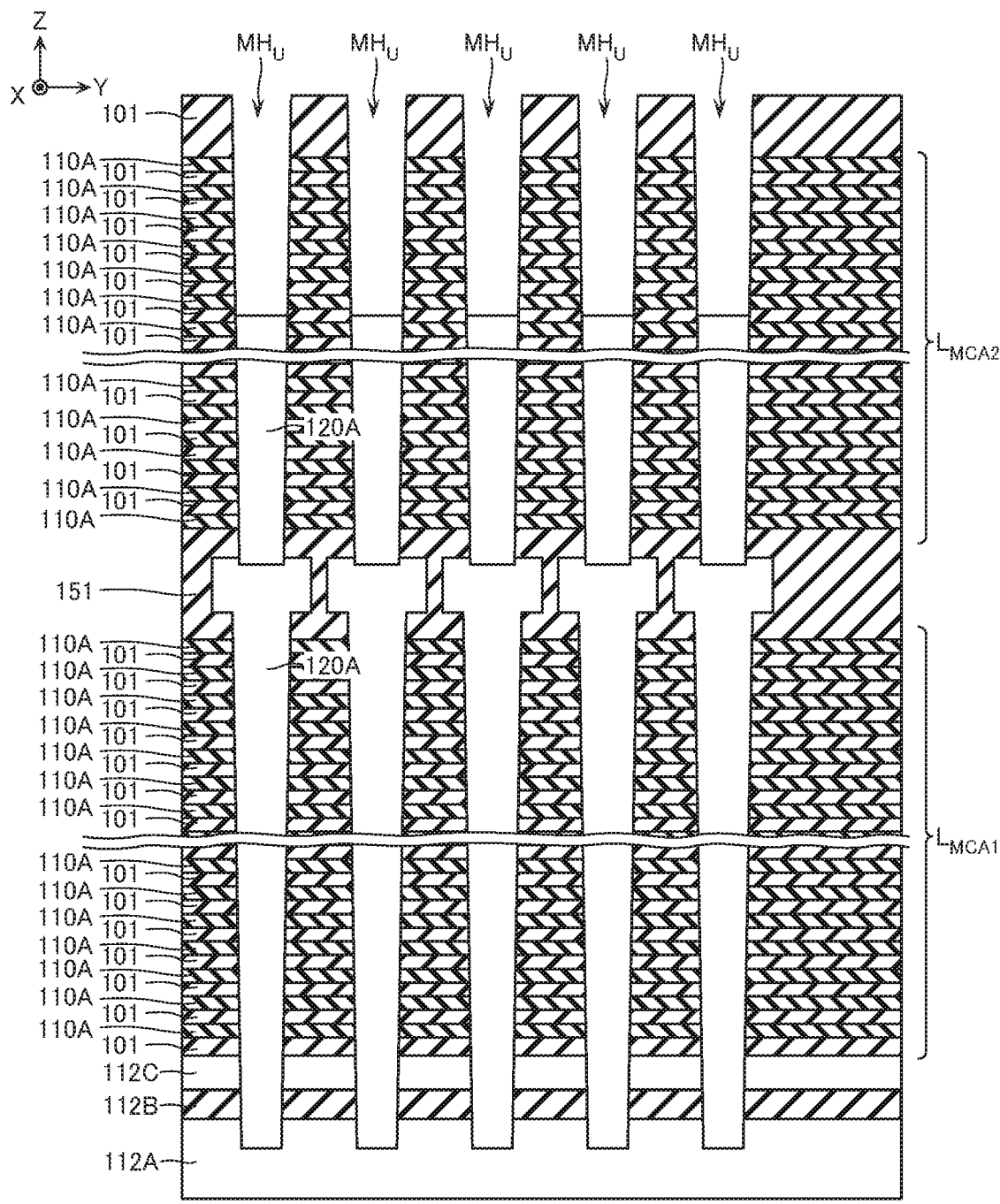
FIG. 18 is a schematic cross-sectional view illustrating the manufacturing method.

Next, for example, as illustrated in FIG. 18, the sacrifice film 120A is formed inside the memory hole $MH_U$. In this process, for example, the memory hole $MH_U$ is embedded with the sacrifice film 120A. A part of the sacrifice film 120A is removed and the insulating layers 110A corresponding to the conductive layers 110b are exposed in the memory hole $MH_U$.

Next, by executing processes similar to the processes described with reference to FIG. 12 and FIG. 13, a part of the insulating layer 110A is removed, and a curved surface is formed on a surface exposed to the memory hole $MH_U$ of the insulating layer 110A.

Figure 19:
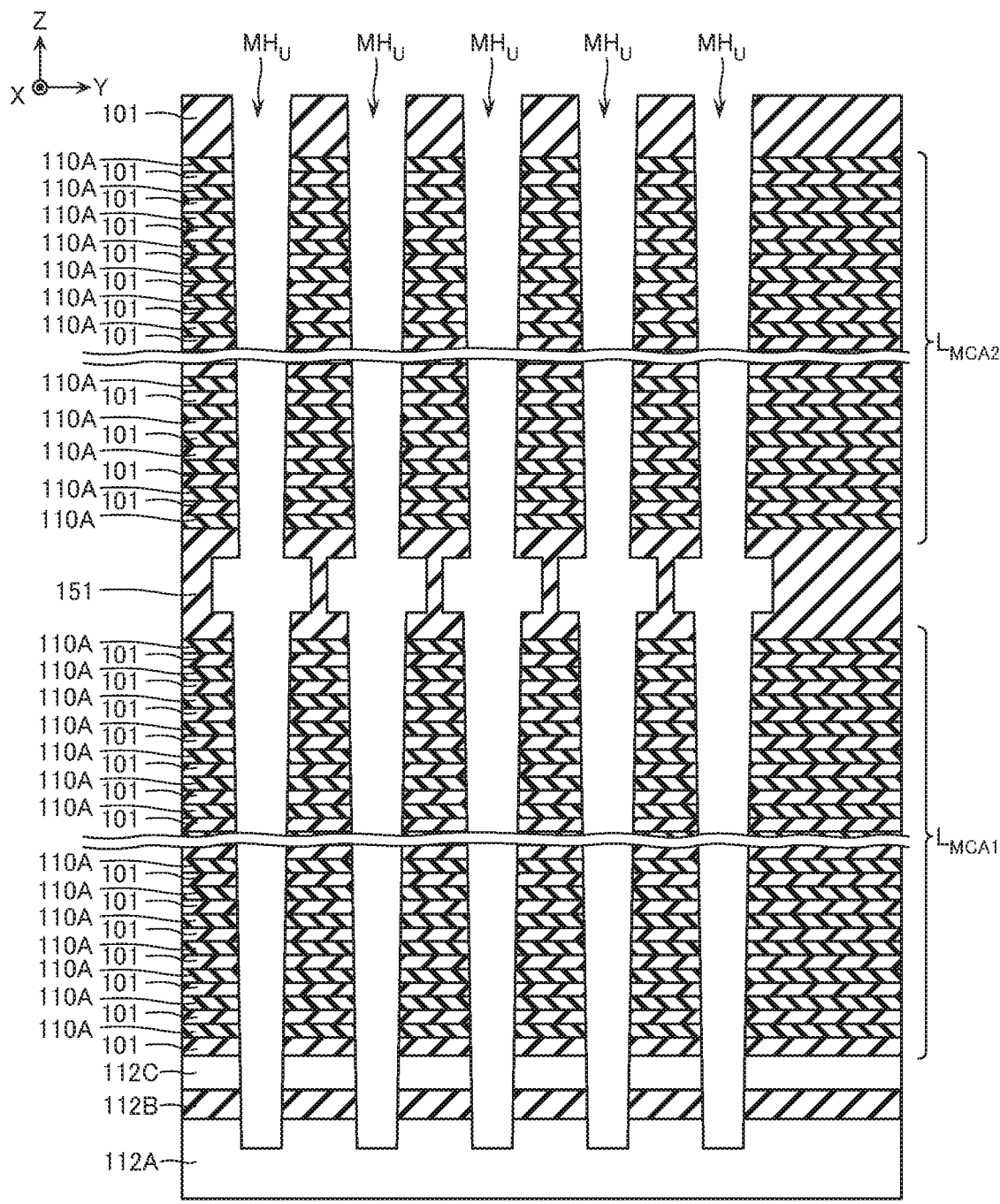
FIG. 19 is a schematic cross-sectional view illustrating the manufacturing method.

Next, for example, as illustrated in FIG. 19, the sacrifice films 120A are removed. This process is performed, for example, by a method such as wet etching.

Figure 20:
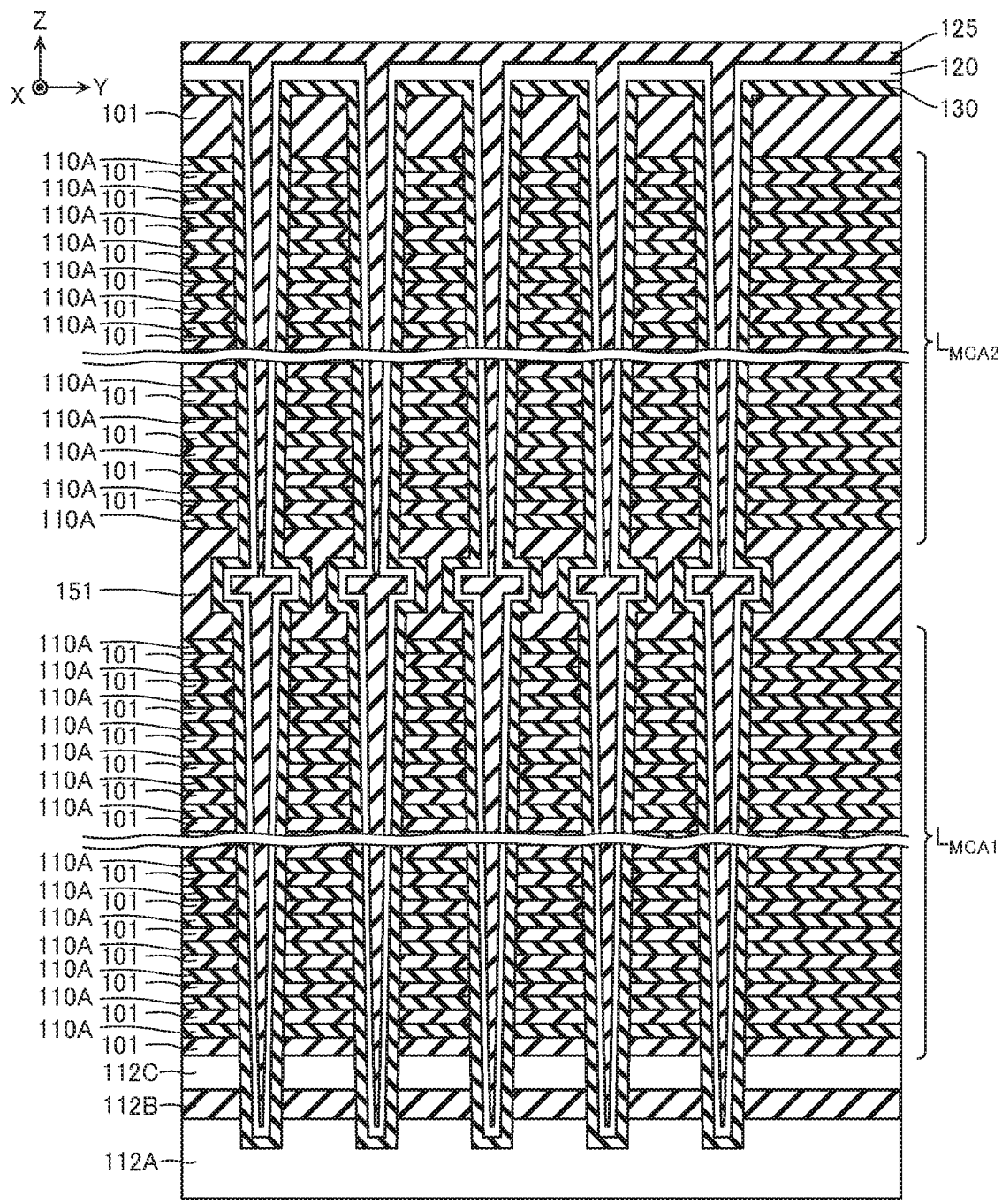
FIG. 20 is a schematic cross-sectional view illustrating the manufacturing method.
Figure 21:
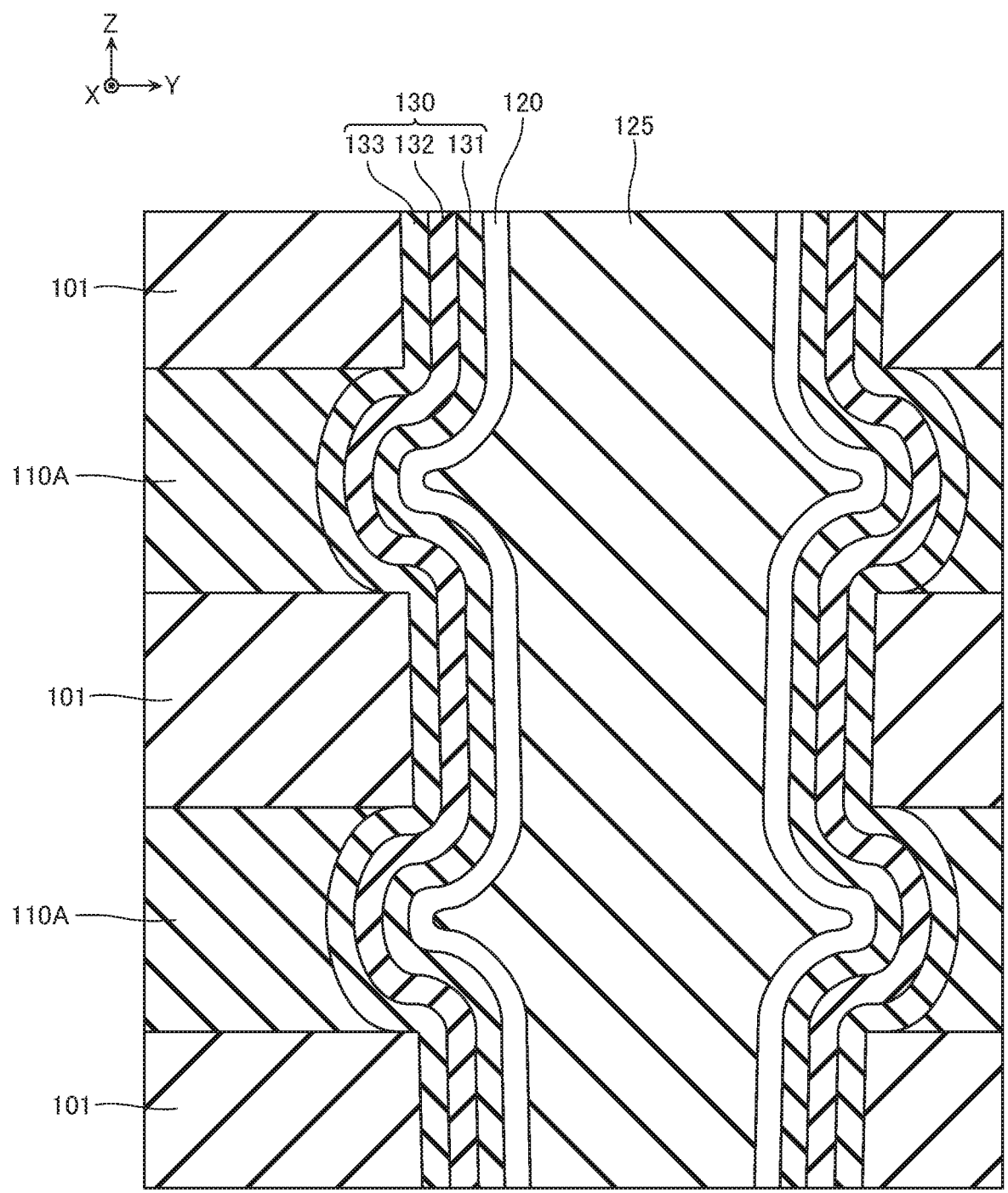
FIG. 21 is a schematic cross-sectional view illustrating the manufacturing method.

Next, for example, as illustrated in FIG. 20, the gate insulating films 130, the semiconductor layers 120, and the insulating layers 125 are formed inside the memory holes $MH_L$, $MH_U$, and on the upper surface of the interlayer insulating layer 101 of the uppermost layer. This process is performed by, for example, CVD or the like.

In this process, as illustrated in FIG. 21, the gate insulating film 130 and the semiconductor layer 120 are formed along the curved surface formed in the processes described with reference to FIG. 12 and FIG. 13.

Figure 22:
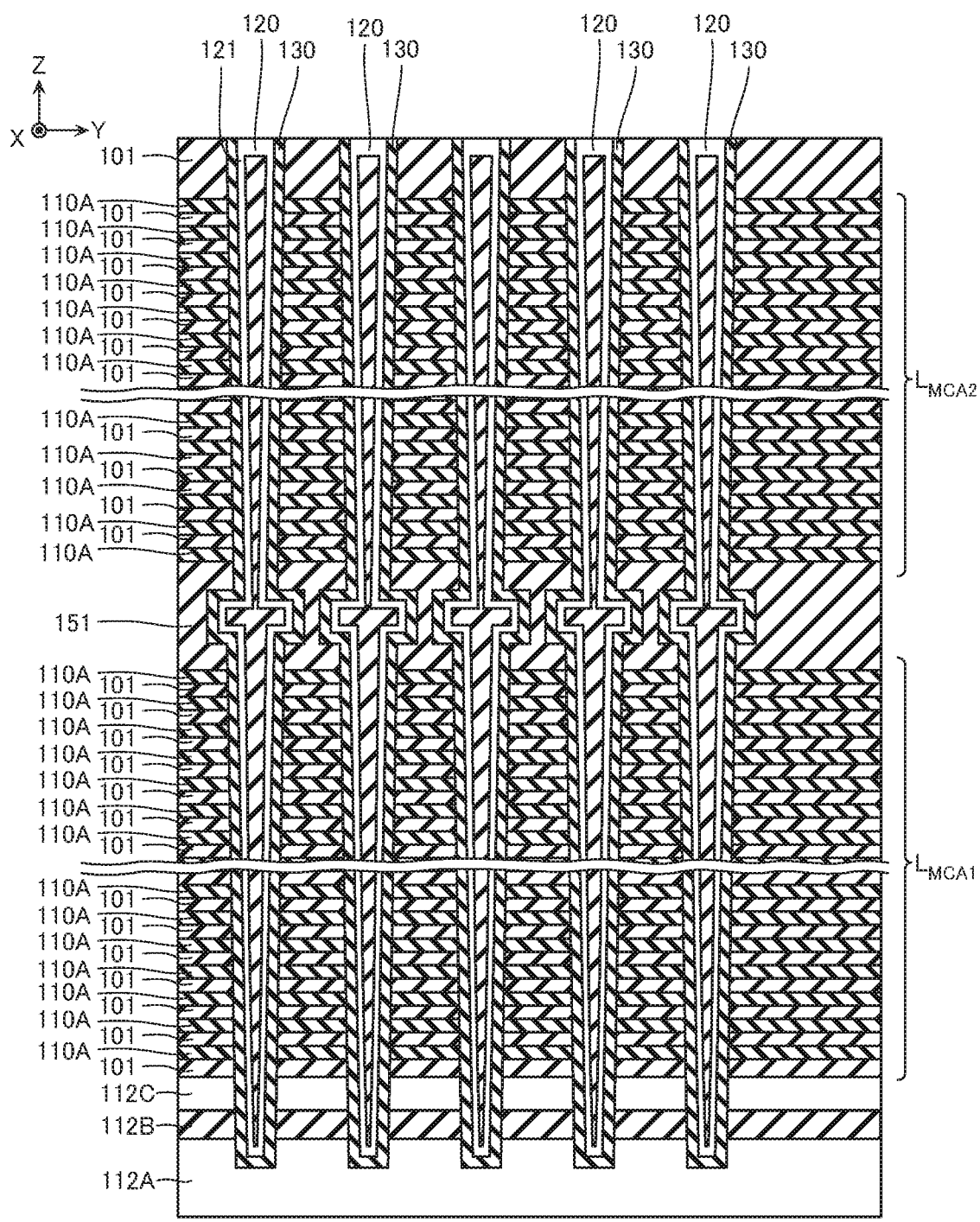
FIG. 22 is a schematic cross-sectional view illustrating the manufacturing method.

Next, for example, as illustrated in FIG. 22, the impurity region 121 is formed. In this process, for example, by a method such as RIE, a part of the gate insulating film 130, the semiconductor layer 120, and the insulating layer 125 are removed. The impurity region 121 is formed by, for example, CVD or the like.

Figure 23:
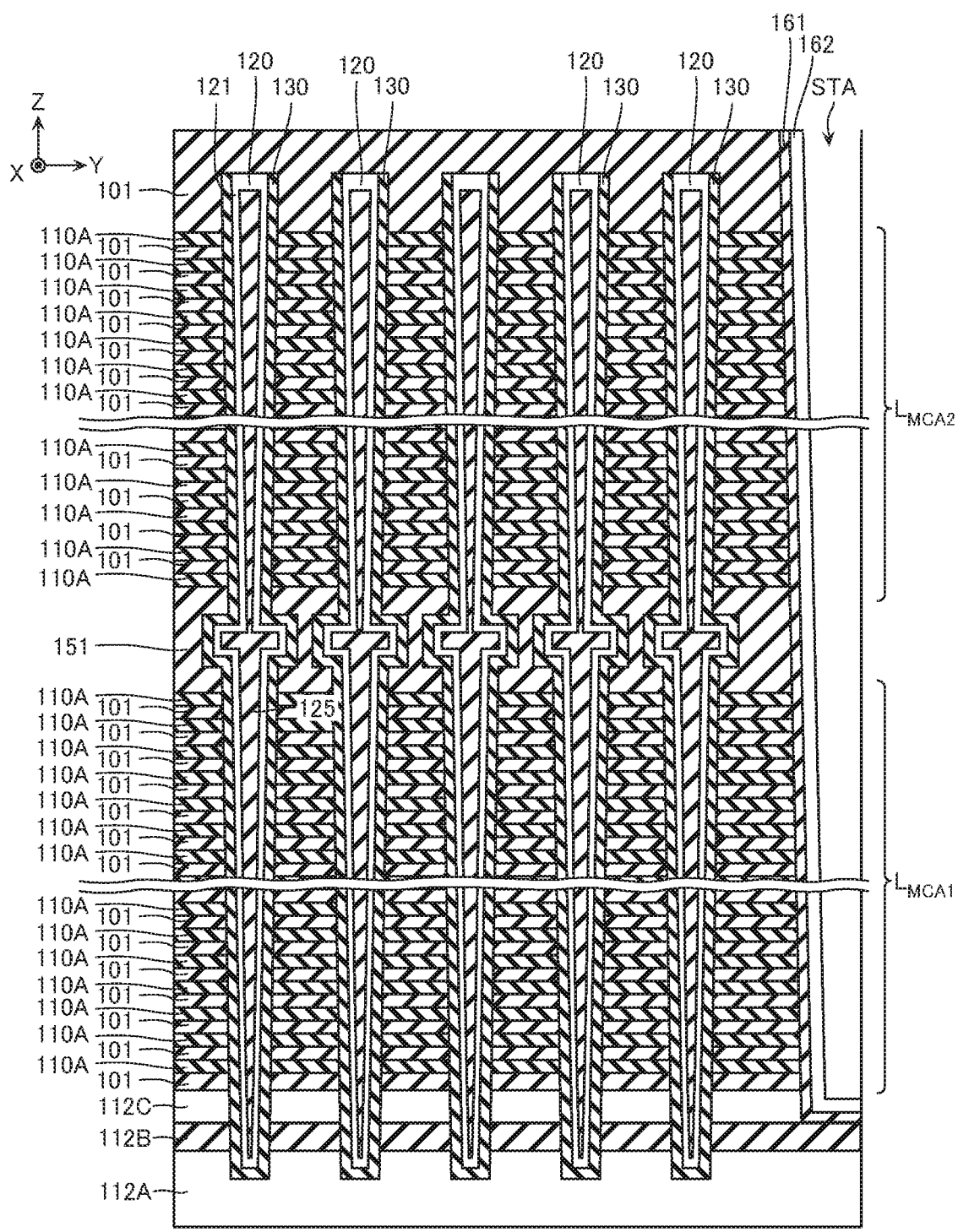
FIG. 23 is a schematic cross-sectional view illustrating the manufacturing method.

Next, for example, as illustrated in FIG. 23, the interlayer insulating layer 101 is further formed on the upper surface of the structure exemplary indicated in FIG. 22. This process is performed, for example, by a method such as CVD.

Next, a trench STA is formed at the position corresponding to the inter-block insulating layer ST. The trench STA extends in the Z-direction and the X-direction, separates the interlayer insulating layers 101, the insulating layers 110A and the semiconductor layer 112C in the Y-direction, and exposes an upper surface of the sacrifice layer 112B. This process is performed, for example, by a method such as RIE.

Next, protective films 161, 162 are formed inside the trench STA.

Figure 24:
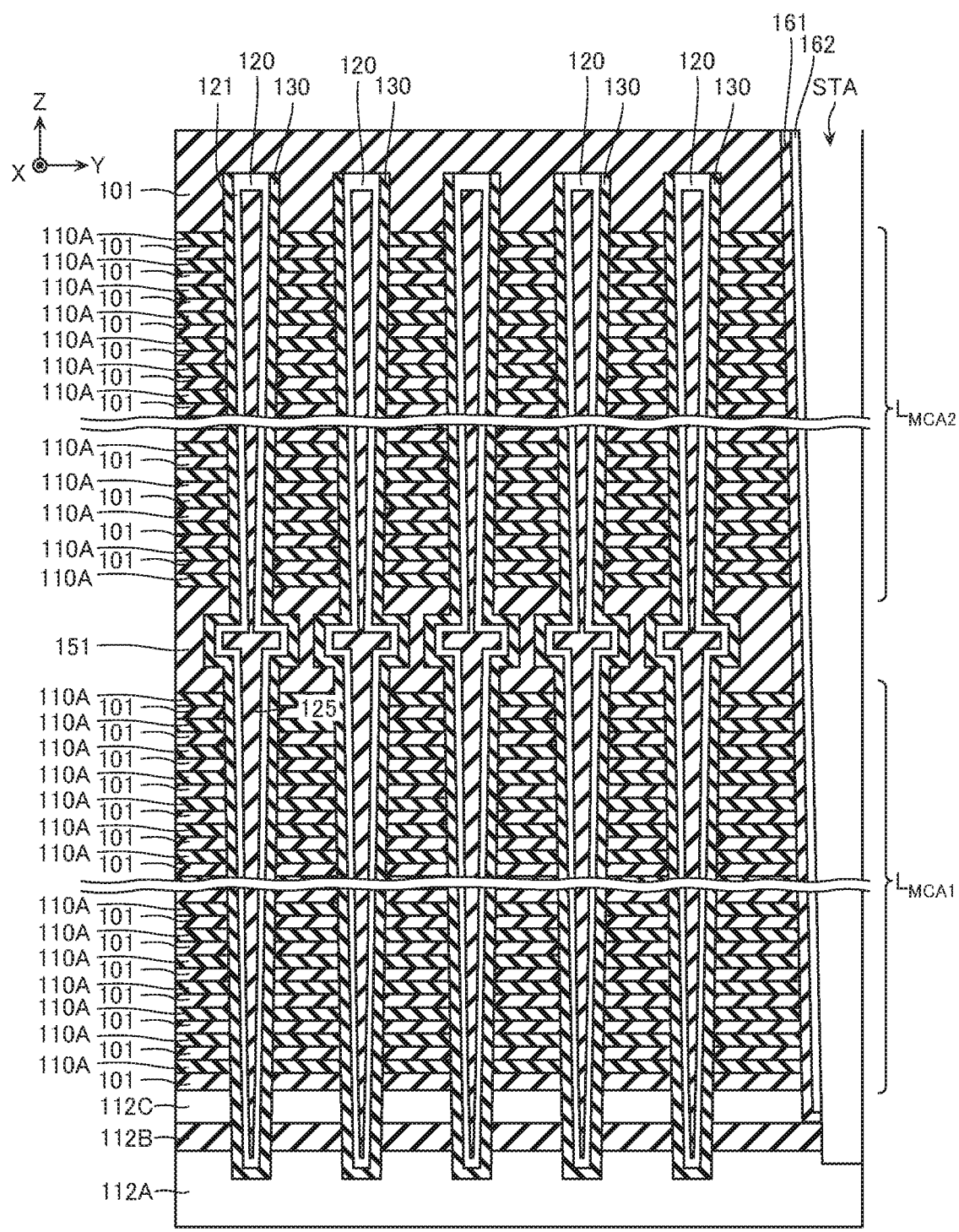
FIG. 24 is a schematic cross-sectional view illustrating the manufacturing method.

Next, for example, as illustrated in FIG. 24, a portion of the protective films 161, 162 formed on a bottom surface of the trench STA and a part of the sacrifice layer 112B are removed and the upper surface of the semiconductor layer 112A is exposed. This process is performed by, for example, RIE or the like.

Figure 25:
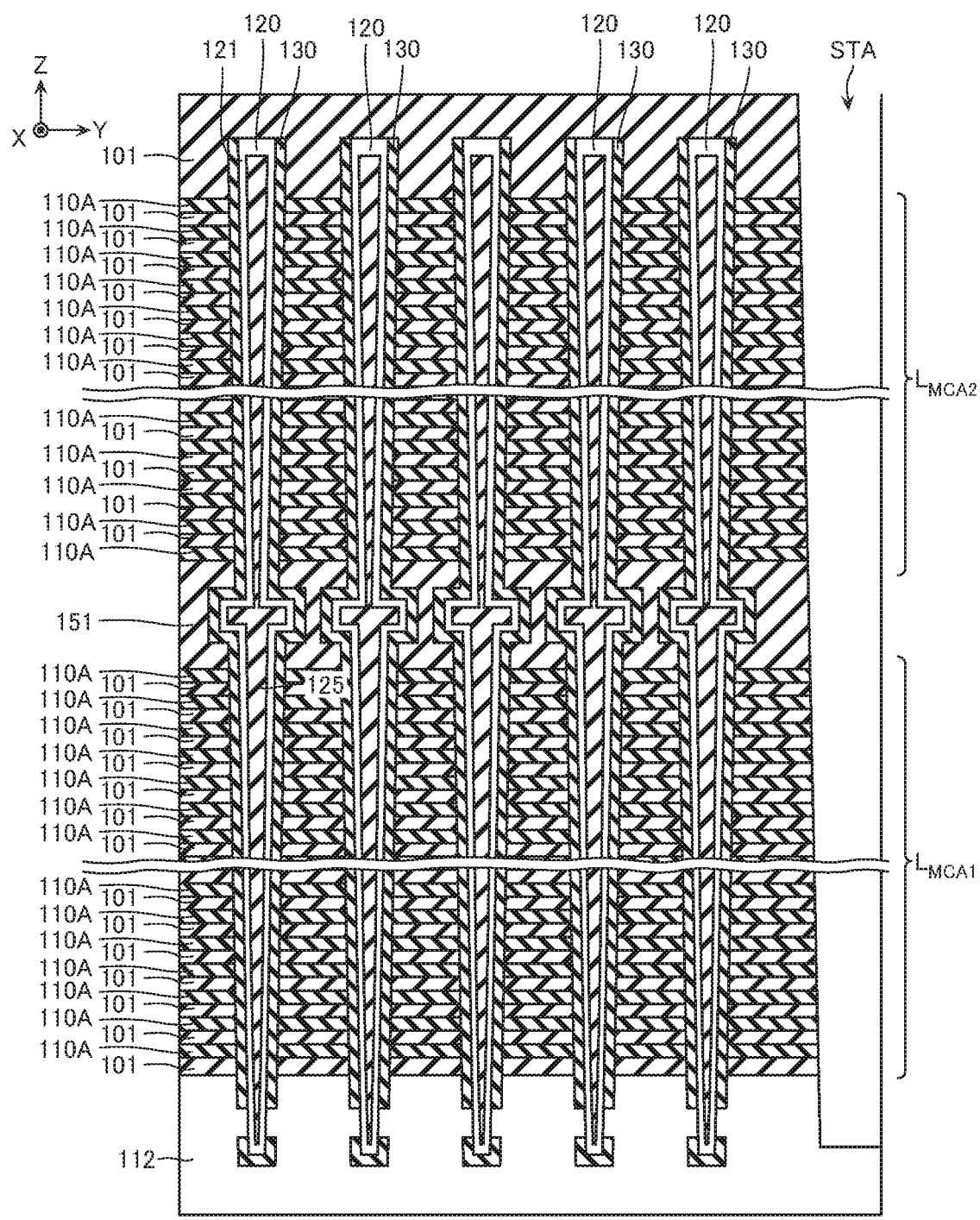
FIG. 25 is a schematic cross-sectional view illustrating the manufacturing method.

Next, for example, as illustrated in FIG. 25, the conductive layer 112 is formed. In this process, for example, by a method such as wet etching, a part of the sacrifice layer 112B and the gate insulating film 130 are removed. By a method such as epitaxial growth, the conductive layer 112 is formed. After forming the conductive layer 112, the protective films 161, 162 are removed.

Figure 26:
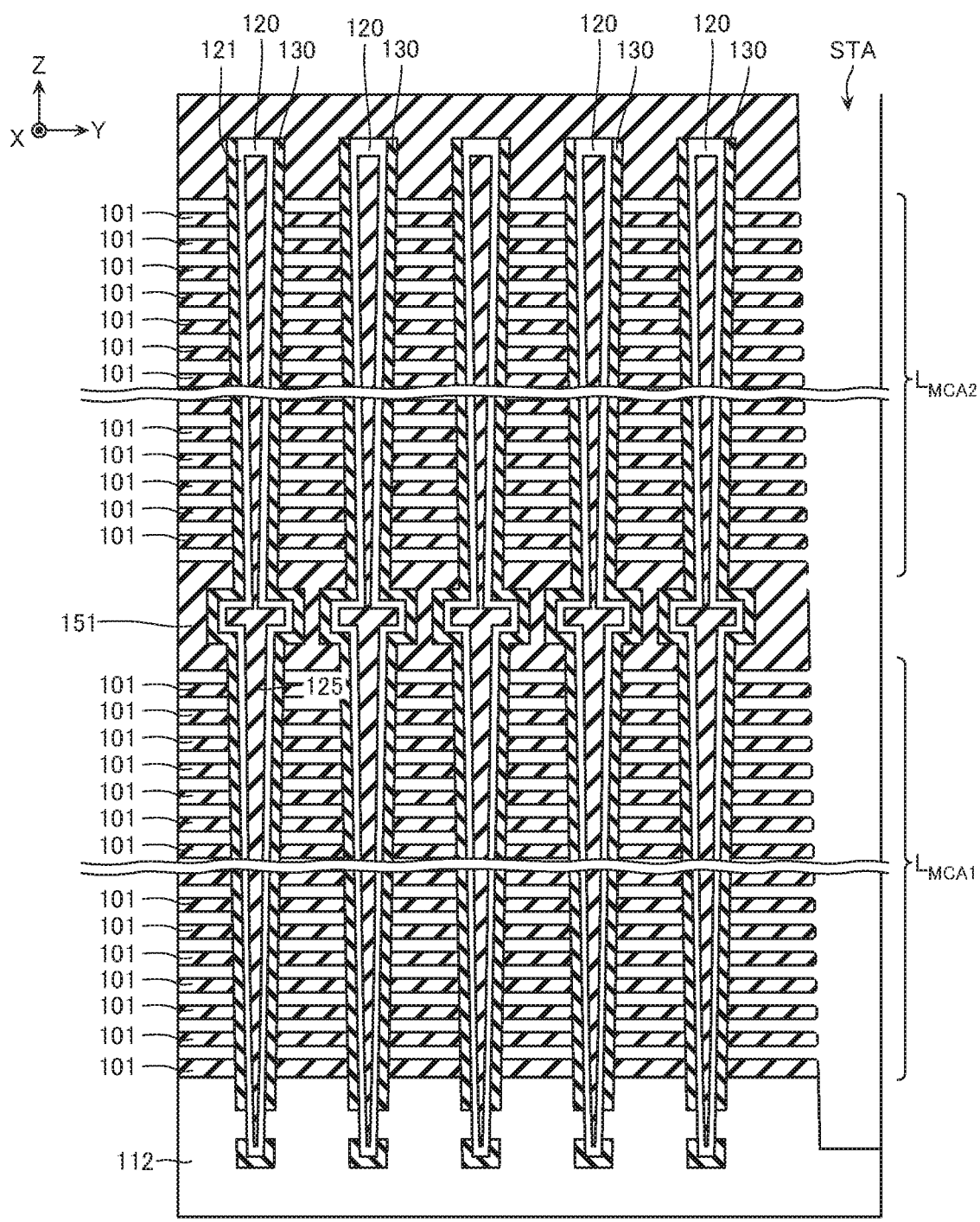
FIG. 26 is a schematic cross-sectional view illustrating the manufacturing method.

Next, for example, as illustrated in FIG. 26, the insulating layers 110A are removed. As a result, a hollow structure that includes the plurality of interlayer insulating layers 101 arranged in the Z-direction and the structure (the semiconductor layers 120, the gate insulating films 130, and the insulating layers 125) inside the memory holes $MH_L$, $MH_U$ supporting the interlayer insulating layers 101 is formed. This process is performed, for example, by a method such as wet etching. In this process, among the insulating layers 110A corresponding to the conductive layers 110b, portions having the high content rates of silicon (Si) remain on the upper surfaces and the lower surfaces of the interlayer insulating layers 101.

Figure 27:
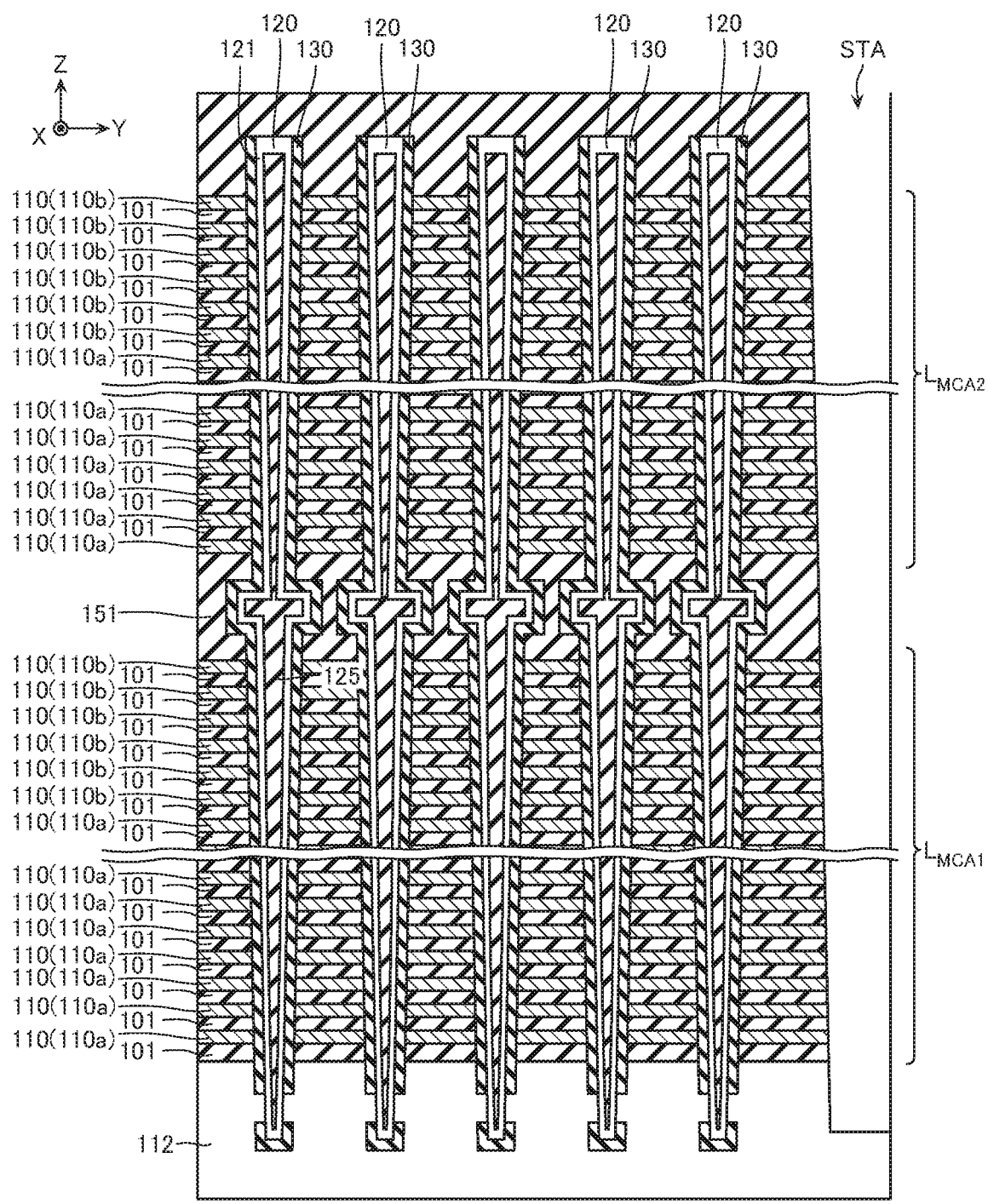
FIG. 27 is a schematic cross-sectional view illustrating the manufacturing method.

Next, as illustrated in FIG. 27, the conductive layers 110 are formed. This process is performed, for example, by a method such as CVD using a metal halide such as tungsten hexafluoride ($WF_6$), tungsten hexachloride ($WCl_6$), tungsten hexabromide ($WBr_6$), molybdenum hexafluoride ($MoF_6$), molybdenum hexachloride ($MoCl_6$), or molybdenum hexabromide ($MoBr_6$). For example, when tungsten hexafluoride ($WF_6$) is used, between tungsten hexafluoride ($WF_6$) and silicon (Si) in the insulating layer 110A remaining on the upper surface and the lower surface of the interlayer insulating layer 101, a chemical reaction of $2WF_6$ (gas)+$3Si$ (solid)→$2W$ (solid)+$3SiF_4$ (gas) occurs. Accordingly, tungsten (W) is formed as a solid on the upper surface and the lower surface of the interlayer insulating layer 101, and silicon (Si) and fluorine (F) are discharged as gas.

In such a method, even after forming the conductive layer 110, silicon (Si) in the insulating layer 110A corresponding to the conductive layer 110b remains in the conductive layer 110b in some cases. As a result, for example, as described with reference to FIG. 6, the content rates of silicon (Si) in the region $R_{WLbL}$ near the lower surface and the region $R_{WLbU}$ near the upper surface of the conductive layer 110b are higher than the content rates of silicon (Si) in other regions of the conductive layer 110b, in some cases.

Next, the inter-block insulating layer ST is formed inside the trench STA. This process is performed by a method, such as CVD and RIE. As a result, the structure described with reference to FIG. 2 is formed.

Effect

In the process described with reference to FIG. 10, the memory hole $MH_L$ is formed. In the process described with reference to FIG. 17, the memory hole $MH_U$ is formed. Here, inner diameters of the memory holes $MH_L$, $MH_U$ vary corresponding to the height positions in some cases. For example, the lower the portions of the memory holes $MH_L$, $MH_U$ are positioned, the smaller the inner diameters of the portions become, and the higher the portions are positioned, the larger the inner diameters of the portions become in some cases. In such a case, in the memory cell array layers $L_{MCA1}$, $L_{MCA2}$, the lower the conductive layer 110 is disposed, the smaller the diameter of an opposed surface thereof opposed to the semiconductor layer 120 becomes. In the memory cell array layers $L_{MCA1}$, $L_{MCA2}$, the higher the conductive layer 110 is disposed, the larger the diameter of the opposed surface thereof opposed to the semiconductor layer 120 becomes.

Figure 28:
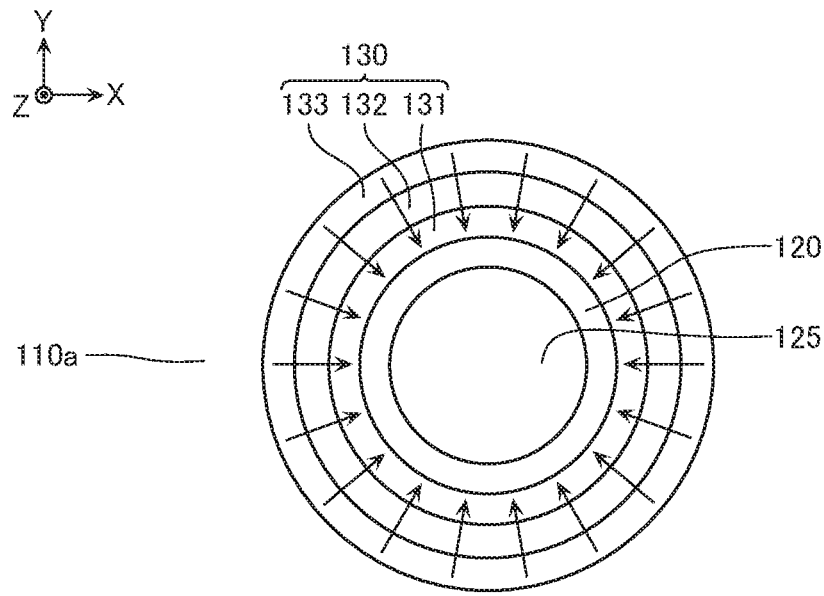
FIG. 28 is a schematic plan view for describing the semiconductor memory device according to the first embodiment.
Figure 29:
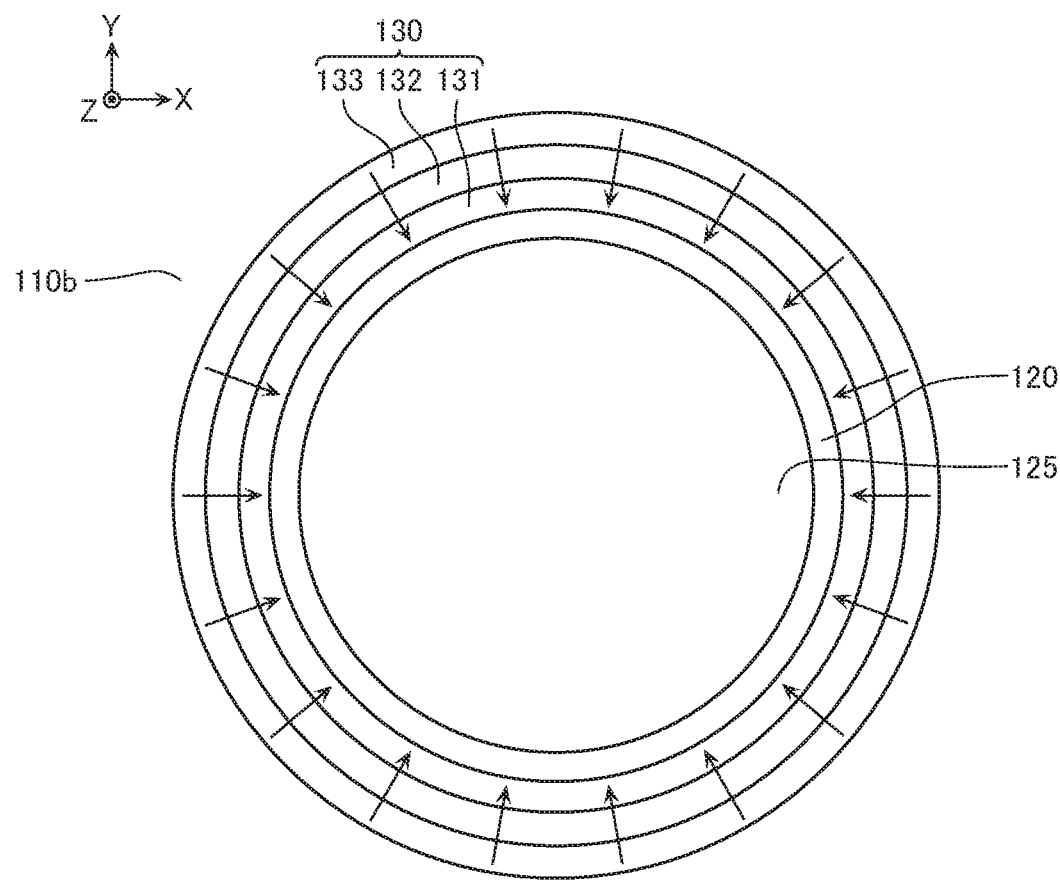
FIG. 29 is a schematic plan view for describing the semiconductor memory device.

In such a case, as illustrated in FIG. 28, regarding the conductive layer 110 disposed on the lower side, an electric flux density relatively increases, and an electric field applied to the semiconductor layer 120 is likely to relatively increase. On the other hand, as illustrated in FIG. 29, regarding the conductive layer 110 disposed on the upper side, the electric flux density relatively decreases, and an electric field applied to the semiconductor layer 120 is likely to relatively decrease. From this reason, variation is generated in characteristics of the memory cell in some cases.

Figure 30:
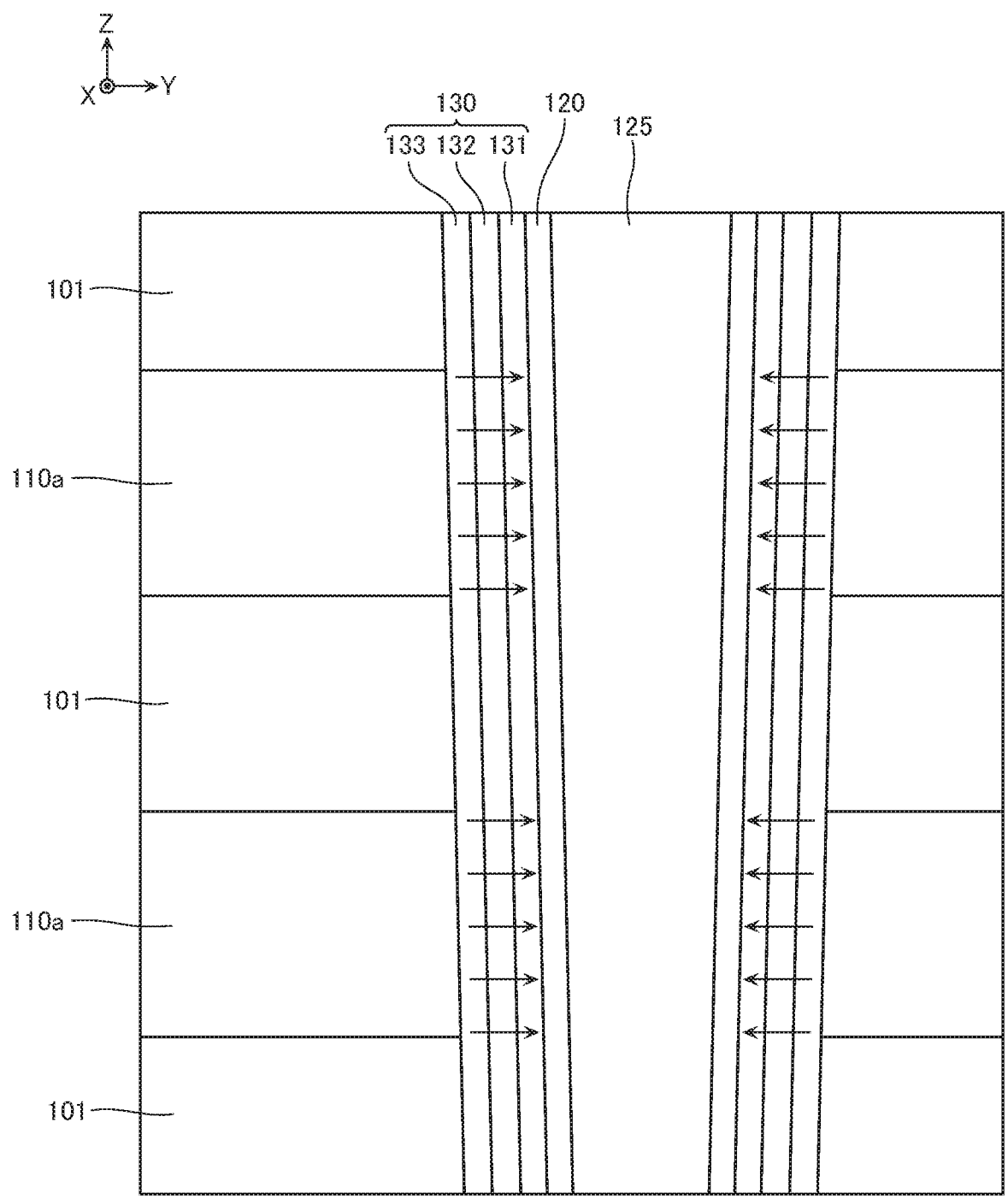
FIG. 30 is a schematic cross-sectional view for describing the semiconductor memory device.
Figure 31:
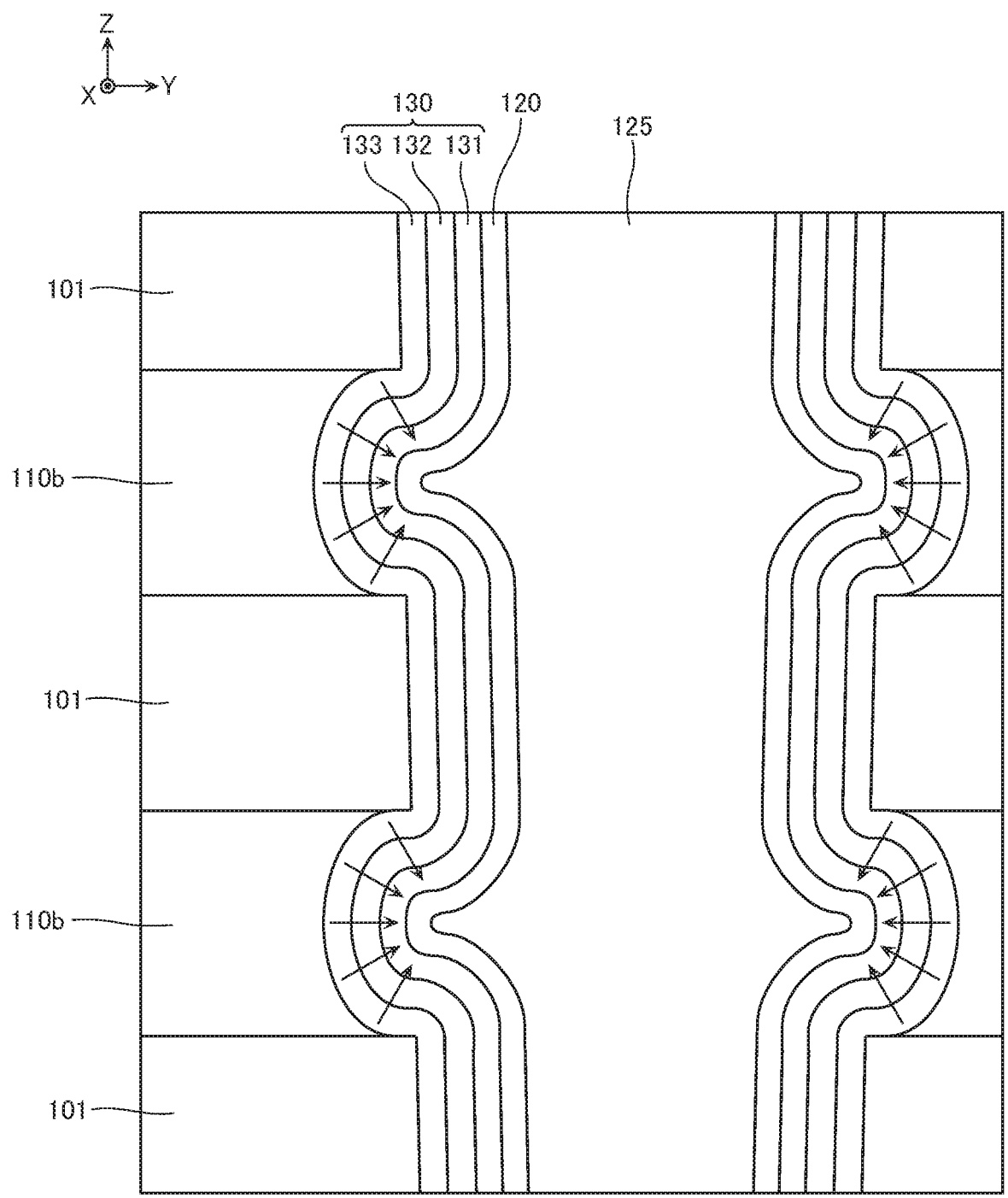
FIG. 31 is a schematic cross-sectional view for describing the semiconductor memory device.

Here, as illustrated in FIG. 3, in the semiconductor memory device according to the first embodiment, the conductive layer 110a has the surface on the semiconductor layer 120 side formed into an approximately straight line. As illustrated in FIG. 4, the conductive layer 110b has the surface on the semiconductor layer 120 side formed into an approximately recessed shape. With such a configuration, as illustrated in FIG. 30 and FIG. 31, it is possible to increase the electric flux density between the conductive layer 110b and the semiconductor layer 120 and reduce the variation of the characteristics as described above.

In the semiconductor memory device according to the first embodiment, as described with reference to FIG. 8 and FIG. 9, in forming the insulating layers 110A corresponding to the conductive layers 110b, the ratio of silicon to nitrogen is adjusted such that the content rate of silicon (Si) becomes minimum at the center position in the Z-direction of the insulating layer 110A, and the content rate of silicon (Si) becomes maximum on the upper surface and the lower surface of the insulating layer 110A. With such a method, in the processes described with reference to FIG. 12 and FIG. 13, it is possible to form a curved surface having a desired shape on the insulating layer 110A.

In the manufacturing method of the semiconductor memory device according to the first embodiment, the conductive layers 110 are formed in the process corresponding to FIG. 27. This process is performed by a method such as CVD using the metal halide such as tungsten hexafluoride ($WF_6$). When the conductive layer 110 is formed by such a method, fluorine (F) remains in the conductive layer 110 in some cases.

Here, fluorine (F) in the conductive layer 110 is diffused in another composition in a subsequent thermal process and removes an insulating film, for example, silicon oxide ($SiO_2$), in some cases. As a result, a leakage current is generated between the semiconductor layer 120 and the conductive layers 110, between two of the conductive layers 110 adjacent to one another in the Z-direction, and the like.

According to the embodiment, as described above, it is possible to preferably discharge fluorine (F) or the like in the process corresponding to FIG. 27 and reduce the generation of the above-described leakage current.

Second Embodiment

[Configuration]

Figure 32:
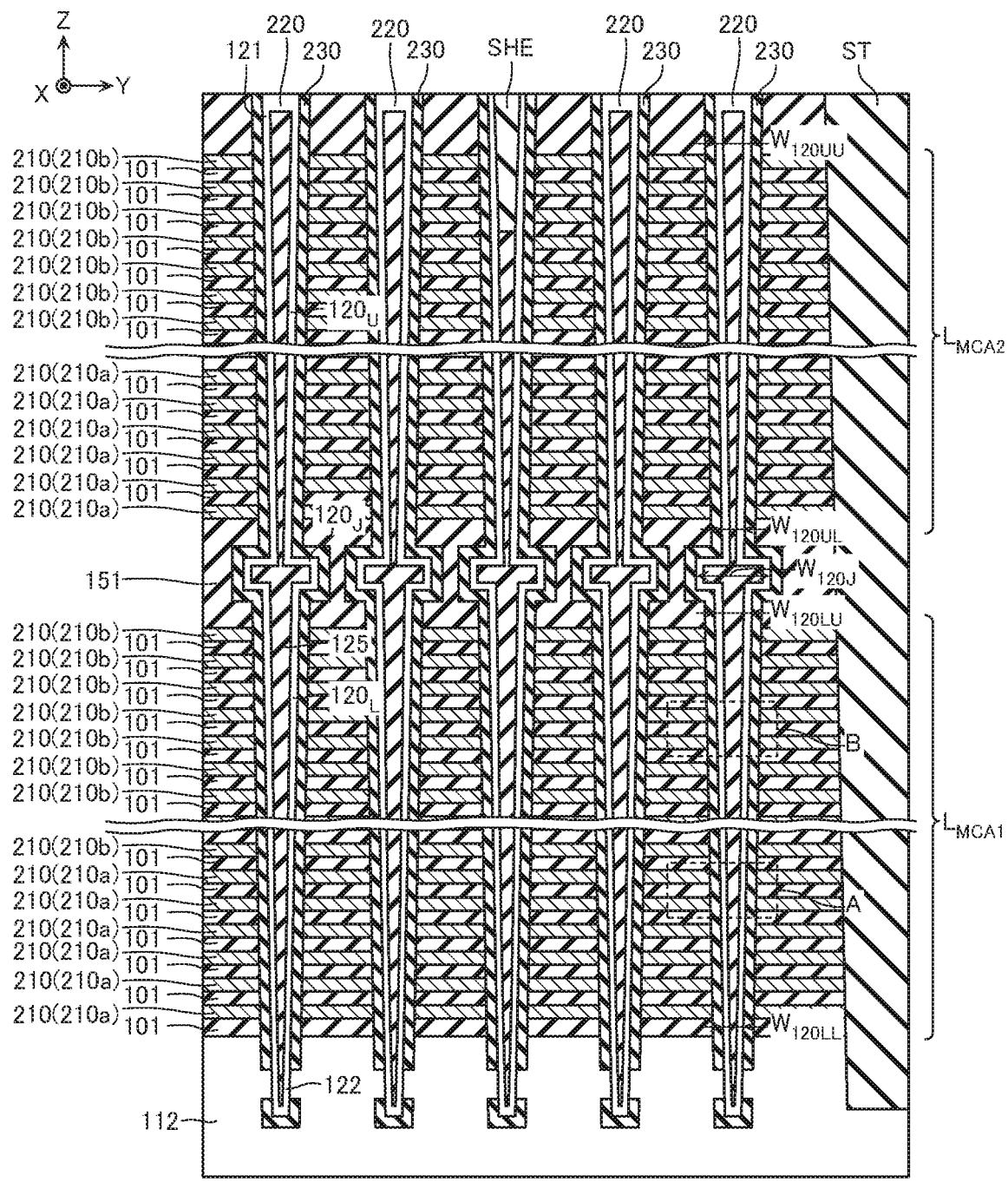
FIG. 32 is a schematic cross-sectional view illustrating a configuration of a part of a semiconductor memory device according to a second embodiment.
Figure 33:
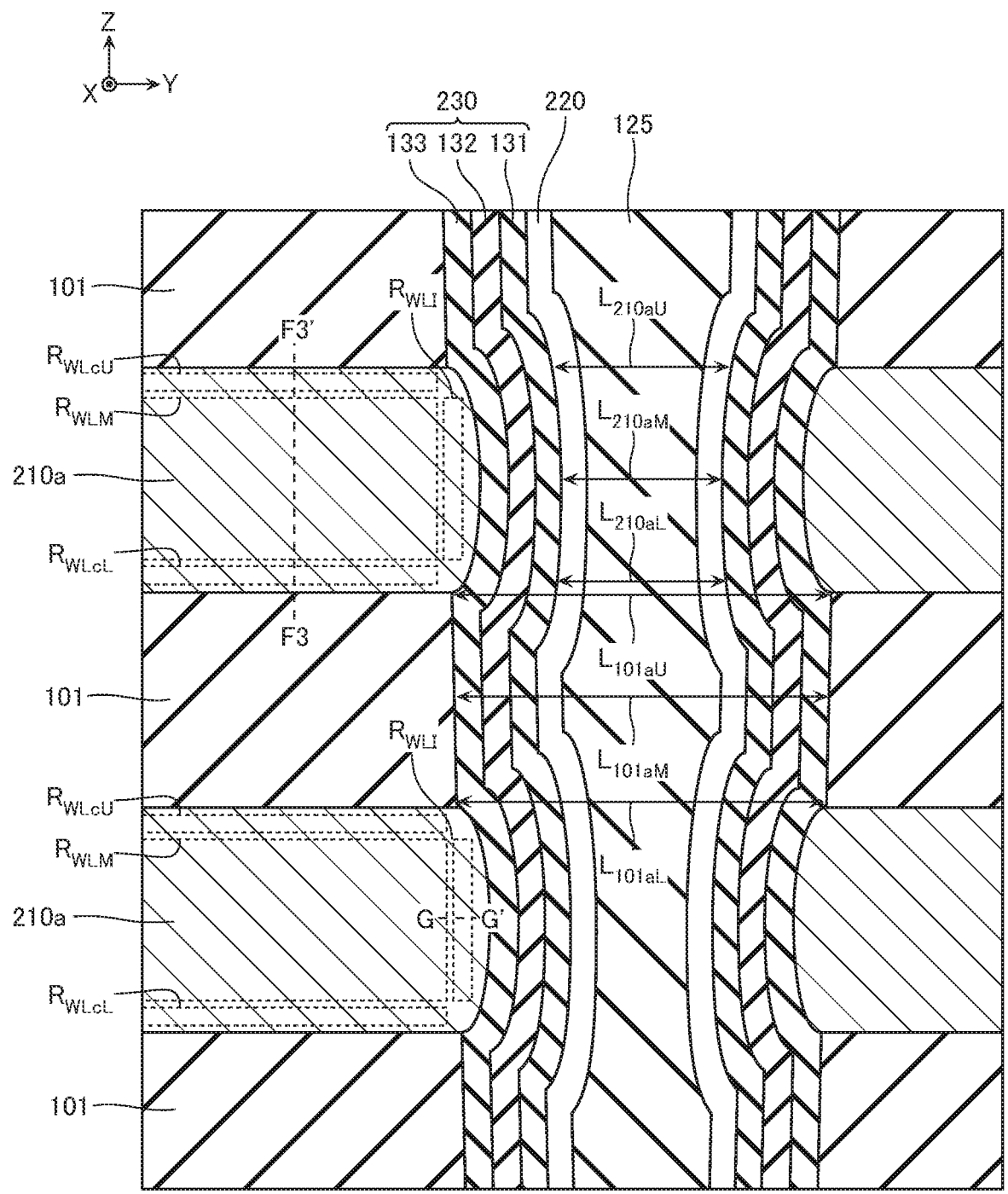
FIG. 33 is a schematic cross-sectional view illustrating an enlarged part indicated by A in FIG. 32.
Figure 34:
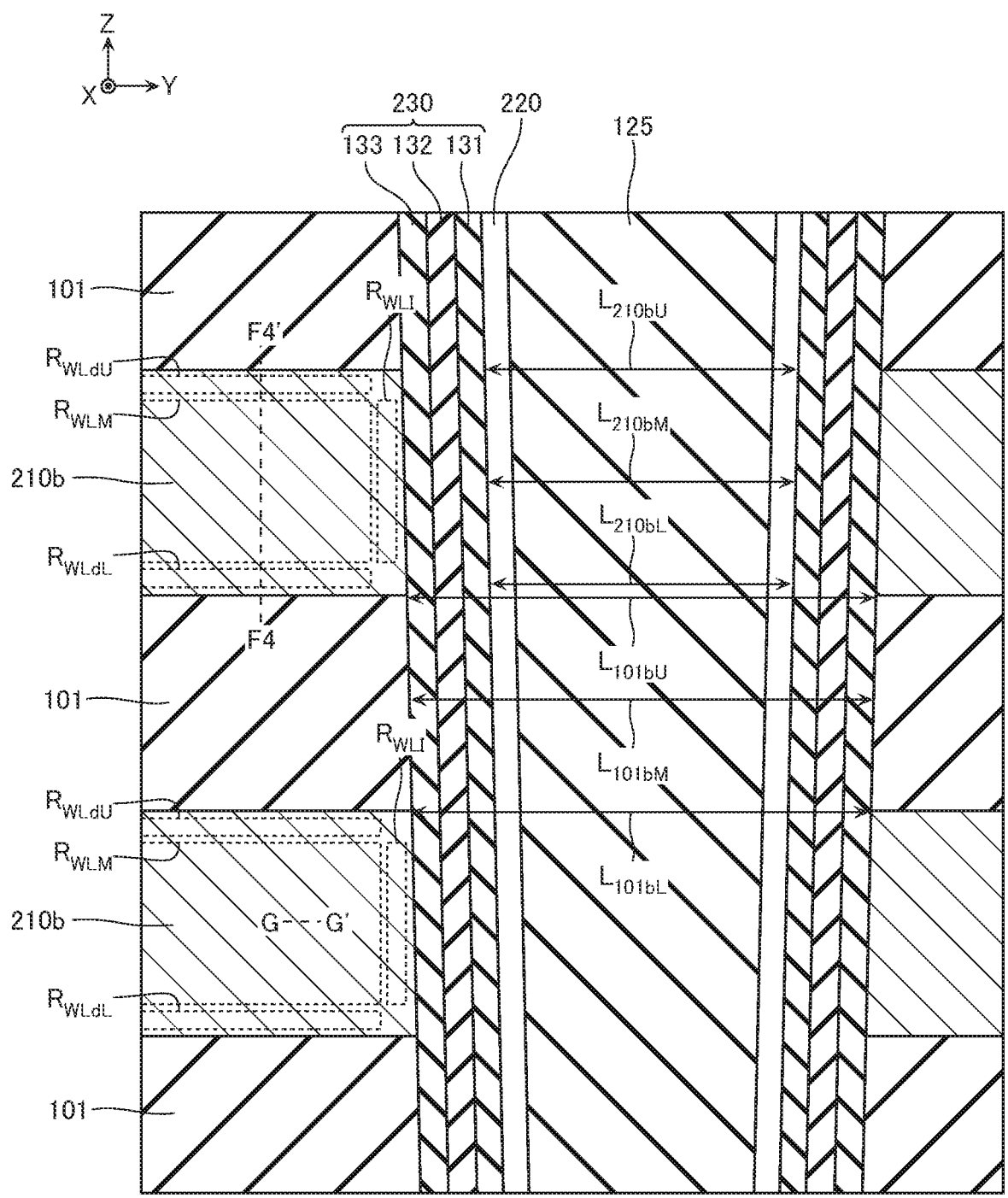
FIG. 34 is a schematic cross-sectional view illustrating an enlarged part indicated by B in FIG. 32.

FIG. 32 is a schematic cross-sectional view illustrating a configuration of a part of a semiconductor memory device according to the second embodiment. FIG. 33 is a schematic cross-sectional view illustrating an enlarged portion indicated by A in FIG. 32. FIG. 34 is a schematic cross-sectional view illustrating an enlarged portion indicated by B in FIG. 32. While FIG. 33 and FIG. 34 illustrate YZ cross-sectional surfaces, when cross-sectional surfaces other than the YZ cross-sectional surfaces along the center axis of the semiconductor layer 220 (for example, an XZ cross-sectional surface) are observed, structures similar to those of FIG. 33 and FIG. 34 are also observed.

The semiconductor memory device according to the second embodiment is basically constituted similarly to the semiconductor memory device according to the first embodiment. However, the semiconductor memory device according to the second embodiment includes conductive layers 210, semiconductor layers 220, and gate insulating films 230 instead of the conductive layers 110, the semiconductor layers 120, and the gate insulating films 130. The conductive layers 210, the semiconductor layers 220, and the gate insulating films 230 are basically constituted similarly to the conductive layers 110, the semiconductor layers 120, and the gate insulating films 130.

In FIG. 32, a part of the conductive layers 210 are indicated as conductive layers 210a. Another part of the conductive layers 210 are indicated as conductive layers 210b. The memory cell array layers $L_{MCA1}$, $L_{MCA2}$ each include a plurality of conductive layers 210a and a plurality of conductive layers 210b. In the memory cell array layers $L_{MCA1}$, $L_{MCA2}$, the plurality of conductive layers 210b are disposed above the plurality of conductive layers 210a.

Here, in the YZ cross-sectional surface illustrated in FIG. 33, the plurality of interlayer insulating layers 101 stacked in the Z-direction have surfaces on a semiconductor layer 220 side formed into an approximately straight line. The block insulating film 133, the electric charge storage film 132, the tunnel insulating film 131, and the semiconductor layer 220 are formed into an approximately straight line along these surfaces.

On the other hand, the plurality of conductive layers 210a stacked in the Z-direction have surfaces on the semiconductor layer 220 side formed into an approximately protruding shape. That is, these surfaces are formed along curved lines that are each protruding in a direction approaching the center axis of the semiconductor layer 220. The block insulating film 133, the electric charge storage film 132, the tunnel insulating film 131, and the semiconductor layer 220 are formed along these surfaces.

In FIG. 33, a length in the Y-direction of the semiconductor layer 220 at a height position of an upper surface of the conductive layer 210a is illustrated as a length $L_{210aU}$. A length in the Y-direction of the semiconductor layer 220 at a height position of a lower surface of the conductive layer 210a is illustrated as a length $L_{210aL}$. A length in the Y-direction of the semiconductor layer 220 at an intermediate position of these height positions is illustrated as a length $L_{210aM}$. The length $L_{210aM}$ is smaller than the lengths $L_{210aU}$, $L_{210aL}$. A difference between the length $L_{210aM}$ and the length $L_{210aU}$, and a difference between the length $L_{210aM}$ and the length $L_{210aL}$ are larger than the difference between the length $L_{101aM}$ and the length $L_{101aU}$, and the difference between the length $L_{101aM}$ and the length $L_{101aL}$.

In a YZ cross-sectional surface indicated in FIG. 34, the plurality of conductive layers 210b and the plurality of interlayer insulating layers 101 stacked in alternation in the Z-direction have surfaces on the semiconductor layer 220 side formed into an approximately straight line. The block insulating film 133, the electric charge storage film 132, the tunnel insulating film 131, and the semiconductor layer 220 are formed into an approximately straight line along these surfaces.

In FIG. 34, a length in the Y-direction of the semiconductor layer 220 at a height position of an upper surface of the conductive layer 210b is illustrated as a length $L_{210bU}$. A length in the Y-direction of the semiconductor layer 220 at a height position of a lower surface of the conductive layer 210b is illustrated as a length $L_{210bL}$. A length in the Y-direction of the semiconductor layer 220 at an intermediate position of these height positions is illustrated as a length $L_{210bM}$. The length $L_{210bU}$ may be larger than the length $L_{210bM}$. The length $L_{210bM}$ may be larger than the length $L_{210bL}$. The lengths $L_{210bU}$, $L_{210bL}$, $L_{210bM}$ may be approximately the same. The difference between the length $L_{210aM}$ and the length $L_{210aU}$, and the difference between the length $L_{210aM}$ and the length $L_{210aL}$, which have been described with reference to FIG. 33, are larger than a difference between the length $L_{210bM}$ and the length $L_{210bU}$, a difference between the length $L_{210bM}$ and the length $L_{210bL}$, the difference between the length $L_{101bM}$ and the length $L_{101bU}$, and the difference between the length $L_{101bM}$ and the length $L_{101bL}$.

Figure 35:
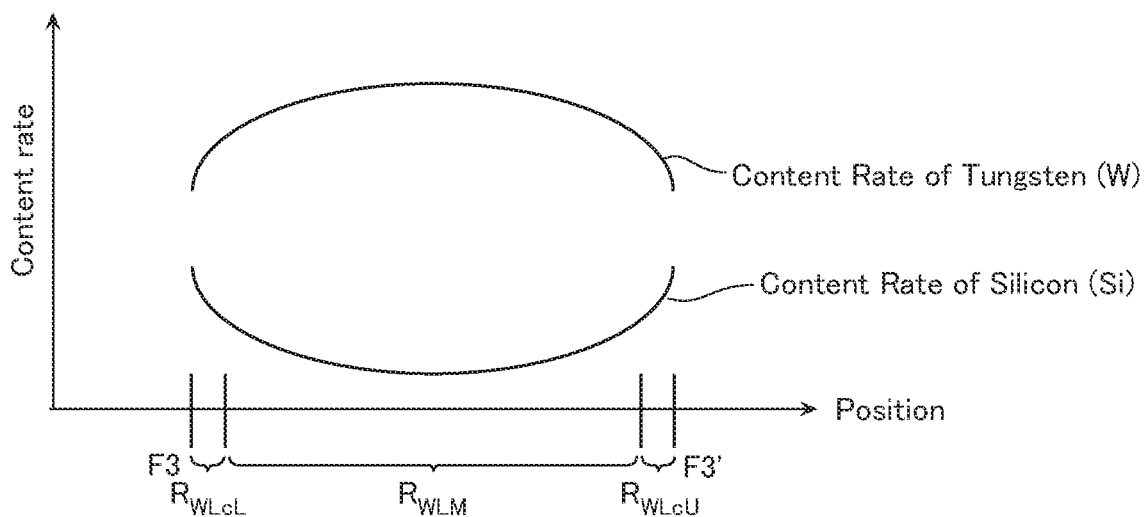
FIG. 35 is a schematic graph for describing a material of a conductive layer 210.
Figure 36:
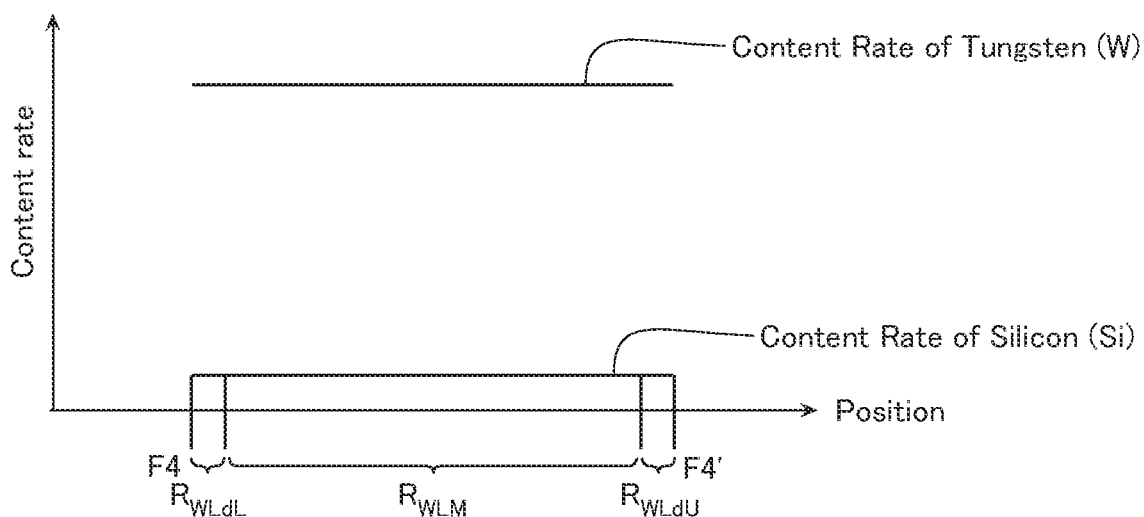
FIG. 36 is a schematic graph for describing the material of the conductive layer 210.

FIG. 35 and FIG. 36 are schematic graphs for describing the material of the conductive layer 210. FIG. 35 indicates content rates of components contained in the portion along a line F3-F3' of the structure indicated in FIG. 33. FIG. 36 indicates the content rates of components contained in the portion along a line F4-F4' of the structure indicated in FIG. 34.

As illustrated in FIG. 35, the conductive layer 210a contains metal such as tungsten (W) or molybdenum (Mo) and silicon (Si). As illustrated in FIG. 35, in the conductive layer 210a, at the proximity of a center position in the Z-direction, the content rate of metal such as tungsten (W) becomes maximum, and the content rate of silicon (Si) becomes minimum. The content rate of metal such as tungsten (W) in the conductive layer 210a becomes smaller toward the upper surface or the lower surface of the conductive layer 210a. The content rate of silicon (Si) becomes larger toward the upper surface or the lower surface of the conductive layer 210a.

As illustrated in FIG. 36, the conductive layer 210b contains metal such as tungsten (W) or molybdenum (Mo). The conductive layer 210b may contain silicon (Si) or need not contain silicon (Si).

In FIG. 33, a region near a center in a YZ cross-sectional surface of the conductive layer 210a is indicated as the region $R_{WLM}$. A region near the gate insulating film 230 of the conductive layer 210a is indicated as the region $R_{WLI}$. A region near the lower surface of the conductive layer 210a is indicated as a region $R_{WLcL}$. A region near the upper surface of the conductive layer 210a is indicated as a region $R_{WLcU}$.

In FIG. 34, a region near a center in a YZ cross-sectional surface of the conductive layer 210b is indicated as the region $R_{WLM}$. A region near the gate insulating film 230 of the conductive layer 210b is indicated as the region $R_{WLI}$. A region near the lower surface of the conductive layer 210b is indicated as a region $R_{WLdL}$. A region near the upper surface of the conductive layer 210b is indicated as a region $R_{wLdU}$.

As illustrated in FIG. 35 and FIG. 36, in the second embodiment, the content rates of silicon (Si) in the regions $R_{WLcL}$, $R_{WLcU}$ are higher than the content rates of silicon (Si) in the regions $R_{WLM}$, $R_{WLI}$, $R_{WLdL}$, $R_{WLdU}$.

A boundary between the region $R_{WLbL}$ and the region $R_{WLM}$ may be specified by, for example, a method similar to that for the boundary between the region $R_{WLbL}$ and the region $R_{WLM}$. Similarly, a boundary between the region $R_{WLcU}$ and the region $R_{WLM}$ may be specified by, for example, a method similar to that for the boundary between the region $R_{WLbL}$ and the region $R_{WLM}$ as described above.

In such a case, a boundary between the region $R_{WLM}$ and the region $R_{WLdL}$ and a boundary between the region $R_{WLM}$ and the region $R_{WLdU}$ may be specified by, for example, a method similar to that for the boundary between the region $R_{WLM}$ and the region $R_{WLI}$, the boundary between the region $R_{WLM}$ and the region $R_{WLaL}$, and the boundary between the region $R_{WLM}$ and the region $R_{WLaU}$.

[Manufacturing Method]

Figure 37:
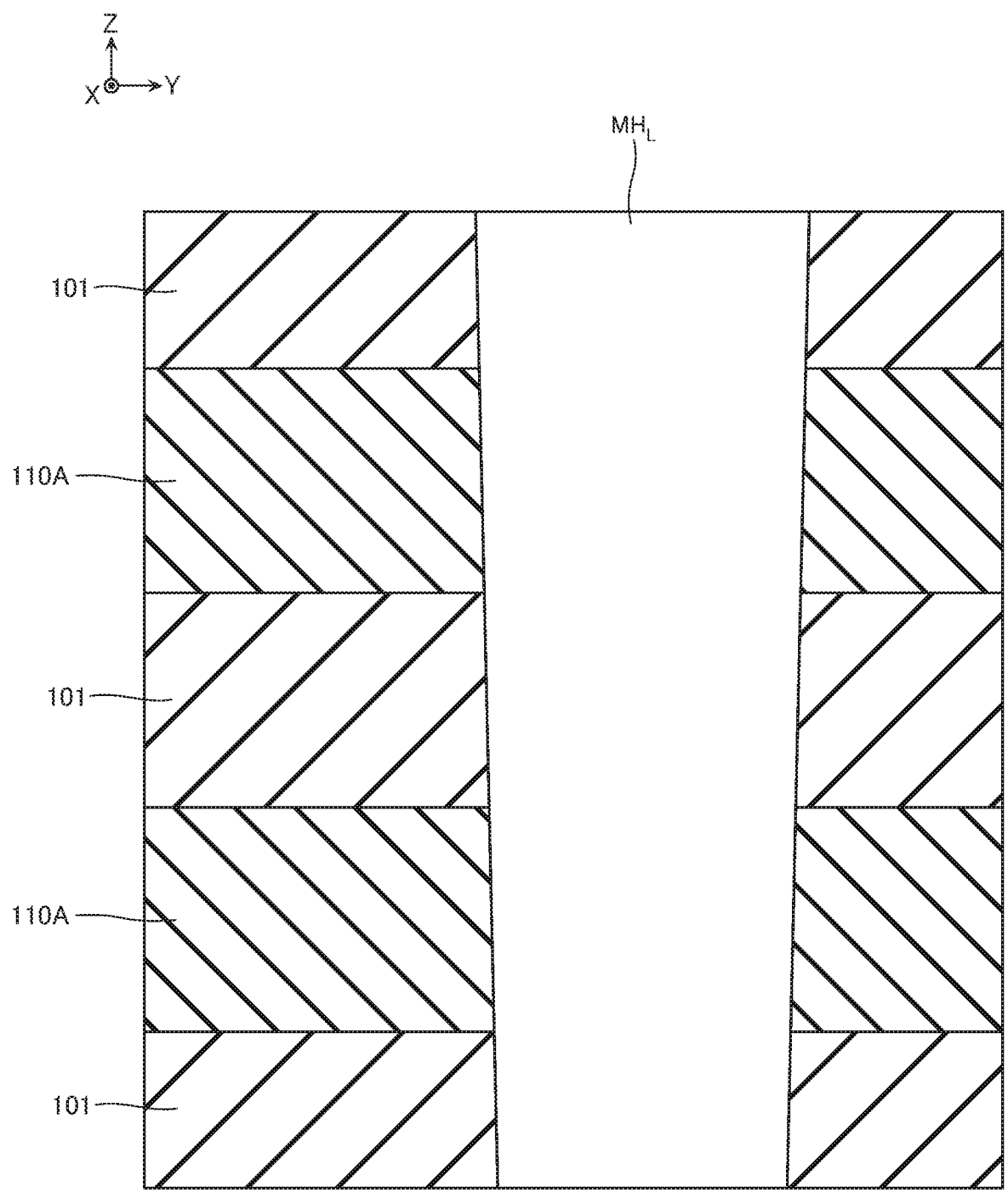
FIG. 37 is a schematic cross-sectional view illustrating a manufacturing method of the semiconductor memory device according to the second embodiment.
Figure 38:
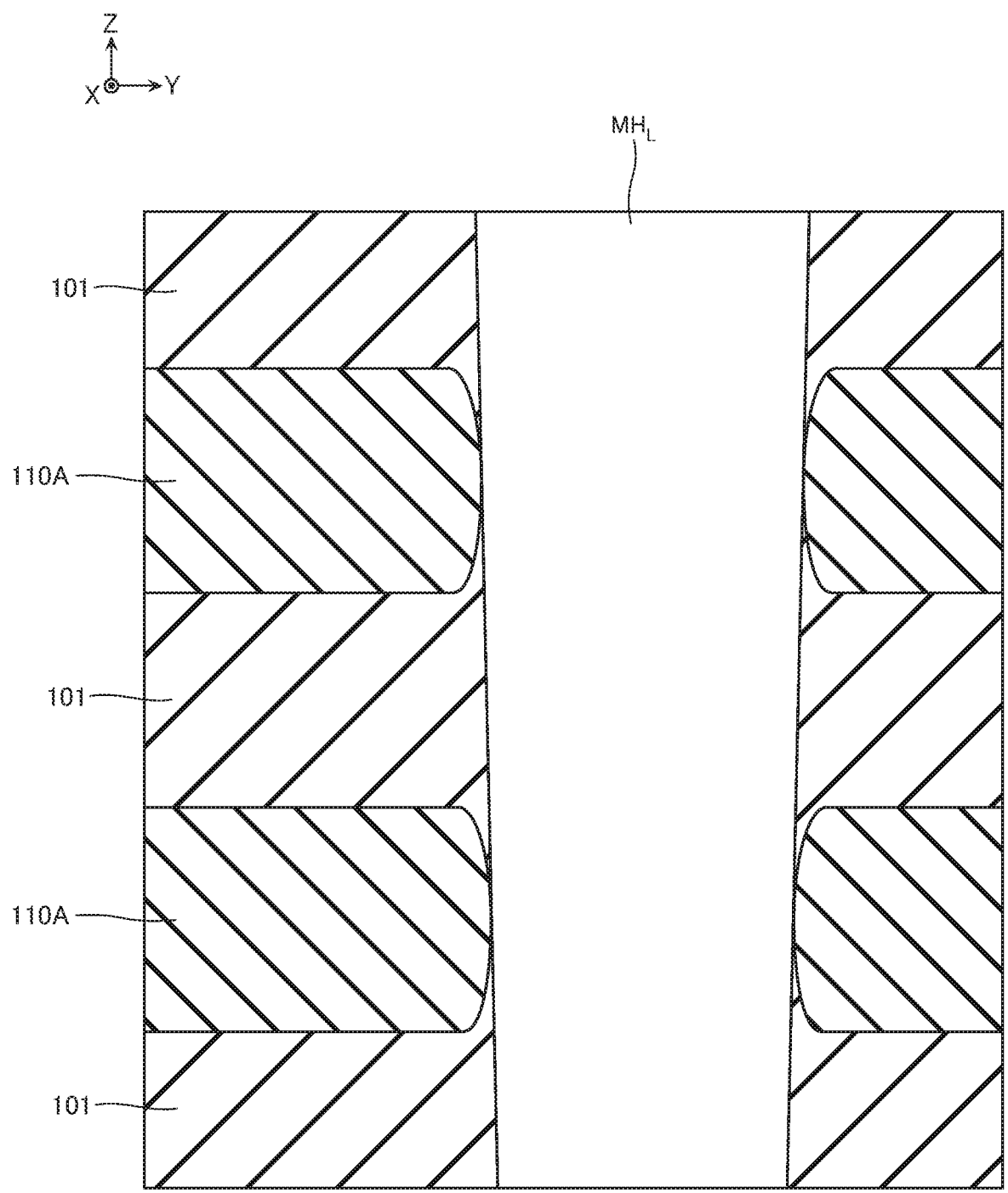
FIG. 38 is a schematic cross-sectional view illustrating the manufacturing method.
Figure 39:
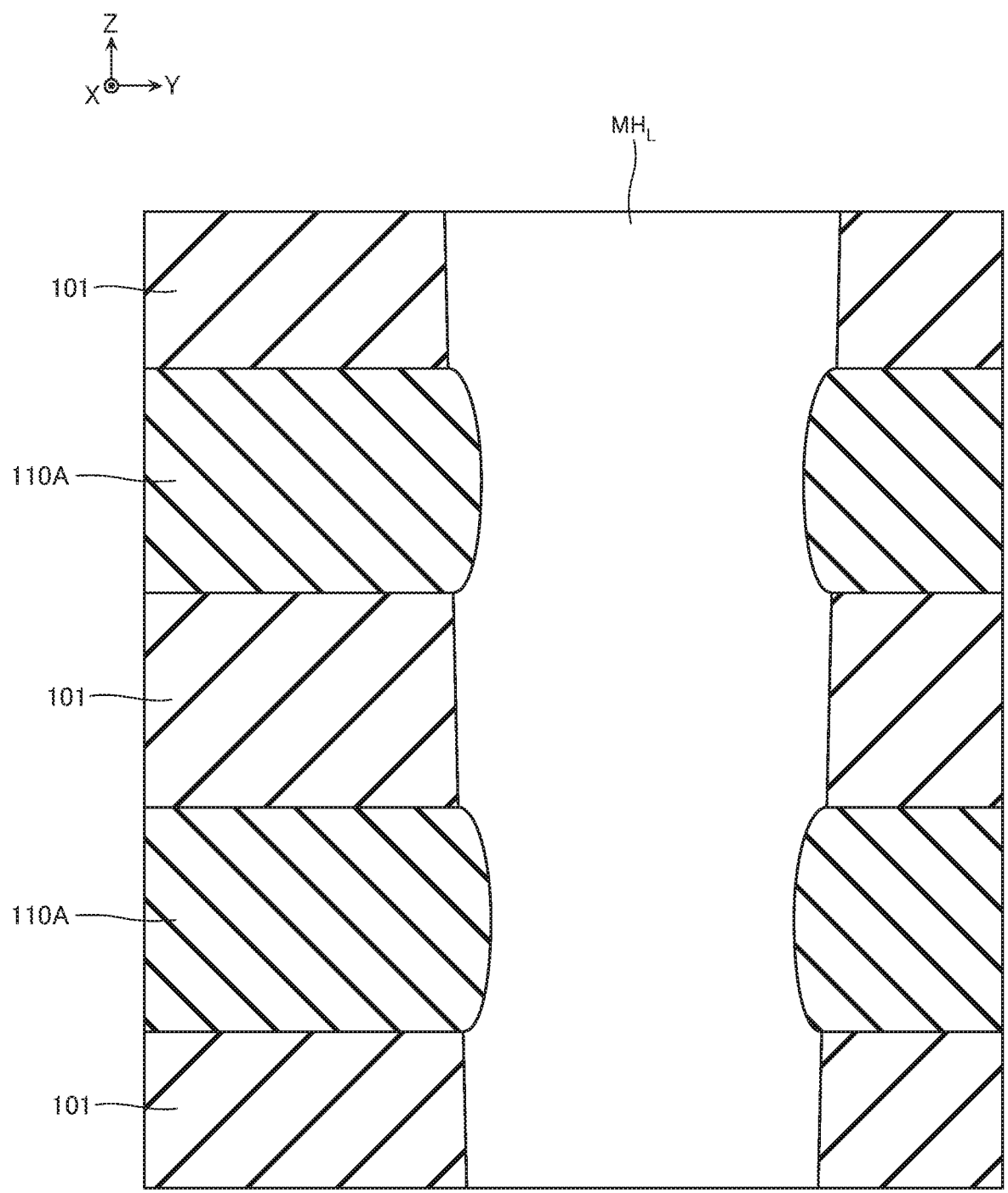
FIG. 39 is a schematic cross-sectional view illustrating the manufacturing method.

Next, the manufacturing method of the semiconductor memory device according to the embodiment is described with reference to FIG. 37 to FIG. 39. FIG. 37 to FIG. 39 are schematic cross-sectional views illustrating the manufacturing method of the semiconductor memory device according to the embodiment. FIG. 37 to FIG. 39 indicate cross-sectional surfaces corresponding to FIG. 33.

In manufacturing the semiconductor memory device according to the embodiment, for example, the process described with reference to FIG. 8 is performed. However, in this process, in forming the insulating layers 110A corresponding to the conductive layers 210a, the ratio of silicon (Si) to nitrogen (N) is adjusted. For example, as described with reference to FIG. 9, at the center position in the Z-direction of the insulating layer 110A, the ratio of silicon to nitrogen is adjusted such that the content rate of silicon becomes minimum, and the content rate of nitrogen becomes maximum. On the upper surface and the lower surface of the insulating layer 110A, the ratio is adjusted such that the content rate of silicon becomes maximum, and the content rate of nitrogen becomes minimum.

Next, the processes described with reference to FIG. 10, FIG. 14, and FIG. 15 are performed.

Next, the process described with reference to FIG. 16 is performed. Also in this process, in forming the insulating layers 110A corresponding to the conductive layers 210a, the ratio of silicon (Si) to nitrogen (N) is adjusted.

Next, the processes described with reference to FIG. 17 and FIG. 19 are performed.

Next, as illustrated in FIG. 37 and FIG. 38, an oxidation process is performed to oxidize a part of the insulating layers 110A. This process is performed under conditions where silicon (Si) is relatively easily oxidized, and silicon nitride (SiN) is relatively less likely to be oxidized. As illustrated in FIG. 38, in this process, oxidation of the regions near the upper surface and near the lower surface of the insulating layer 110A corresponding to the conductive layer 210a is likely to proceed, and oxidation of the region near the intermediate position in the Z-direction of this insulating layer 110A is less likely to proceed. As a result, a surface having an approximately protruding shape as described with reference to FIG. 33 is formed on the surface on the memory hole $MH_L$ side of the insulating layer 110A.

Next, as illustrated in FIG. 39, silicon oxide ($SiO_2$) is removed and the surfaces each having the approximately protruding shape of the insulating layers 110A are exposed on the inner peripheral surface of the memory hole $MH_L$. This process is performed, for example, by a method such as wet etching.

Subsequently, by performing the processes after the processes described with reference to FIG. 20 in the manufacturing method of the semiconductor memory device according to the first embodiment, the semiconductor memory device according to the second embodiment is formed.

Effect

As described with reference to FIG. 28, since the electric flux density relatively increases in the conductive layers 110 disposed in the lower side, the electric field applied to the semiconductor layer 120 is likely to relatively increase. On the other hand, as described with reference to FIG. 29, since the electric flux density relatively decreases in the conductive layers 110 disposed in the upper side, the electric field applied to the semiconductor layer 120 is likely to relatively decrease. From this reason, variation is generated in characteristics of the memory cell in some cases.

Here, as described with reference to FIG. 4, in the semiconductor memory device according to the first embodiment, the conductive layer 110b has a surface on the semiconductor layer 120 side formed into an approximately recessed shape. As a result, as described with reference to FIG. 31, the electric flux density between the conductive layer 110b and the semiconductor layer 120 is increased, and the variation of the characteristics as described above is reduced.

Figure 40:
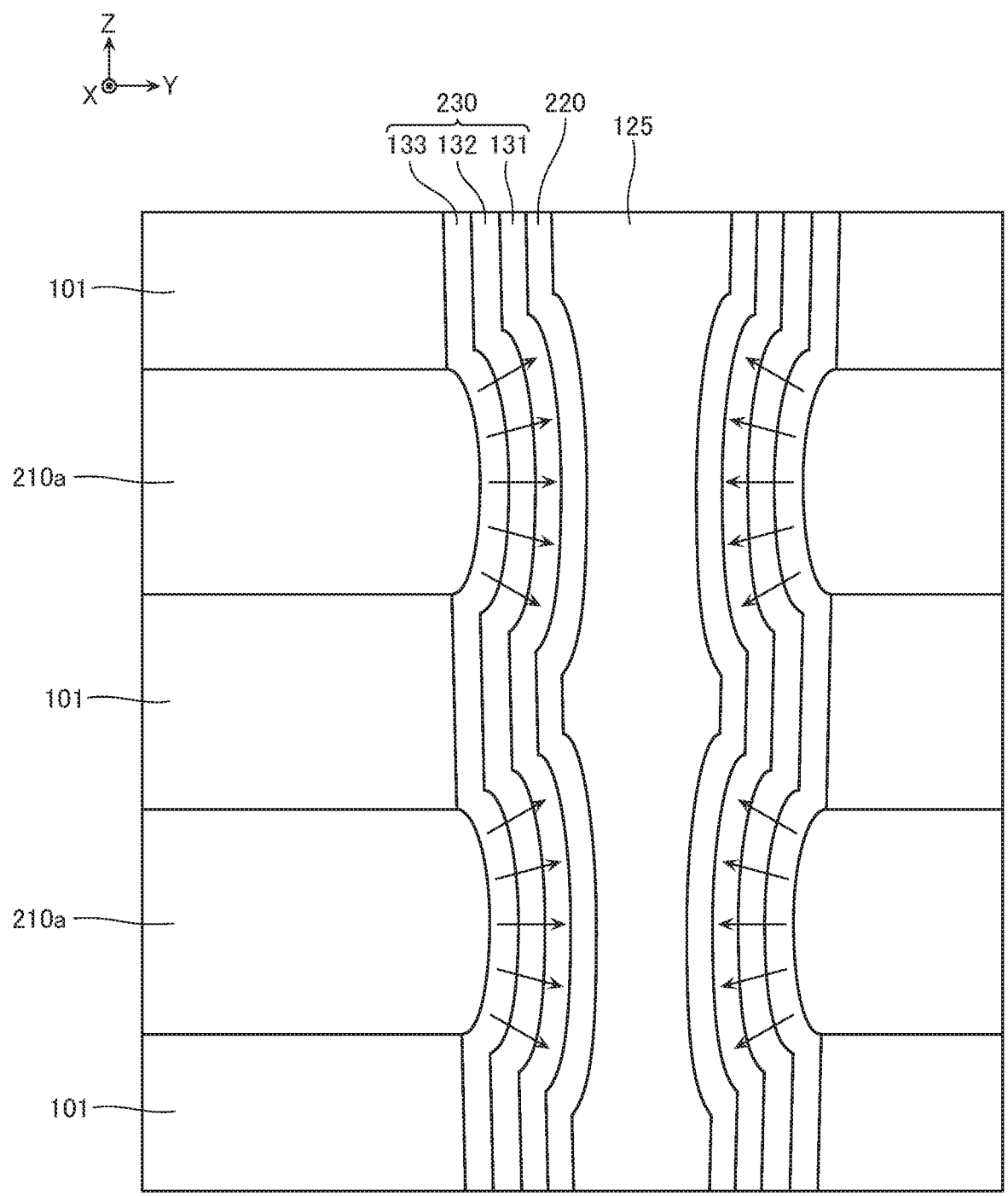
FIG. 40 is a schematic cross-sectional view for describing the semiconductor memory device according to the second embodiment.

On the other hand, as described with reference to FIG. 33, in the semiconductor memory device according to the second embodiment, the conductive layer 210a has a surface on the semiconductor layer 220 side formed into an approximately protruding shape. As a result, as illustrated in FIG. 40, the electric flux density between the conductive layer 210a and the semiconductor layer 220 is decreased, and the variation of the characteristics as described above is reduced.

In the semiconductor memory device according to the second embodiment, in forming the insulating layers 110A corresponding to the conductive layers 210a, the ratio of silicon (Si) to nitrogen is adjusted such that the content rate of silicon (Si) becomes minimum at the center position in the Z-direction of the insulating layer 110A, and the content rate of silicon (Si) becomes maximum on the upper surface and the lower surface of the insulating layer 110A. With such a method, in the processes described with reference to FIG. 37 and FIG. 38, it is possible to form a curved surface having a desired shape on the insulating layer 110A.

Also in the second embodiment, as described above, it is possible to preferably discharge fluorine (F) or the like in the process corresponding to FIG. 27 and reduce the generation of the above-described leakage current.

Third Embodiment

In the first embodiment, in the processes described with reference to FIG. 8 and FIG. 16, by adjusting the ratio of silicon to nitrogen in the insulating layer 110A, the surface on the semiconductor layer 120 side of the conductive layer 110b is formed in an approximately recessed shape. Here, the ratio of silicon to nitrogen can be adjusted for each layer of the plurality of insulating layers 110A. Accordingly, for example, it is possible to form gently curved surfaces having large curvatures in portions having relatively small diameters of the memory holes $MH_L$, $MH_U$ and steeply curved surfaces having small curvatures in portions having relatively large diameters of the memory holes $MH_L$, $MH_U$. Application examples of such a method are described below.

Figure 41:
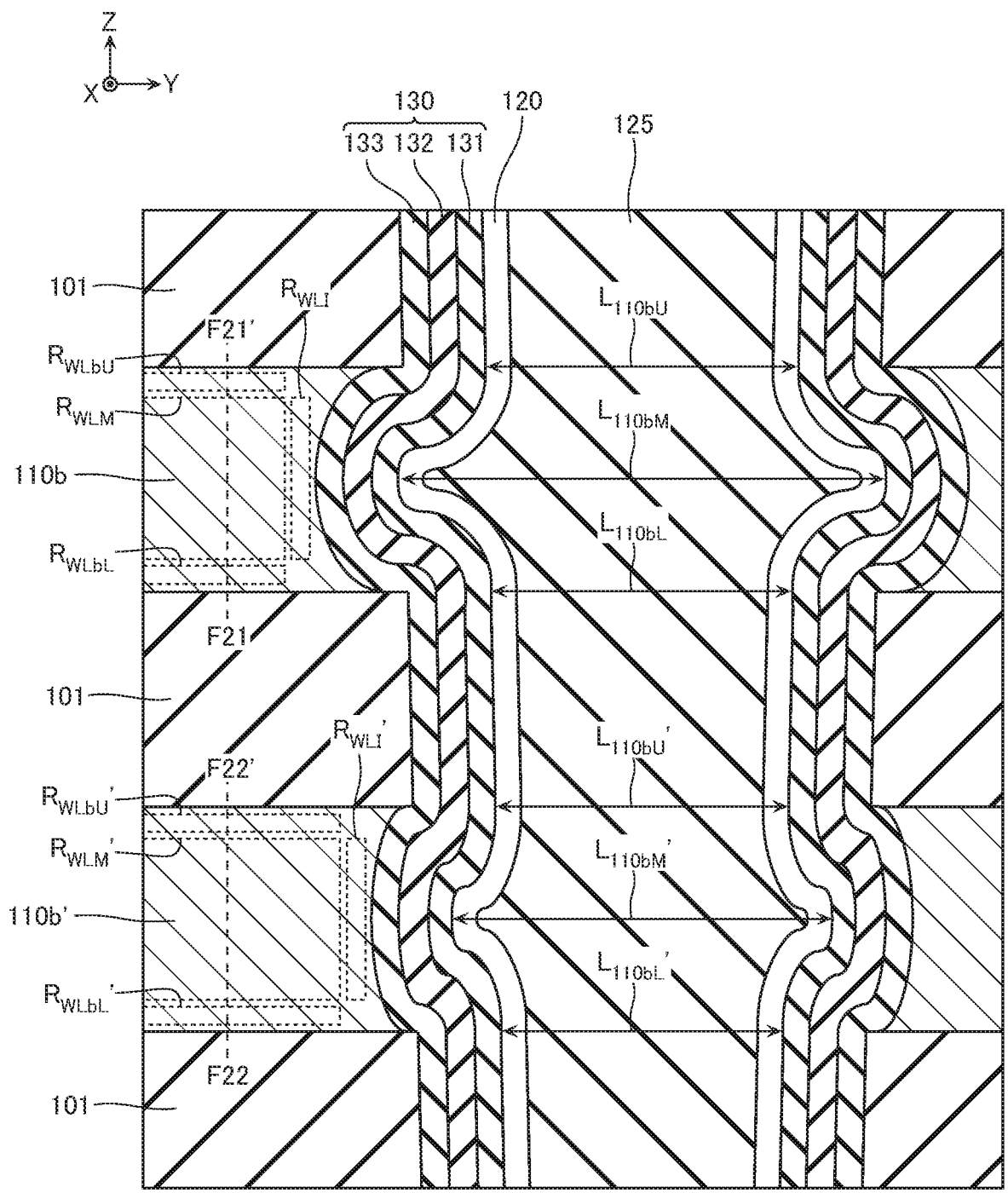
FIG. 41 is a schematic cross-sectional view illustrating a configuration of a part of a semiconductor memory device according to a third embodiment.

FIG. 41 is a schematic cross-sectional view illustrating a configuration of a part of a semiconductor memory device according to the third embodiment. While FIG. 41 indicates a YZ cross-sectional surface, when a cross-sectional surface other than the YZ cross-sectional surface along the center axis of the semiconductor layer 120 (for example, an XZ cross-sectional surface) is observed, a structure similar to that of FIG. 41 is also observed.

The semiconductor memory device according to the third embodiment is basically constituted similarly to the semiconductor memory device according to the first embodiment. However, in the semiconductor memory device according to the third embodiment, shapes of the curved surfaces formed on the surfaces on the semiconductor layer 120 side of the plurality of conductive layers 110 are adjusted corresponding to the diameter of the semiconductor layer 120.

For example, in FIG. 41, one of the plurality of conductive layers 110 is indicated as a conductive layer 110b'. The conductive layer 110b' is, for example, disposed between the conductive layer 110a and the conductive layer 110b, in each of the memory cell array layer $L_{MCA1}$, $L_{MCA2}$. The conductive layer 110b' is basically constituted similarly to the conductive layer 110b.

In FIG. 41, a length in the Y-direction of the semiconductor layer 120 at a height position of an upper surface of the conductive layer 110b' is illustrated as a length $L_{110bU}'$. A length in the Y-direction of the semiconductor layer 120 at a height position of a lower surface of the conductive layer 110b' is illustrated as a length $L_{110bL}'$. A length in the Y-direction of the semiconductor layer 120 at an intermediate position of these height positions is illustrated as a length $L_{110bM}'$. The length $L_{110bM}'$ is larger than the length $L_{110bU}'$ and the length $L_{110bC}$. A difference between the length $L_{110bM}'$ and the length $L_{110bU}'$, and a difference between the length $L_{110bM}'$ and the length $L_{110bL}'$ are smaller than the difference between the length $L_{110bM}$ and the length $L_{110bU}$, and the difference between the length $L_{110bM}$ and the length $L_{110bL}$. The difference between the length $L_{110bM}'$ and the length $L_{110bU}'$, and the difference between the length $L_{110bM}'$ and the length $L_{110bL}'$ are larger than the difference between the length $L_{110aM}$ and the length $L_{110aU}$, and the difference between the length $L_{110aM}$ and the length $L_{110aL}$, which have been described with reference to FIG. 3.

Figure 42:
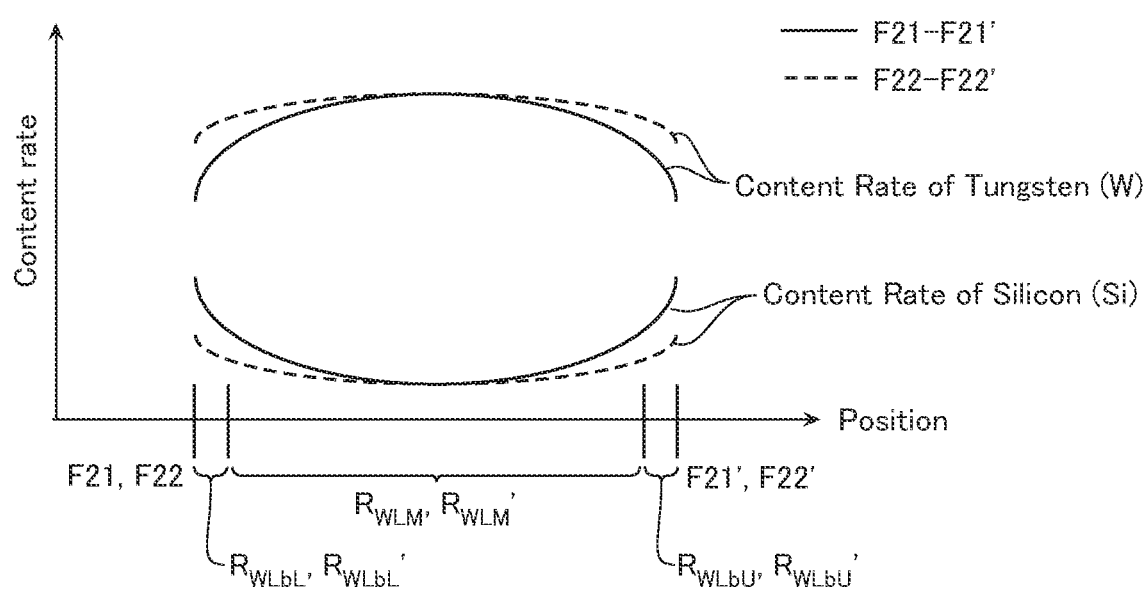
FIG. 42 is a schematic graph for describing the material of the conductive layer 110.

FIG. 42 is a schematic graph for describing the material of the conductive layer 110. FIG. 42 indicates the content rate of the components contained in a portion along a line F21-F21' of the structure indicated in FIG. 41 and the content rate of the components contained in a portion along a line F22-F22' of the structure indicated in FIG. 41.

As illustrated in FIG. 42, the conductive layers 110b, 110b' contain metal such as tungsten (W) or molybdenum (Mo) and silicon (Si). As illustrated in FIG. 42, in the conductive layers 110b, 110b', at the proximity of a center position in the Z-direction, the content rates of metal such as tungsten (W) become maximum, and the content rates of silicon (Si) become minimum. The content rates of metal such as tungsten (W) in the conductive layers 110b, 110b' become smaller toward the upper surfaces or the lower surfaces of the conductive layers 110b, 110b'. The content rates of silicon (Si) become larger toward the upper surfaces or the lower surfaces of the conductive layers 110b, 110b'.

As illustrated in FIG. 42, a maximum value of the content rate of silicon (Si) contained in the conductive layer 110b' is smaller than the maximum value of the content rate of silicon (Si) contained in the conductive layer 110b. A minimum value of the content rate of metal such as tungsten (W) contained in the conductive layer 110b' is larger than the minimum value of the content rate of metal such as tungsten (W) contained in the conductive layer 110b.

In FIG. 41, a region near a center in a YZ cross-sectional surface of the conductive layer 110b' is illustrated as a region $R_{WLM}'$. A region near the gate insulating film 130 of the conductive layer 110b' is illustrated as a region $R_{WLI}'$. A region near the lower surface of the conductive layer 110b' is illustrated as a region $R_{WLbL}'$ A region near the upper surface of the conductive layer 110b' is illustrated as a region $R_{WLbU}'$.

As illustrated in FIG. 41 and FIG. 42, in the third embodiment, the content rates of silicon (Si) in the regions $R_{WLbL}'$, $R_{WLbU}'$ are lower than the content rates of silicon (Si) in the regions $R_{WLbL}$, $R_{WLbU}$. The content rates of silicon (Si) in the regions $R_{WLbL}'/R_{WLbU}'$ are higher than the content rates of silicon (Si) in the regions $R_{WLM}$, $R_{WLM}$, $R_{WLM}'$, $R_{WLI}$, $R_{WLI}'$, $R_{WLaL}$, $R_{WLaU}$.

A boundary between the region $R_{WLbL}'$ and the region $R_{WLM}'$, and a boundary between the region $R_{WLbU}'$ and the region $R_{WLM}'$ may be specified by a method similar to that for the boundary between the region $R_{WLM}$ and the region $R_{WLI}$, the boundary between the region $R_{WLM}$ and the region $R_{WLaL}$, and the boundary between the region $R_{WLM}$ and the region $R_{WLaU}$.

Fourth Embodiment

In the third embodiment, in the processes described with reference to FIG. 8 and FIG. 16, it has been described that the shapes of the surfaces on the semiconductor layer 120 side of the conductive layers 110b according to the first embodiment can be adjusted corresponding to the diameter of the semiconductor layer 120, by adjusting the ratio of silicon to nitrogen in the insulating layer 110A. Here, by a similar method, the shapes of the surfaces on the semiconductor layer 220 side of the conductive layers 210a according to the second embodiment can be also adjusted corresponding to the diameter of the semiconductor layer 220. Application examples of such a method are described below.

Figure 43:
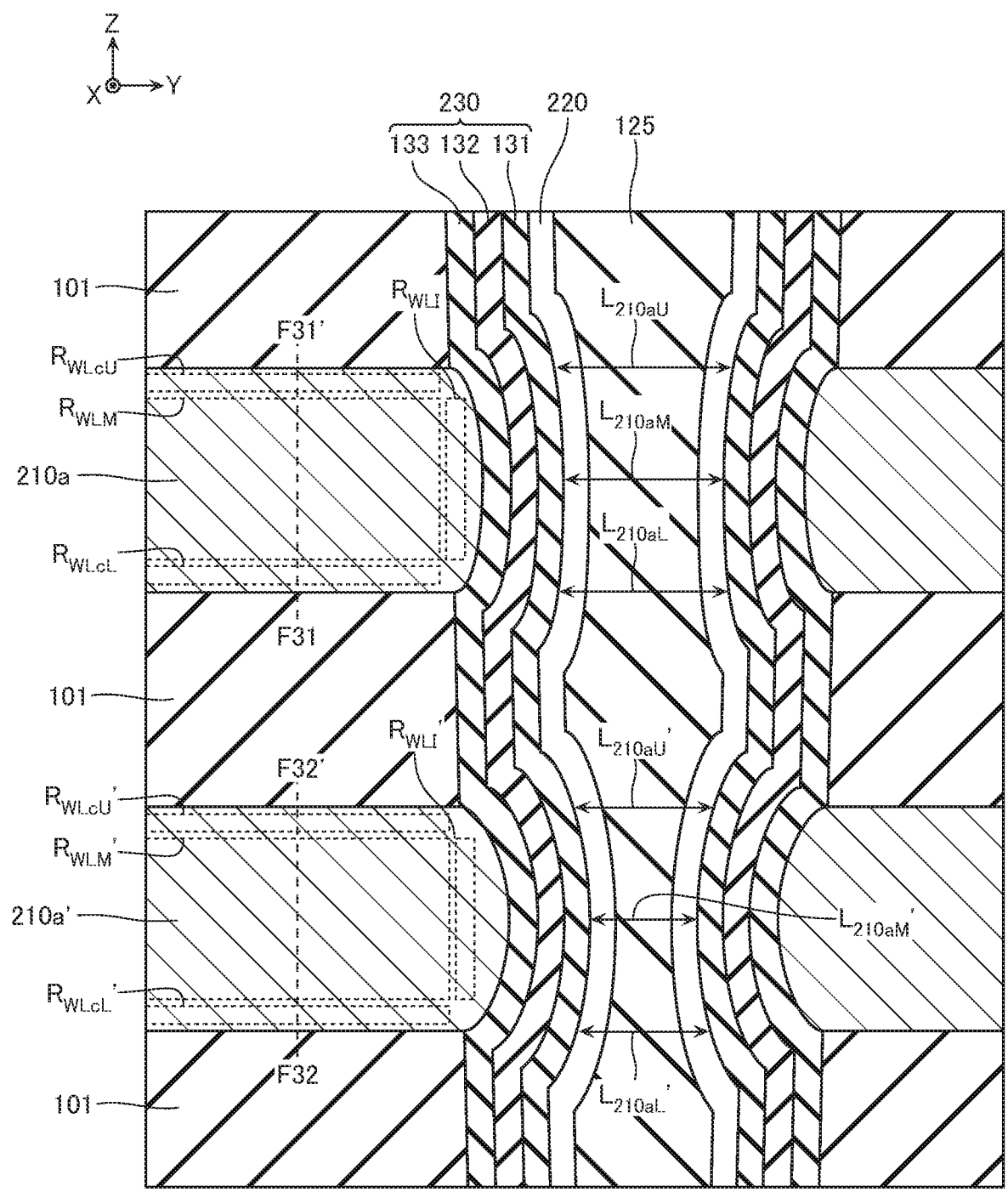
FIG. 43 is a schematic cross-sectional view illustrating a configuration of a part of a semiconductor memory device according to a fourth embodiment.

FIG. 43 is a schematic cross-sectional view illustrating a configuration of a part of a semiconductor memory device according to the fourth embodiment. While FIG. 43 indicates a YZ cross-sectional surface, when a cross-sectional surface other than the YZ cross-sectional surface along a center axis of the semiconductor layer 220 (for example, an XZ cross-sectional surface) is observed, a structure similar to that of FIG. 43 is also observed.

The semiconductor memory device according to the fourth embodiment is basically constituted similarly to the semiconductor memory device according to the second embodiment. However, in the semiconductor memory device according to the fourth embodiment, shapes of the curved surfaces formed on the surfaces on the semiconductor layer 220 side of the plurality of conductive layers 210 are adjusted corresponding to the diameter of the semiconductor layer 220.

For example, in FIG. 43, one of the plurality of conductive layers 210 is indicated as a conductive layer 210a'. The conductive layer 210a' is, for example, disposed below the conductive layer 210a, in each of the memory cell array layer $L_{MCA1}$, $L_{MCA2}$. The conductive layer 210a' is basically constituted similarly to the conductive layer 210a.

In FIG. 43, a length in the Y-direction of the semiconductor layer 220 at a height position of an upper surface of the conductive layer 210a' is illustrated as a length $L_{210aU}{}'$. A length in the Y-direction of the semiconductor layer 220 at a height position of a lower surface of the conductive layer 210a' is illustrated as a length $L_{210aL}{}'$. A length in the Y-direction of the semiconductor layer 220 at an intermediate position of these height positions is illustrated as a length $L_{210aM}{}'$. The length $L_{210aM}{}'$ is smaller than the length $L_{210aU}{}'$ and the length $L_{210aL}{}'$. A difference between the length $L_{210aM}{}'$ and the length $L_{210aU}{}'$, and a difference between the length $L_{210aM}$ and the length $L_{210aL}{}'$ are larger than the difference between the length $L_{210aM}$ and the length $L_{210aU}$, and the difference between the length $L_{210aM}$ and the length $L_{210aL}$.

Figure 44:
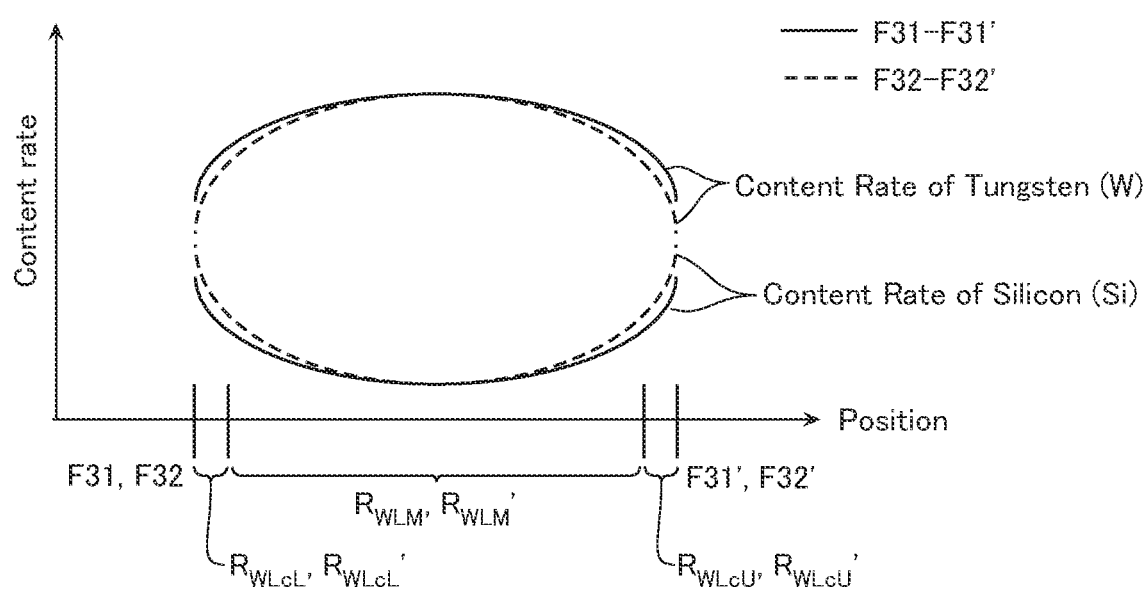
FIG. 44 is a schematic graph for describing a material of the conductive layer 210.

FIG. 44 is a schematic graph for describing the material of the conductive layer 210. FIG. 44 indicates the content rate of the components contained in a portion along a line F31-F31' of the structure indicated in FIG. 43 and the content rate of the components contained in a portion along a line F32-F32' of the structure indicated in FIG. 43.

As illustrated in FIG. 44, the conductive layers 210a, 210a' contains metal such as tungsten (W) or molybdenum (Mo) and silicon (Si). As illustrated in FIG. 44, in the conductive layers 210a, 210a', at the proximity of a center position in the Z-direction, the content rates of metal such as tungsten (W) become maximum, and the content rates of silicon (Si) become minimum. The content rates of metal such as tungsten (W) in the conductive layers 210a, 210a' become smaller toward the upper surfaces or the lower surfaces of the conductive layers 210a, 210a'. The content rates of silicon (Si) become larger toward the upper surfaces or the lower surfaces of the conductive layers 210a, 210a'.

As illustrated in FIG. 44, the maximum value of the content rate of silicon (Si) contained in the conductive layer 210a' is larger than the maximum value of the content rate of silicon (Si) contained in the conductive layer 210a. The minimum value of the content rate of metal such as tungsten (W) contained in the conductive layer 210a' is smaller than the minimum value of the content rate of metal such as tungsten (W) contained in the conductive layer 210a.

In FIG. 43, a region near a center in a YZ cross-sectional surface of the conductive layer 210a' is illustrated as a region $R_{WLM}{}'$. A region near the gate insulating film 230 of the conductive layer 210a' is illustrated as a region $R_{WLI}{}'$. A region near the lower surface of the conductive layer 210a' is illustrated as a region $R_{WLcL}{}'$. A region near the upper surface of the conductive layer 210a' is illustrated as a region $R_{WLcU}{}'$.

As illustrated in FIG. 43 and FIG. 44, in the fourth embodiment, the content rates of silicon (Si) in the regions $R_{WLcL}{}'/R_{WLcU}{}'$ are higher than the content rates of silicon (Si) in the regions $R_{WLcL}$, $R_{WLcU}$.

A boundary between the region $R_{WLcL}{}'$ and the region $R_{WLM}{}'$, and a boundary between the region $R_{WLcU}{}'$ and the region $R_{WLM}{}'$ may be specified by a method similar to that for the boundary between the region $R_{WLM}$ and the region $R_{WLI}$, the boundary between the region $R_{WLM}$ and the region $R_{WLaL}$, and the boundary between the region $R_{WLM}$ and the region $R_{WLaU}$.

Fifth Embodiment

In manufacturing the semiconductor memory devices according to the first embodiment to the fourth embodiment, the insulating layers 110A are removed in the process described with reference to FIG. 26. However, in a region of a part of the semiconductor memory devices according to the first embodiment to the fourth embodiment, a region where the insulating layer 110A remains without being removed may be disposed. Examples of such a structure are described below.

Figure 45:
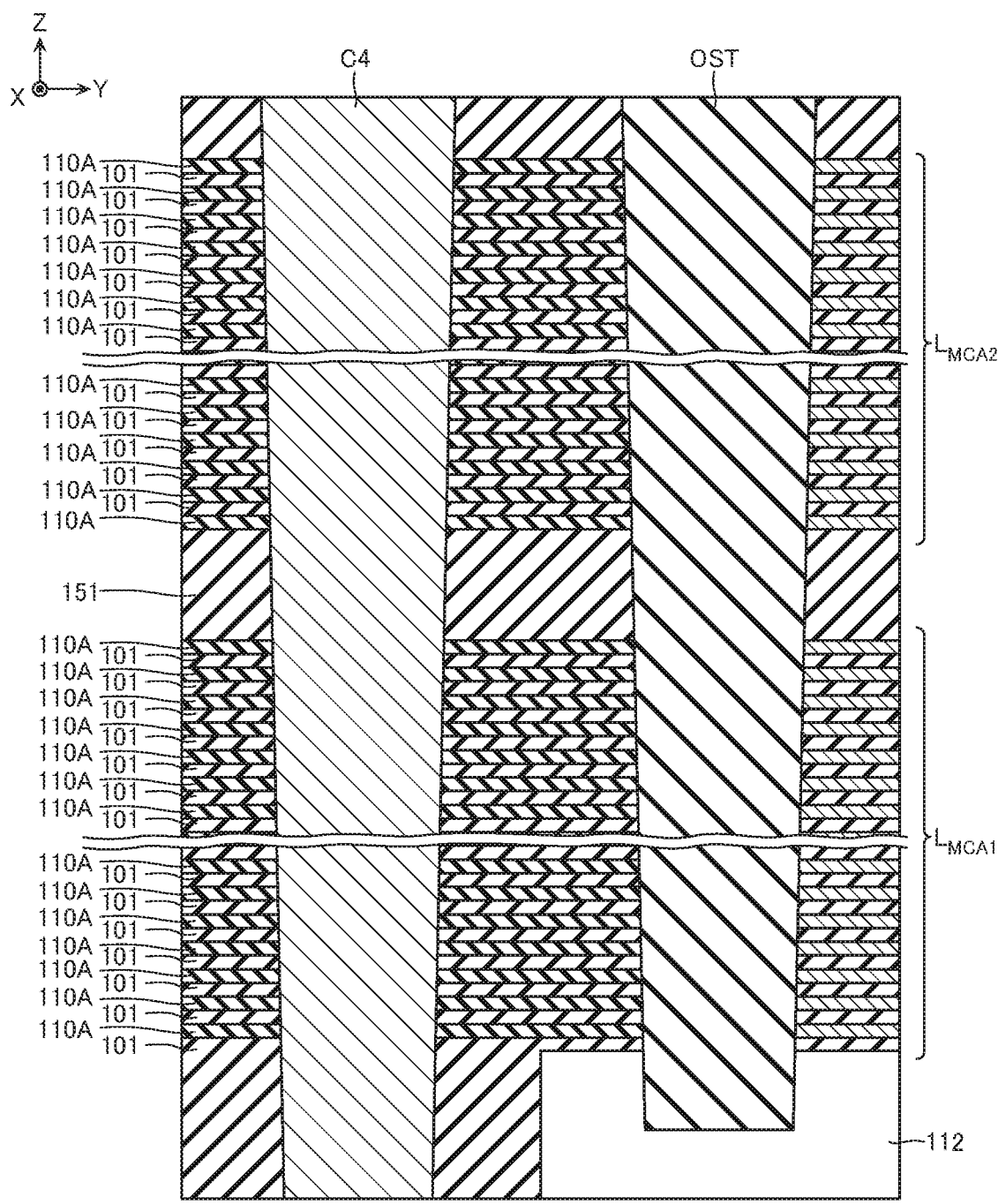
FIG. 45 is a schematic cross-sectional view illustrating a configuration of a part of a semiconductor memory device according to a fifth embodiment.
Figure 46:
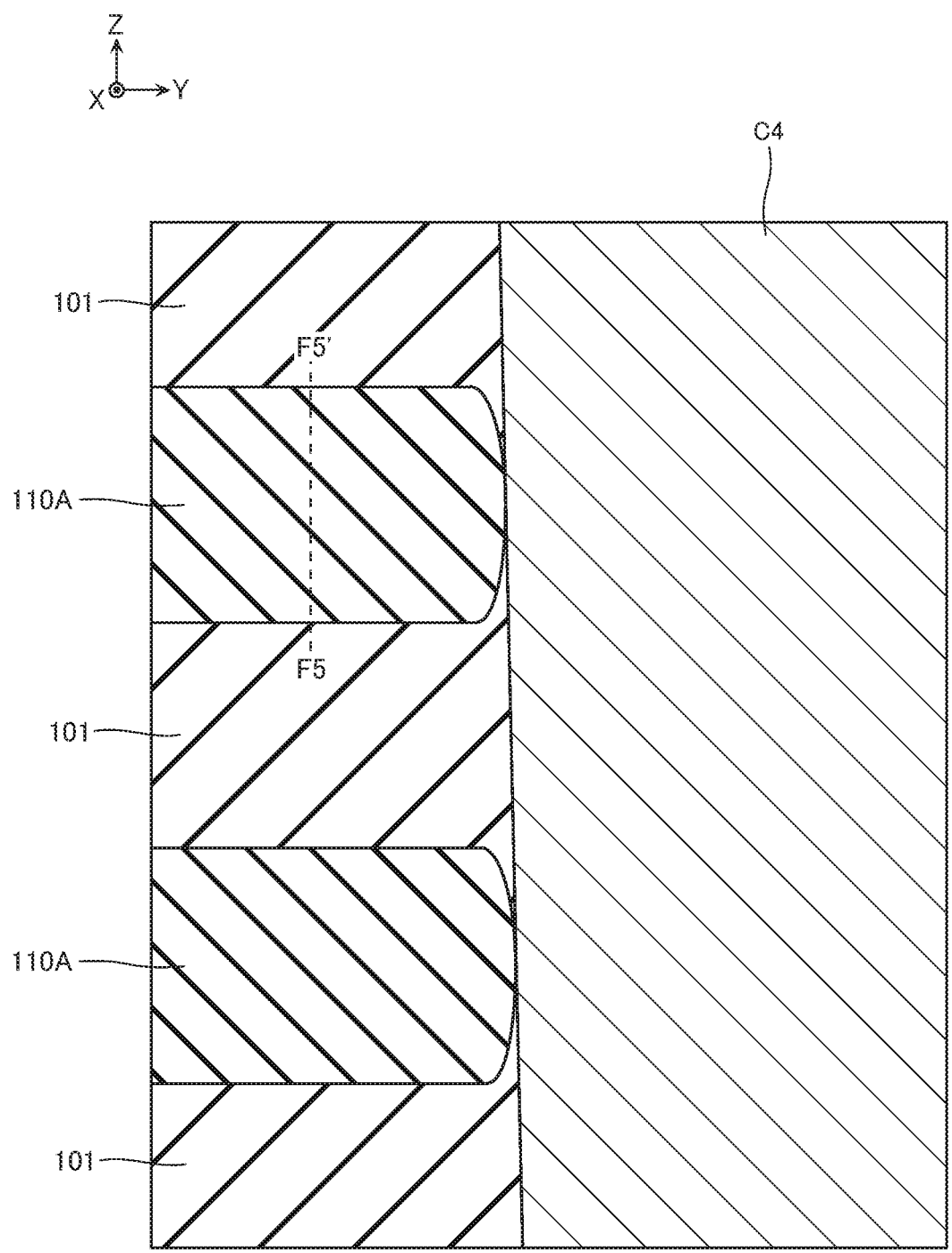
FIG. 46 is a schematic cross-sectional view illustrating an enlarged part in FIG. 45.

FIG. 45 is a schematic cross-sectional view illustrating a configuration of a part of a semiconductor memory device according to the fifth embodiment. FIG. 46 is a schematic cross-sectional view illustrating an enlarged portion in FIG. 45.

In the example in FIG. 45, a part of the insulating layers 110A of the semiconductor memory device remain without being removed. In the example in FIG. 45, in such a region, a via-contact electrode C4 that passes through the plurality of insulating layers 110A in the memory cell array layers $L_{MCA1}$, $L_{MCA2}$ and extends in the Z-direction is disposed. In the example in FIG. 45, in such a region, the conductive layer 112 is not disposed. In the example in FIG. 45, at an end portion in the Y-direction of such a region, an insulating layer OST is formed. The insulating layer OST is constituted similarly to the inter-block insulating layer ST.

The insulating layer 110A exemplified in FIG. 46 may correspond to the conductive layers 110b, 110b' according to the first embodiment or the third embodiment or may correspond to the conductive layers 210a, 210a' according to the second embodiment or the fourth embodiment. In the example in FIG. 46, on a surface on a via-contact electrode C4 side of the insulating layer 110A, a surface having an approximately protruding shape as described with reference to FIG. 38 or FIG. 39 is formed. This surface having an approximately protruding shape is covered by an insulating layer of silicon oxide ($SiO_2$). Such a configuration may be formed, for example, by performing the oxidation process with respect to a surface of the insulating layer 110A exposed to a contact hole, after forming the contact hole corresponding to the via-contact electrode C4 and before forming the via-contact electrode C4.

For example, when the components of the insulating layer 110A are analyzed along a line F5-F5' of the structure indicated in FIG. 46, a distribution of the content rates of nitrogen (N) and silicon (Si), which has been described with reference to FIG. 9, is observed.

Other Embodiments

The semiconductor memory devices according to the first embodiment to the fifth embodiment have been described above. However, the configurations of the semiconductor memory devices according to the first embodiment to the fifth embodiment are merely examples, and specific configurations or the like are adjustable, as necessary.

For example, the first embodiment illustrates the example where the regions $R_{WLaL}$, $R_{WLaU}$ described with reference to FIG. 3 do not contain silicon (Si). However, either or both of the region $R_{WLaL}$ and the region $R_{WLaU}$ corresponding to at least a part of the plurality of conductive layers 110a may contain silicon (Si) having the content rate equal to or more than that of the regions $R_{WLbL}$, $R_{WLbU}$ of the conductive layer 110b.

In the semiconductor memory devices according to the first embodiment and the third embodiment, the conductive layers 110b have the surfaces on the semiconductor layer 120 side formed into an approximately recessed shape in the YZ cross-sectional surface and the XZ cross-sectional surface, and the conductive layers 110a have the surfaces on the semiconductor layer 120 side formed into an approximately straight line in the YZ cross-sectional surface and the XZ cross-sectional surface. In the semiconductor memory devices according to the second embodiment and the fourth embodiment, the conductive layers 210a have the surfaces on the semiconductor layer 220 side formed into an approximately protruding shape in the YZ cross-sectional surface and the XZ cross-sectional surface, and the conductive layers 210b have the surfaces on the semiconductor layer 220 side formed into an approximately straight line in the YZ cross-sectional surface and the XZ cross-sectional surface. However, the semiconductor memory device may include both the conductive layers 110b having the surfaces on the semiconductor layer 120 side formed into an approximately recessed shape in the YZ cross-sectional surface and the XZ cross-sectional surface and the conductive layers 210a having the surfaces on the semiconductor layer 220 side formed into an approximately protruding shape in the YZ cross-sectional surface and the XZ cross-sectional surface.

In this case, either or both of the memory cell array layer $L_{MCA1}$ and the memory cell array layer $L_{MCA2}$ may include one or a plurality of conductive layers 110b disposed above one or a plurality of conductive layers 210a. Between the conductive layers 110b and the conductive layers 210a, conductive layers having the surfaces on the semiconductor layer 120 side formed into an approximately straight line in the YZ cross-sectional surface and the XZ cross-sectional surface such as the conductive layers 110a, 210b may be disposed.

For example, one of the memory cell array layers $L_{MCA1}$, $L_{MCA2}$ may include the conductive layers 110a, 110b, and the other may include the conductive layers 210a, 210b.

The configuration described above may be formed upside down. For example, the memory cell array regions $R_{MCA}$ described with reference to FIG. 1 and a peripheral circuit that controls this may be formed on different wafers. In such a case, a wafer where the memory cell array regions $R_{MCA}$ are formed and a wafer where the peripheral circuit is formed may be bonded to form a semiconductor memory device. In such a case, the configurations in the memory cell array regions $R_{MCA}$ may be upside down with respect to the description above.

The fifth embodiment has illustrated the region in which the via-contact electrode C4 is disposed as a region where the insulating layer 110A remains in a final structure. However, this region is merely an example, the region where the insulating layer 110A remains in a final structure may be any region in a semiconductor memory device. A semiconductor memory device need not include such a region where the insulating layer 110A remains in the final structure.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of conductive layers arranged in a first direction;
   a semiconductor layer extending in the first direction and opposed to the plurality of conductive layers; and
   a gate insulating film disposed between the plurality of conductive layers and the semiconductor layer, wherein
   the plurality of conductive layers include a first conductive layer and a second conductive layer,
   a position in the first direction corresponding to a surface on one side in the first direction of the first conductive layer is a first position,
   a position in the first direction corresponding to a surface on the other side in the first direction of the first conductive layer is a second position,
   an intermediate position of the first position and the second position in the first direction is a third position,
   a position in the first direction corresponding to a surface on one side in the first direction of the second conductive layer is a fourth position,
   a position in the first direction corresponding to a surface on the other side in the first direction of the second conductive layer is a fifth position,
   an intermediate position of the fourth position and the fifth position in the first direction is a sixth position,
   lengths in a second direction intersecting with the first direction of the semiconductor layer at the first position to the sixth position are respectively a first length to a sixth length,
   the first length to the third length are smaller than the fourth length to the sixth length, and the sixth length is larger than the fourth length and the fifth length,
   the second conductive layer includes:
     an eighth region;
     a ninth region disposed between the eighth region and the semiconductor layer;
     a tenth region disposed between the eighth region and the surface on the one side in the first direction of the second conductive layer; and
     an eleventh region disposed between the eighth region and the surface on the other side in the first direction of the second conductive layer,
   the eighth region to the eleventh region contain metal,
   the tenth region and the eleventh region contain silicon (Si), and
   the eighth region and the ninth region do not contain silicon (Si), or content rates of silicon (Si) in the eighth region and the ninth region are lower than content rates of silicon (Si) in the tenth region and the eleventh region.

2. The semiconductor memory device according to claim 1, wherein
   a difference between the sixth length and the fourth length and a difference between the sixth length and the fifth length are larger than a difference between the third length and the first length and a difference between the third length and the second length.

3. The semiconductor memory device according to claim 2, wherein
   the plurality of conductive layers include a fourth conductive layer adjacent to the second conductive layer in the first direction, and a second interlayer insulating layer is disposed between the second conductive layer and the fourth conductive layer, and a position in the first direction corresponding to a surface on one side in the first direction of the second interlayer insulating layer is a tenth position, a position in the first direction corresponding to a surface on the other side in the first direction of the second interlayer insulating layer is assumed to be an eleventh position, an intermediate position of the tenth position and the eleventh position in the first direction is a twelfth position, lengths in the second direction of the gate insulating film at the tenth position to the twelfth position are respectively a tenth length to a twelfth length, and a difference between the sixth length and the fourth length and a difference between the sixth length and the fifth length are larger than a difference between the twelfth length and the tenth length and a difference between the twelfth length and the eleventh length.

4. The semiconductor memory device according to claim 1, wherein the first conductive layer does not contain silicon (Si).

5. The semiconductor memory device according to claim 4, wherein the third length is smaller than one of the first length and the second length and is larger than the other thereof.

6. A semiconductor memory device comprising:

a plurality of conductive layers arranged in a first direction;

a semiconductor layer extending in the first direction and opposed to the plurality of conductive layers; and a gate insulating film disposed between the plurality of conductive layers and the semiconductor layer, wherein the plurality of conductive layers include a first conductive layer, a position in the first direction corresponding to a surface on one side in the first direction of the first conductive layer is a first position, a position in the first direction corresponding to a surface on the other side in the first direction of the first conductive layer is a second position, an intermediate position of the first position and the second position in the first direction is a third position, lengths in a second direction intersecting with the first direction of the semiconductor layer at the first position to the third position are respectively a first length to a third length, the third length is larger than the first length and the second length, or the third length is smaller than the first length and the second length, and the first conductive layer includes:

a first region;

a second region disposed between the first region and the semiconductor layer;

a third region disposed between the first region and the surface on the one side in the first direction of the first conductive layer; and a fourth region disposed between the first region and the surface on the other side in the first direction of the first conductive layer, the first region to the fourth region contain metal, the third region and the fourth region contain silicon (Si), and the first region and the second region do not contain silicon (Si), or content rates of silicon (Si) in the first region and the second region are lower than content rates of silicon (Si) in the third region and the fourth region.

* * * * *